(12) United States Patent
Kim et al.

(10) Patent No.: US 9,349,724 B2
(45) Date of Patent: May 24, 2016

(54) SEMICONDUCTOR DEVICE HAVING CAPACITORS

(71) Applicant: Samsung Electronics Co., Ltd., Gyeonggi-do (KR)

(72) Inventors: Cheon-bae Kim, Gyeonggi-do (KR); Yong-chul Oh, Gyeonggi-do (KR); Kuk-han Yoon, Gyeonggi-do (KR); Kyu-pil Lee, Gyeonggi-do (KR); Jong-ryul Jun, Gyeonggi-do (KR); Chang-hyun Cho, Gyeonggi-do (KR); Gyo-young Jin, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 477 days.

(21) Appl. No.: 13/709,239

(22) Filed: Dec. 10, 2012

(65) Prior Publication Data

US 2013/0161787 A1 Jun. 27, 2013

(30) Foreign Application Priority Data

Dec. 26, 2011 (KR) .......................... 10-2011-0142389

(51) Int. Cl.
*H01L 27/08* (2006.01)
*H01L 27/02* (2006.01)
*H01L 27/108* (2006.01)
*H01L 49/02* (2006.01)

(52) U.S. Cl.
CPC ........ *H01L 27/0805* (2013.01); *H01L 27/0207* (2013.01); *H01L 27/108* (2013.01); *H01L 28/91* (2013.01); *H01L 27/10852* (2013.01)

(58) Field of Classification Search
CPC ..................................................... H01L 27/108
USPC ......................................... 257/296, 308, 532
See application file for complete search history.

(56) References Cited

U.S. PATENT DOCUMENTS

| | | | |
|---|---|---|---|
| 5,547,889 A * | 8/1996 | Kim .............................. | 438/242 |
| 5,981,333 A * | 11/1999 | Parekh et al. ................. | 438/253 |
| 6,015,983 A * | 1/2000 | Parekh .......................... | 257/296 |
| 6,342,419 B1 * | 1/2002 | Tu ................................. | 438/253 |
| 6,373,084 B2 * | 4/2002 | Figura .......................... | 257/296 |
| 6,518,611 B1 * | 2/2003 | Ping ............................. | 257/296 |
| 6,563,162 B2 * | 5/2003 | Han et al. ..................... | 257/306 |
| 6,642,097 B2 * | 11/2003 | Tu ................................. | 438/241 |
| 7,115,935 B2 * | 10/2006 | Tu et al. ........................ | 257/301 |
| 7,449,739 B2 * | 11/2008 | Heitmann et al. ............ | 257/296 |
| 7,485,913 B2 * | 2/2009 | Ogawa .......................... | 257/308 |
| 7,615,444 B2 * | 11/2009 | Wunnicke et al. ............ | 438/253 |
| 7,655,968 B2 * | 2/2010 | Manning ....................... | 257/302 |
| 7,659,602 B2 * | 2/2010 | Tegen et al. ................... | 257/535 |

(Continued)

FOREIGN PATENT DOCUMENTS

KR 1020040072086 A 8/2004
KR 1020090072794 A 7/2009

*Primary Examiner* — Jerome Jackson, Jr.
*Assistant Examiner* — Ankush Singal
(74) *Attorney, Agent, or Firm* — F. Chau & Associates, LLC

(57) ABSTRACT

A semiconductor device including at least one first capacitor and at least one second capacitor. The at least one first capacitor includes a first storage node having a cylindrical shape. The at least one second capacitor includes a lower second storage node having a hollow pillar shape including a hollow portion, and an upper second storage node having a cylindrical shape and extending upward from the lower second storage node.

19 Claims, 54 Drawing Sheets

(56) References Cited

U.S. PATENT DOCUMENTS

| | | | | |
|---|---|---|---|---|
| 8,299,574 B2* | 10/2012 | Plum | | 257/532 |
| 8,343,844 B2* | 1/2013 | Kim et al. | | 438/381 |
| 8,368,176 B2* | 2/2013 | Iwaki et al. | | 257/532 |
| 8,614,498 B2* | 12/2013 | Park et al. | | 257/532 |
| 9,076,680 B2 | 7/2015 | Busch et al. | | |
| 2002/0098678 A1* | 7/2002 | Furukawa et al. | | 438/624 |
| 2003/0006444 A1* | 1/2003 | Amo et al. | | 257/296 |
| 2004/0004240 A1* | 1/2004 | Nishikawa | | 257/303 |
| 2004/0077143 A1* | 4/2004 | Lee et al. | | 438/253 |
| 2004/0089891 A1* | 5/2004 | Anma et al. | | 257/296 |
| 2004/0126982 A1* | 7/2004 | Park | | 438/396 |
| 2004/0201053 A1* | 10/2004 | Tu et al. | | 257/296 |
| 2004/0217406 A1* | 11/2004 | Chung et al. | | 257/304 |
| 2005/0056876 A1* | 3/2005 | Miyatake et al. | | 257/296 |
| 2005/0090070 A1* | 4/2005 | Gilgen et al. | | 438/396 |
| 2005/0245022 A1* | 11/2005 | Gutsche et al. | | 438/238 |
| 2006/0001067 A1* | 1/2006 | Gutsche et al. | | 257/301 |
| 2006/0094167 A1* | 5/2006 | Kurth et al. | | 438/142 |
| 2006/0097303 A1* | 5/2006 | Furuhata et al. | | 257/301 |
| 2006/0197135 A1* | 9/2006 | Inoue | | 257/306 |
| 2006/0255384 A1* | 11/2006 | Baars et al. | | 257/296 |
| 2006/0267062 A1* | 11/2006 | DeBoer et al. | | 257/296 |
| 2007/0170487 A1* | 7/2007 | Heitmann et al. | | 257/308 |
| 2007/0231998 A1* | 10/2007 | Chen et al. | | 438/253 |
| 2008/0017908 A1* | 1/2008 | Cho et al. | | 257/311 |
| 2008/0111199 A1* | 5/2008 | Kim et al. | | 257/401 |
| 2008/0217672 A1* | 9/2008 | Popp et al. | | 257/305 |
| 2008/0316674 A1* | 12/2008 | Wu et al. | | 361/311 |
| 2009/0294907 A1* | 12/2009 | Tegen et al. | | 257/535 |
| 2009/0302475 A1* | 12/2009 | Korogi et al. | | 257/761 |
| 2010/0052098 A1* | 3/2010 | Miyajima | | 257/532 |
| 2010/0123175 A1* | 5/2010 | Kanaya | | 257/295 |
| 2010/0327410 A1* | 12/2010 | Park et al. | | 257/534 |
| 2011/0012184 A1* | 1/2011 | Yuki | | 257/306 |
| 2011/0062552 A1* | 3/2011 | Tsuchiya | | 257/532 |
| 2011/0223731 A1* | 9/2011 | Chung et al. | | 438/270 |
| 2011/0237043 A1* | 9/2011 | Kim et al. | | 438/381 |
| 2011/0272784 A1* | 11/2011 | Park et al. | | 257/532 |
| 2011/0309517 A1* | 12/2011 | Miki et al. | | 257/774 |
| 2012/0001256 A1* | 1/2012 | Nojima | | 257/329 |
| 2012/0025390 A1* | 2/2012 | Jeong | | 257/773 |
| 2012/0049261 A1* | 3/2012 | Fujimoto | | 257/300 |
| 2012/0125879 A1* | 5/2012 | Park et al. | | 216/6 |
| 2012/0156844 A1* | 6/2012 | Kim et al. | | 438/270 |
| 2012/0168843 A1* | 7/2012 | Seo | | 257/316 |
| 2012/0175734 A1* | 7/2012 | Sohn | | 257/532 |
| 2013/0001796 A1* | 1/2013 | Song et al. | | 257/774 |
| 2013/0032924 A1* | 2/2013 | Isogai et al. | | 257/532 |
| 2013/0069137 A1* | 3/2013 | Pekny | | 257/319 |

* cited by examiner

SEMICONDUCTOR DEVICE HAVING CAPACITORS

CROSS-REFERENCE TO RELATED APPLICATIONS

This application claims priority to Korean Patent Application No. 10-2011-0142389, filed on Dec. 26, 2011, in the Korean Intellectual Property Office, the disclosure of which is incorporated by reference herein in its entirety.

BACKGROUND

Embodiments of the inventive concept relate to semiconductor devices and methods of manufacturing the same, and more particularly to a semiconductor device having a capacitor.

As a design rule of a semiconductor memory device, e.g., dynamic random access memory (DRAM), decreases, employing a three-dimensional (3D) storage node, e.g., a one cylinder stack (OCS) structure, may provide a larger surface area. However, the larger surface area also includes a capacitor, which occupies this area. Thus, there is a need for a semiconductor device with a storage node having a new structure that not only provides a larger surface area to secure a sufficient cell electrostatic capacitance in a limited area, but also eliminates restrictions to manufacturing techniques.

SUMMARY

Embodiments of the inventive concept provide a semiconductor device with a storage node having a new structure that may not only provide a larger surface area to secure a sufficient cell electrostatic capacitance in even a limited area of an ultra-highly integrated semiconductor device having a very fine design rule but also eliminate restrictions to manufacturing techniques.

According to an embodiment of the inventive concept, there is provided a semiconductor device including at least one first capacitor and at least one second capacitor. The at least one first capacitor includes a first storage node having a cylindrical shape. The at least one second capacitor includes a second storage node having a lower second storage node having a hollow pillar shape including a hollow portion, and an upper second storage node having a cylindrical shape and extending upward from the lower second storage node. having a hollow pillar shape including a hollow portion, and an upper second storage node having a cylindrical shape and extending upward from the lower second storage node.

According to an embodiment of the inventive concept, there is provided a semiconductor device including a substrate including a cell array region and a plurality of capacitors including a plurality of first capacitors and a plurality of second capacitors such that at least one of the plurality of first capacitors and at least one of the plurality of second capacitors are alternately arranged in at least one of a row direction and a column direction to form a matrix in the cell array region of the substrate. The plurality of first capacitors include a plurality of first storage nodes arranged in a matrix on a first plane disposed apart from the substrate by a first distance. The plurality of second capacitors include a plurality of lower second storage nodes. At least one of the lower second storage nodes is disposed between two adjacent first storage nodes of the plurality of first storage nodes on the first plane and at least one of the lower second storage nodes has a hollow pillar shape including a hollow portion, and a plurality of upper second storage nodes respectively contacting the plurality of lower second storage nodes and arranged in a matrix on a second plane disposed apart from the substrate by a second distance that is greater than the first distance.

According to an embodiment, there is provided a semiconductor device including a first capacitor including a storage node and a second capacitor adjacent to the first capacitor, wherein the second capacitor includes a lower storage node and an upper storage node on the lower storage node, wherein the lower storage node of the second capacitor is disposed at substantially the same level as the storage node of the first capacitor, and wherein the lowest storage node of the second capacitor is smaller in cross-sectional area than the storage node of the first capacitor.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
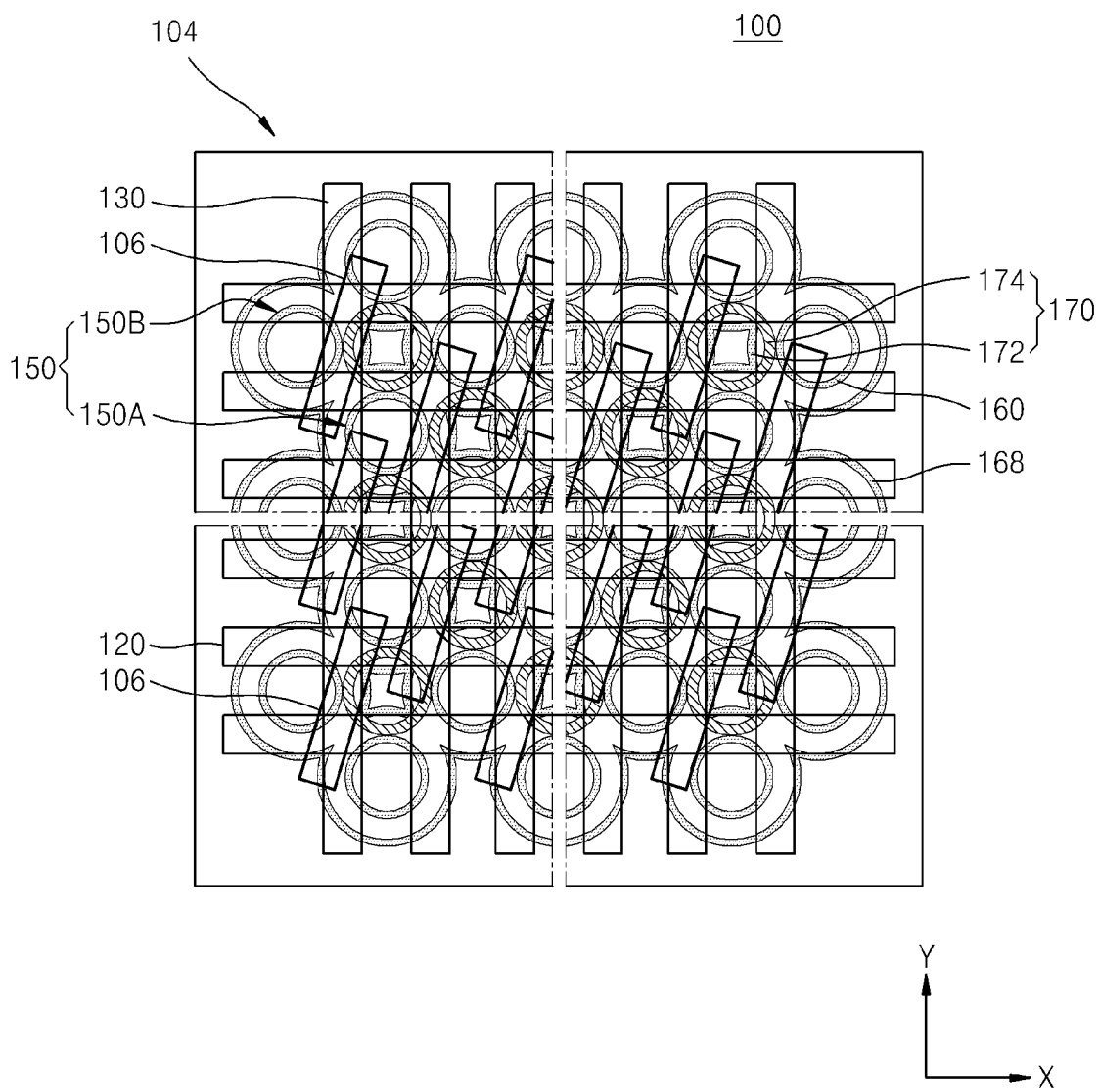
FIG. 1 is a layout diagram illustrating a part of a structure of a semiconductor device according to an embodiment of the inventive concept.

Hereinafter, exemplary embodiments of the inventive concept will be described with reference to the accompanying drawings, wherein throughout the drawings and the specification, the same element may be denoted by the same or substantially the same reference numeral.

The inventive concept may, however, be embodied in many different forms and should not be construed as limited to the exemplary embodiments set forth herein.

Figure 2:
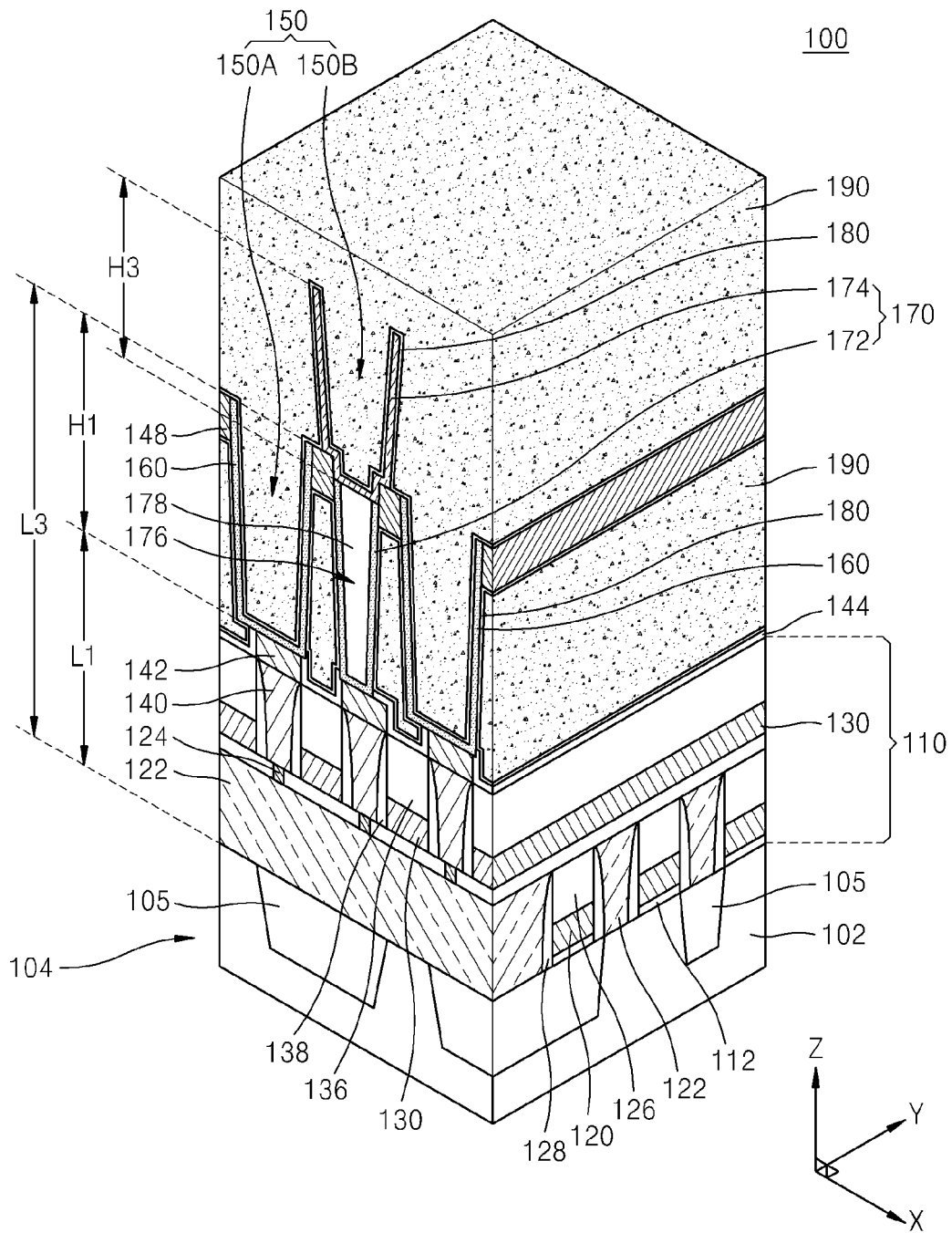
FIG. 2 is a perspective view of the part of the structure of the semiconductor device of FIG. 1.

FIG. 1 is a layout diagram illustrating a part of a structure of a semiconductor device 100 according to an embodiment of the inventive concept. FIG. 2 is a perspective view of the part of the structure of the semiconductor device 100 of FIG. 1

Referring to FIGS. 1 and 2, in a cell array region 104 of a semiconductor substrate 102, a plurality of active regions 106 are defined in the form of islands by an isolation film 105. In FIG. 1, long and short dash lines each extending vertically or horizontally from a substantially central portion of the cell array region 104 represent that illustration of some parts of the cell array region 104 is omitted in FIG. 1. FIG. 1 illustrates four regions adjacent to edge portions of the cell array region 104. The other parts of the cell array region 104 that are not illustrated in FIG. 1 may have the same structure as the parts of the cell array region 104 illustrated in FIG. 1.

A plurality of word lines 120 extend substantially in parallel with each other on the plurality of active regions 106 in a first direction (an X-axis direction in FIG. 1). A plurality of bit lines 130 extend substantially in parallel with each other on the plurality of word liens 120 in a second direction (a Y-axis direction in FIG. 1) that is perpendicular to the first direction.

The plurality of bit lines 130 are electrically connected to the plurality of active regions 106 of the semiconductor substrate 102 through a direct contact (not shown). A plurality of buried contacts 140 are formed in spaces between the plurality of bit lines 130. The plurality of buried contacts 140 are electrically connected to the plurality of active regions 106 of the semiconductor substrate 102 between the plurality of word lines 120 through a self-alignment contact 122 or an upper contact 124 on the self-alignment contact 122. The plurality of buried contacts 140 may be self-aligned with respect to the plurality of bit lines 130.

In FIG. 2, reference numeral '112' denotes a gate insulating film, reference numerals '126', '128', '136', and '138' respectively denote insulating films, and reference numeral '144' denotes an etch stop layer.

Hereinafter, for convenience of description, some structures including a layer including the plurality of bit lines 130 and the plurality of buried contacts 140 from among a plurality of structures formed on the semiconductor substrate 100 will be referred altogether to as a lower structure 110. A plurality of landing pads 142 each including a conductive material is formed on the lower structure 110.

A plurality of capacitors 150 including a plurality of first capacitors 150A and a plurality of second capacitors 150B are formed on the plurality of landing pads 142. The plurality of first capacitors 150A are arranged in a line in a row direction (the X-axis direction in FIG. 1) and a column direction (the Y-axis direction in FIG. 1) to form a matrix on the cell array region 104. Similarly, the plurality of second capacitors 150B are arranged in a line in the row direction and the column direction to form a matrix on the cell array region 104. Each of the plurality of first capacitors 150A and each of the plurality of second capacitors 150B are alternately arranged in each of the row direction and the column direction. Thus, the plurality of first capacitors 150A and the plurality of second capacitors 150B are formed together in a matrix.

Each of the plurality of first capacitors 150A includes a first storage node 160 having a cylindrical shape. Each of a plurality of first storage nodes 160 of the plurality of first capacitors 150A extends upward (substantially in a Z-axis direction in FIG. 2) from one of the plurality of landing pads 142. The plurality of first storage nodes 160 are arranged in a matrix on a first plane disposed apart from an upper surface of the semiconductor substrate 102 by a first distance L1. The plurality of first storage nodes 160 each have a first vertical length H1.

Each of the plurality of second capacitors 150B includes a second storage node 170 including a lower second storage node 172 and an upper second storage node 174 connected to the lower second storage node 172.

Each of a plurality of lower second storage nodes 172 is a part of one of the plurality of second capacitors 150B and is disposed between two adjacent first storage nodes 160 from among the plurality of first storage nodes 160 on the first plane disposed apart from the upper surface of the semiconductor substrate 102 by the first distance L1. The plurality of lower second storage nodes 172 each have a hollow pillar shape, in which a hollow portion 176 is formed. At least a part of the inside of the hollow portion 176 is filled with an insulating pillar 178. According to an embodiment of the inventive concept, the inside of the hollow portion 176 may be filled with an insulating film and voids. At least a part of the second storage node 172 may have a second vertical length that is less than the first vertical length H1.

Each of a plurality of upper second storage nodes each being a part of one of the plurality of second capacitors 150B is connected to a corresponding lower second storage node 172 from among the plurality of lower second storage nodes 172. The plurality of upper second storage nodes 174 are arranged in a matrix on a second plane disposed apart from the upper surface of the semiconductor substrate 102 by a second distance L2 that is greater than the first distance L1. Each of the plurality of upper second storage nodes 174 contacts a corresponding lower second storage node 172 of the plurality of lower second storage nodes 172 and extends upward (substantially in the Z-axis direction in FIG. 2) from the corresponding lower second storage node 172.

Referring to FIG. 1, a horizontal cross-sectional area of each of the plurality of lower second storage nodes 172 is less than a horizontal cross-sectional area of each of the plurality of first storage nodes 160. When the plurality of first storage nodes 160 and the plurality of lower second storage nodes 172 are simultaneously formed on the same plane, each of the plurality of first storage nodes 160 having a relatively large horizontal cross-sectional area and each of the plurality of lower second storage nodes 172 having a relatively small horizontal cross-sectional area are alternately arranged in a matrix. Thus, relatively large spaces may be secured between the plurality of first storage nodes 160 and the plurality of lower second storage nodes 172. The horizontal cross-sectional area of each of the plurality of first storage nodes 160 may increase in proportion to a reduction in the horizontal cross-sectional area of each of the plurality of lower second storage nodes 172.

To form the plurality of upper second storage nodes 174 that respectively connect to the plurality of lower second storage nodes 172, the plurality of upper second storage nodes 174 are formed to respectively correspond to locations where the plurality of lower second storage nodes 172 are formed except for locations corresponding to regions where the plurality of first storage nodes 160 are respectively formed. Thus, it is possible to form a structure having a sufficient cell capacitance and to secure sufficient spaces between the plurality of upper second storage nodes 174 without increasing the degree of difficulty of a manufacturing process.

Each of the plurality of first storage nodes 160 has a different horizontal cross-section shape than a horizontal cross-section shape of each of the plurality of lower second storage nodes 172. Referring to FIG. 1, each of the plurality of first storage nodes 160 has sidewalls having an outwardly convex surface, and each of the plurality of lower second storage nodes 172 has sidewalls having an outwardly concave surface, but the embodiments of the inventive concept are not limited thereto. The plurality of first storage nodes 160 and the plurality of lower second storage nodes 172 may have any of various other horizontal cross-section shapes within the scope of the inventive concept.

The plurality of upper second storage nodes 174 have a third vertical length H3 that is less than the first vertical length HE but the embodiments of the inventive concept are not limited thereto. In other embodiments of the inventive concept, the plurality of upper second storage nodes 174 may have a vertical length that is equal to or greater than the first vertical length H1 of the plurality of first storage nodes 160. The vertical length of the plurality of upper second storage nodes 174 may depend on according to a width and cross-sectional area thereof.

Referring to FIG. 1, outermost capacitors most adjacent to edge portions of the cell array region 104 are selected from the plurality of first capacitors 150A. In the cell array region 104, all the plurality of first storage nodes 160 and the plurality of lower second storage nodes 172 are wrapped by one dummy conductive pattern 168. The dummy conductive pattern 168 may be formed of a material used to form at least one from among the plurality of first storage nodes 160 and the plurality of lower second storage nodes 172. In an embodiment of the inventive concept, the dummy conductive pattern 168 may be formed on a plane on which the plurality of first storage nodes 160 and the plurality of lower second storage nodes 172 are formed. In an embodiment of the inventive concept, the dummy conductive pattern 168 may have a continuous band shape. In an embodiment of the inventive concept, the dummy conductive pattern 168 may have an intermittent band shape that includes at least one cutting portion (not shown). In an embodiment of the inventive concept, the semiconductor device 100 may not include the dummy conductive pattern 168.

A dielectric film 180 may be formed on surfaces of the plurality of first storage nodes 160, the plurality of lower second storage nodes 172, and the plurality of upper second storage nodes 174. On the dielectric film 180, a plate electrode 190 is formed to face the plurality of first storage nodes 160, the plurality of lower second storage nodes 172, and the plurality of upper second storage nodes 174, and the dielectric film 180 is disposed between the plate electrode 190, and each of the plurality of first storage nodes 160, the plurality of lower second storage nodes 172, and the plurality of upper second storage nodes 174.

FIG. 2 illustrates that a lower surface of each of the plurality of upper second storage nodes 174 is lower than an upper surface of each of the plurality of first storage nodes 160. In an embodiment, the plurality of upper second storage nodes 174 may each have a stepped lower surface such that a portion of the stepped lower surface is lower than an upper surface of the corresponding first storage node 160 as illustrated in FIG. 2 and the other portion is flush with the upper surface of the corresponding first storage node 160.

A supporter 148 is formed of an insulating material contacts sidewalls of the plurality of first storage nodes 160, the plurality of lower second storage nodes 172, the plurality of upper second storage nodes 174. The supporter 148 supports the plurality of first storage nodes 160 and the plurality of lower second storage nodes 172 to prevent the first storage nodes 160 and the lower second storage nodes 172 from being collapsed or tilted during the formation of the plurality of first capacitors 150A and the plurality of second capacitors 150B. In an embodiment of the inventive concept, the supporter 148 may include one pattern that has at least one aperture and horizontally extends. In an embodiment of the inventive concept, the supporter 148 may include a plurality of patterns disposed apart from one another. In an embodiment, the plurality of patterns of the supporter 148 may each include at least one aperture and horizontally extend in various geometric shapes. For convenience of description, FIG. 2 illustrates that the supporter 148 continuously extends in the Y-axis direction, but the embodiments of the inventive concept are not limited thereto. In an embodiment of the inventive concept, the supporter 148 may have a discontinuous portion or a continuously curved portion in a direction, e.g., the Y-axis direction, according to the shapes of other elements around the supporter 148 or a planar shape obtained by patterning the supporter 148.

Figure 3:
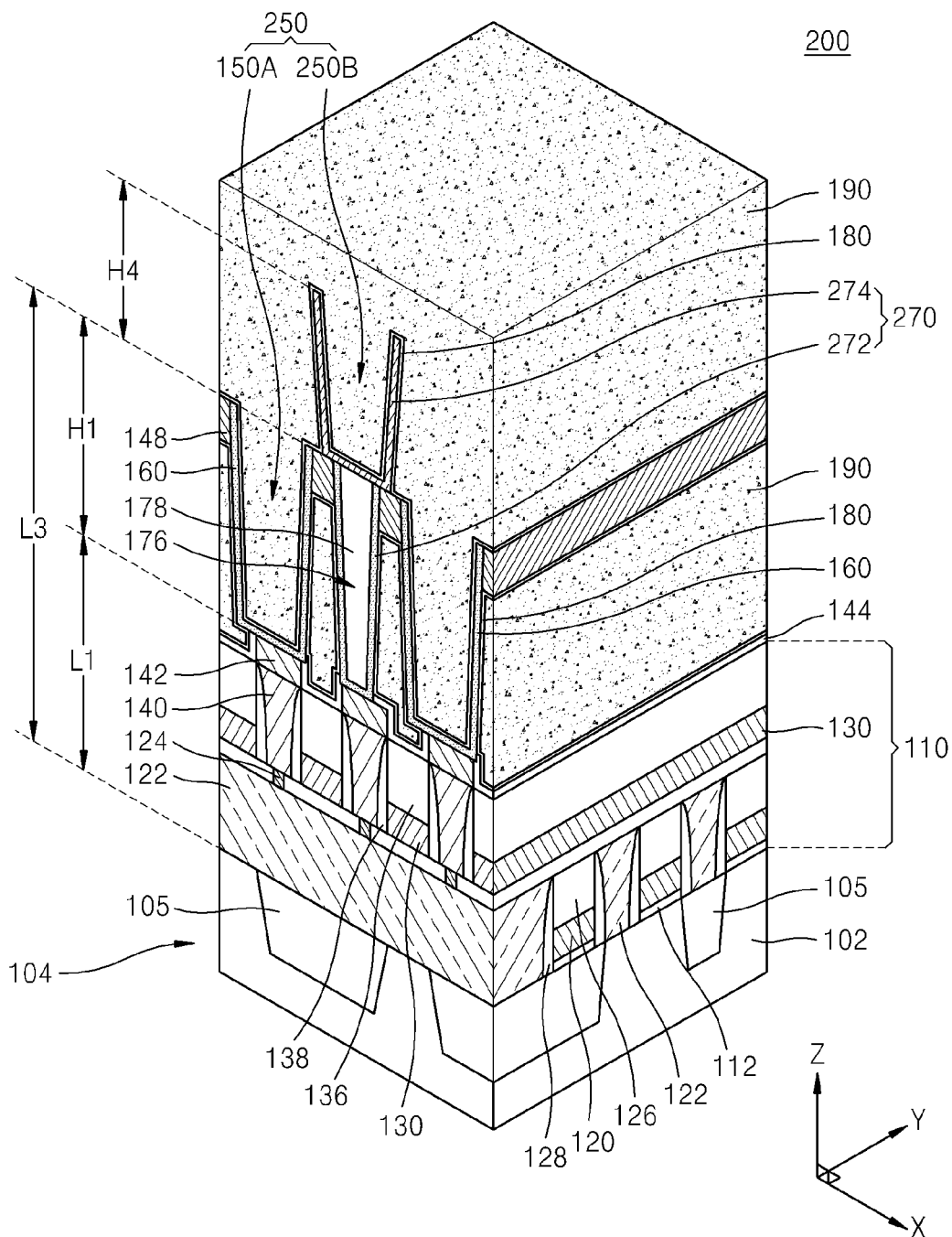
FIG. 3 is a perspective view of a part of a structure of a semiconductor device according to an embodiment of the inventive concept.

FIG. 3 is a perspective view of a part of a structure of a semiconductor device 200, according to another embodiment of the inventive concept.

The semiconductor device 200 includes a plurality of capacitors 250 including a plurality of first capacitors 150A and a plurality of second capacitors 250B. In the semiconductor device 200, each of a plurality of second capacitors 250B includes a second storage node 270 including a lower second storage node 272 and an upper second storage node 274. In an embodiment of the inventive concept, a planar layout of the second capacitor 250B is the same as a planar layout of the second capacitor 150B of the semiconductor device 100 illustrated in FIG. 1.

FIG. 3 illustrates that the lower second storage node 272 includes a portion having a vertical length that is substantially equal to a first vertical length H1 of a first storage node 160. A lower surface of the upper second storage node 274 contacts an upper surface of the lower second storage node 272 and is substantially flush with an upper surface of the first storage node 160.

The upper second storage node 274 is formed on a third plane disposed apart from an upper surface of the semiconductor substrate 102 by a third distance L3 that is greater than a first distance L1. According to an embodiment of the inventive concept, the semiconductor device 200 may include a plurality of upper second storage nodes 274, which are similar to the plurality of upper second storage nodes 174 of FIG. 1. The plurality of upper second storage nodes 274 may be arranged in a matrix on the third plane. The upper second storage node 274 has a fourth vertical length H4 that is less than the first vertical length H1 of the first storage node 160, but the embodiments of the inventive concept are not limited thereto. In an embodiment, the upper second storage node 274 may have a vertical length that is equal or greater than the first storage node 160. The vertical length of each of the plurality of upper second storage nodes 274 may vary according to a width or cross-sectional area thereof.

The lower surface of the upper second storage node 274 contacts the lower second storage node 272 and supporter 148. Sidewalls of the upper second storage node 274 do not contact the supporter 148. The supporter 148 contacts sidewalls of a plurality of first storage nodes 160 and a plurality of lower second storage nodes 272 and supports the plurality of first storage nodes 160 and the plurality of lower second storage nodes 272. According to an embodiment of the inventive concept, the upper surface of the lower second storage node 272 and the lower surface of the upper second storage node 274 may have a stepped portion. Specifically, a portion of the lower surface of the upper second storage node 274 may be lower than the upper surface of the first storage node 160 as illustrated in FIG. 2, and the other portion thereof may be substantially flush with the upper surface of the first storage node 160 as illustrated in FIG. 3.

Figure 4:
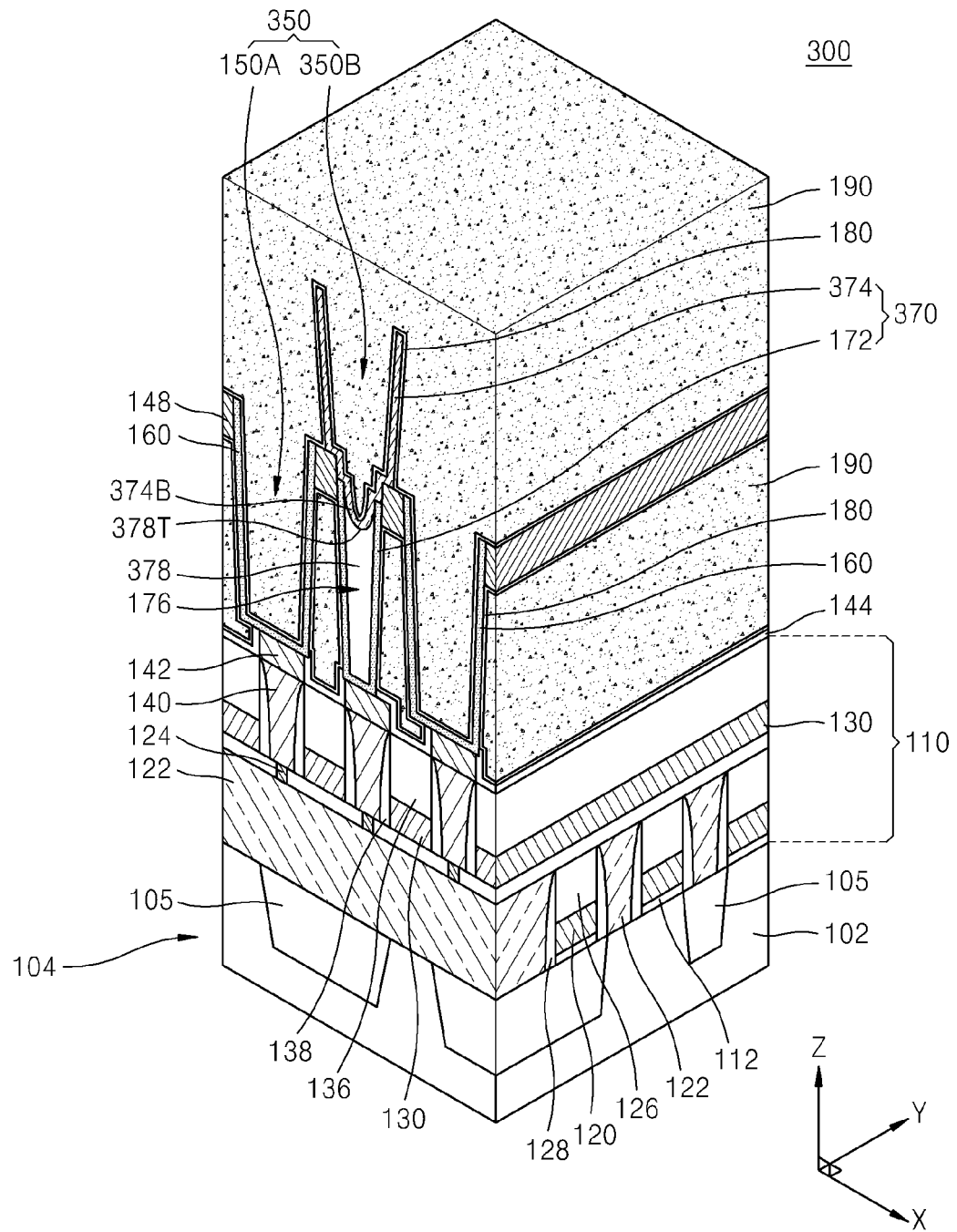
FIG. 4 is a perspective view of a part of a structure of a semiconductor device according to an embodiment of the inventive concept.

FIG. 4 is a perspective view of a part of a structure of a semiconductor device 300, according to an embodiment of the inventive concept.

The semiconductor device 300 includes a plurality of capacitors 350 including a plurality of first capacitors 150A and a plurality of second capacitors 350B. The second capacitor 350B includes a second storage node 370 including a lower second storage node 172 and an upper second storage node 374. In an embodiment of the inventive concept, a planar layout of the second capacitor 350B is the same as the second capacitor 150B of the semiconductor device 100 illustrated in FIG. 1.

In the semiconductor device 300, an insulating pillar 378 having a recessed upper surface 378T is formed in the lower second storage node 172. The upper second storage node 374 has a concavely recessed surface 374B according to the outline of the recessed upper surface 378T.

The upper second storage node 374 contacts the lower second storage node 172 and supporter 148. A lower portion of the upper second storage node 374 is inserted into an inside of the lower second storage node 172. Outer sidewalls of the upper second storage node 374 include portions contacting the supporter 148 and portions contacting inner sidewalls of the plurality of lower second storage nodes 172.

Figure 5:
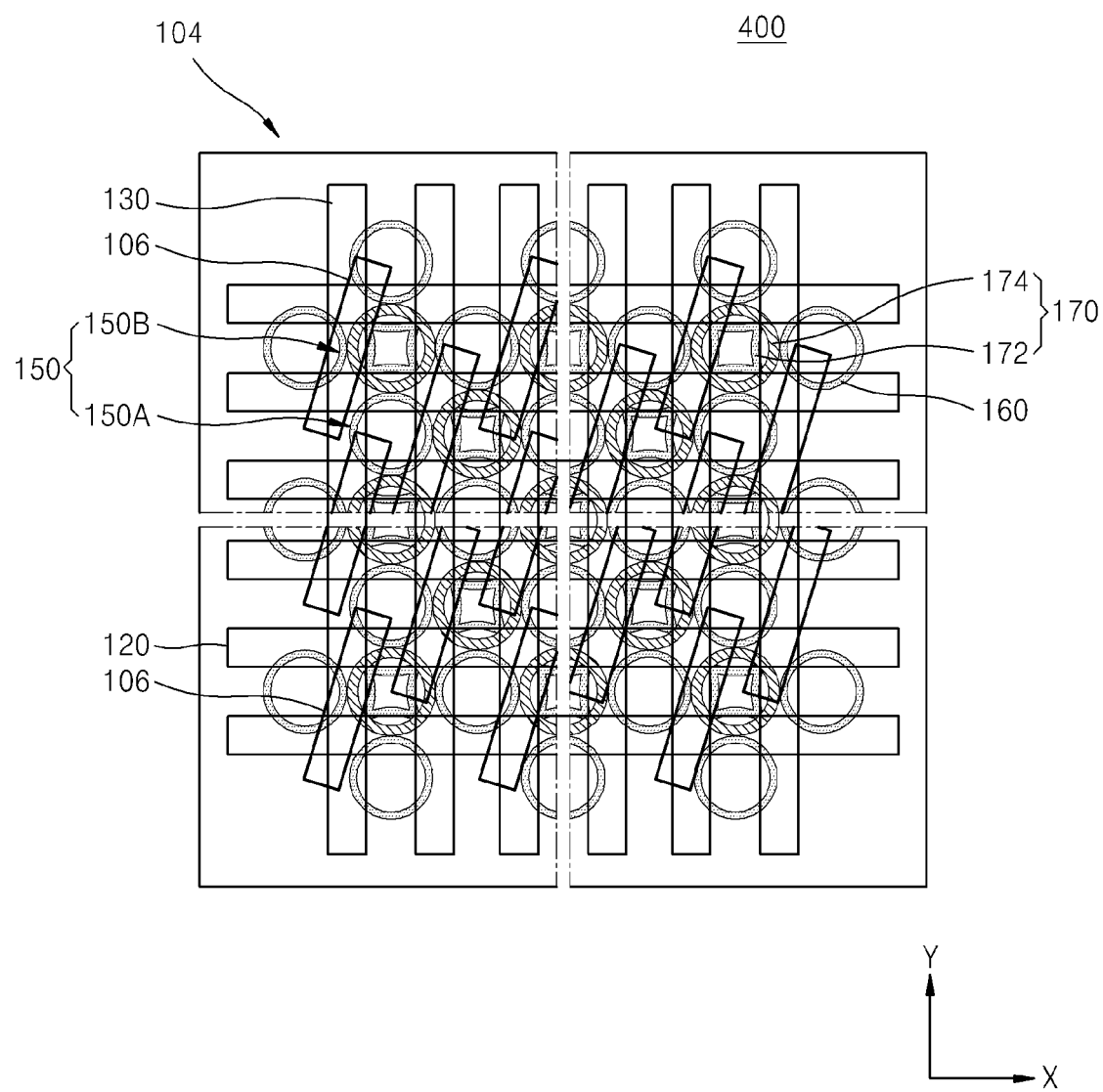
FIG. 5 is a layout diagram of a part of a structure of a semiconductor device according to an embodiment of the inventive concept.

FIG. 5 is a layout diagram of a part of a structure of a semiconductor device 400, according to an embodiment of the inventive concept.

A planar layout of the semiconductor device 400 is the same as a planar layout of the semiconductor device 100 of FIG. 1 except that the semiconductor device 400 does not include the dummy conductive pattern 168 of FIG. 1. According to an embodiment of the inventive concept, the semiconductor device 400 includes at least one from among the structures of the semiconductor devices 100, 200, and 300 illustrated in FIGS. 2 to 4.

Figure 6:
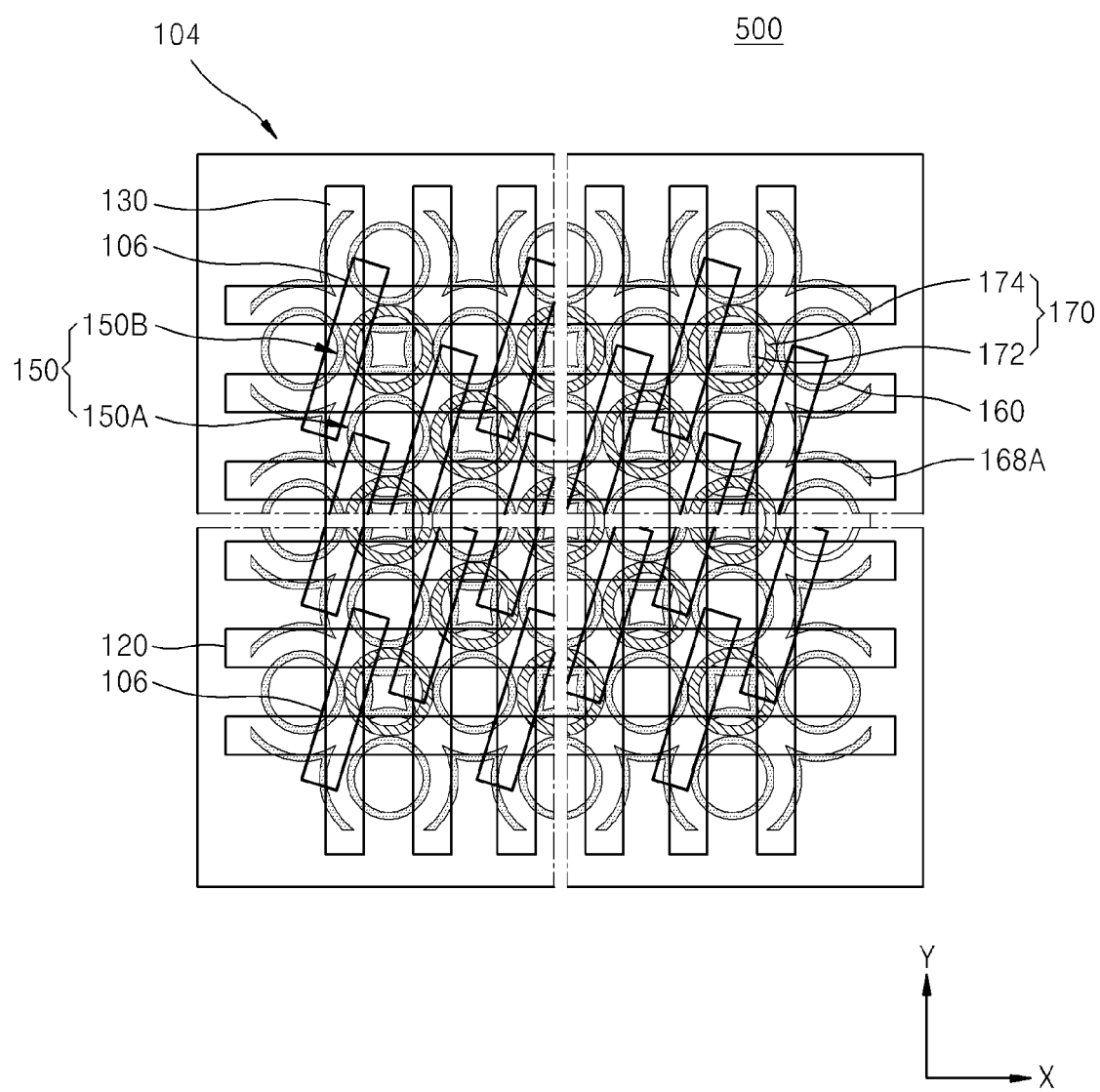
FIG. 6 is a layout diagram of a part of a structure of a semiconductor device according to an embodiment of the inventive concept.

FIG. 6 is a layout diagram of a part of a structure of a semiconductor device 500 according to an embodiment of the inventive concept.

A planar layout of the semiconductor device 500 is the same as a planar layout of the semiconductor device 100 of FIG. 1 except that the semiconductor device 500 includes a plurality of dummy conductive patterns 168A that are relatively shorter than the dummy conductive pattern 168 of FIG. 1.

The plurality of dummy conductive patterns 168A partially wrap a plurality of first storage nodes 160 and a plurality of lower second storage nodes 172 at edge portions of a cell array region 104.

The plurality of dummy conductive patterns 168A may be formed of a material used to form at least one from among the plurality of first storage nodes 160 and the plurality of lower second storage nodes 172. According to an embodiment of the inventive concept, the plurality of dummy conductive patterns 168A may be formed on a plane where the plurality of first storage nodes 160 and the plurality of lower second storage nodes 172 are formed.

In the semiconductor devices 100, 200, 300, 400, and 500 of FIGS. 1 to 6 according to the above embodiments of the inventive concept, the supporter 148 may have any of various shapes according to a planar shape thereof to support the plurality of first storage nodes 160, the plurality of lower second storage nodes 172, and the plurality of upper second storage nodes 174, 274, and 374.

Figure 7A:
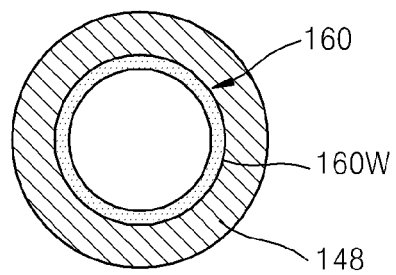
FIGS. 7A to 7C are plan views illustrating a part of a structure including a first storage node and a supporter of a semiconductor device according to embodiments of the inventive concept.
Figure 7B:
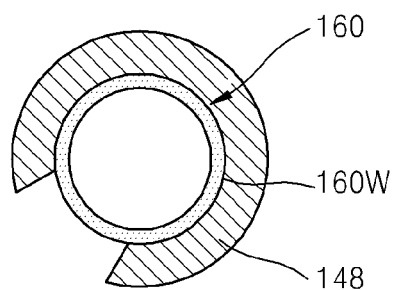
Figure 7C:
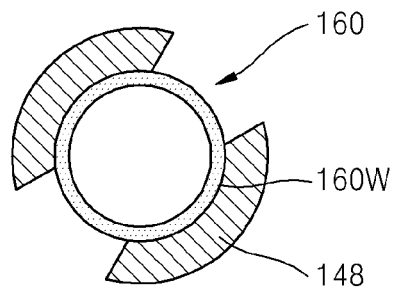

FIGS. 7A to 7C are plan views illustrating a part of a structure including a first storage node 160 and a supporter 148 of a semiconductor device according to embodiments of the inventive concept. For convenience of description, FIGS. 7A to 7C illustrate only a part of the supporter 148 adjacent to an external sidewall of the first storage node 160.

Referring to FIG. 7A, the supporter 148 contacts the first storage node 160, entirely wraps at least a part of a sidewall 160W of the first storage node 160, and supports the first storage node 160.

Referring to FIG. 7B, the supporter 148 contacts parts of the sidewall 160W of the first storage node 160 and supports the first storage node 160.

Referring to FIG. 7C, the supporter 148 contacts two separated points of the sidewall 160W of the first storage node 160 and supports the first storage node 160.

The semiconductor devices 100 to 500 of FIGS. 1 to 6 may include at least one of the structures of the first storage node 160 and the supporter 148 illustrated in FIGS. 7A to 7C.

Although FIGS. 7A to 7C illustrate relations between the first storage node 160 and the supporter 148 according to embodiments of the inventive concept, the embodiments of the inventive concept are not limited thereto. During the manufacture of the supporter 148, the supporter 148 may be formed to have any of geometric shapes by modifying the design thereof. The structures of the first storage node 160 and the supporter 148 may vary according to the shape of the supporter 148. The structures of the first storage node 160 described above with reference to FIGS. 7A to 7C may also be applied to the plurality of lower second storage nodes 172 and the plurality of upper second storage nodes 174, 274, and 374 described above with reference to FIGS. 1 to 6.

In the semiconductor devices 100 to 500 of FIGS. 1 to 6, the plurality of capacitors 150, 250, or 350 include the plurality of first capacitors 150A and the plurality of second capacitors 150B, 250B, or 350B which have different structures. The plurality of first capacitors 150A each include the first storage node 160 that has a cylindrical shape and occupies a relatively large area on a plane. The plurality of second capacitors 150B, 250B, or 350B each have a hybrid structure including the lower second storage node 172 or 272 that has a hollow pillar shape and occupies a relatively small area on a plane, and the upper second storage node 174, 274, or 374 that has a cylindrical shape and occupies a relatively large area on a plane. The lower second storage nodes 172 and 272 are formed on a plane where the first storage node 160 is formed, and the upper second storage nodes 174, 274, and 374 are formed on another plane on the lower second storage nodes 172 and 272 and the first storage node 160.

The lower second storage node 172 or 272 may function as a contact that electrically connects the upper second storage node 174, 274, or 374 and the buried contact 140 below the upper second storage node 174, 274, or 374, and an external surface of the lower second storage node 172 or 272 may be used as an effective area for securing a cell capacitance. The plurality of first capacitors 150A and the plurality of second capacitors 150B, 250B, or 350B are arranged in a line in each of the row direction and the column direction to form a matrix. The plurality of first capacitors 150A and the plurality of second capacitors 150B, 250B, or 350B are alternately arranged in the row and column directions such that one of the plurality of second capacitors 150B, 250B, or 350B is disposed between two adjacent first capacitors 140A among the plurality of first capacitors 150A. Accordingly, it is possible to secure a sufficient cell electrostatic capacitance in a limited plane area by alleviating restrictions to an area of the plurality of first capacitors 150A and the plurality of second capacitors 150B, 250B, or 350B.

FIGS. 8A through 24B are plan and cross-sectional views sequentially illustrating a method of manufacturing a semiconductor device 600 (see FIGS. 24A and 24B) according to an embodiment of the inventive concept. Specifically, FIGS. 8A, 9A, . . . , 23A, and 24A are plan views of some elements of the semiconductor device 600 manufactured according to operations included in the method of manufacturing the semiconductor device 600. FIG. 8B, FIG. 9B, . . . , FIG. 23B, and FIG. 24B are cross-sectional views taken along lines BX-BX', BB-BB', and BY-BY' of FIGS. 8A, 9A, . . . , 23A, and 24A, respectively.

Figure 8A:
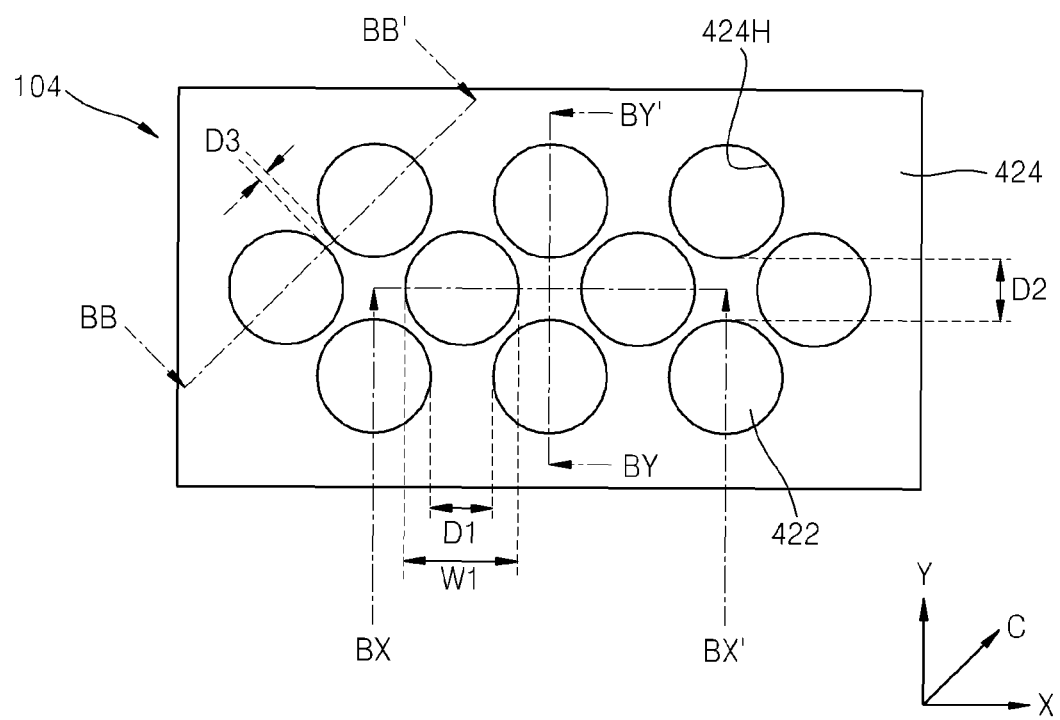
FIGS. 8A through 24B are plan and cross-sectional views sequentially illustrating a method of manufacturing a semiconductor device according to an embodiment of the inventive concept.
Figure 8B:
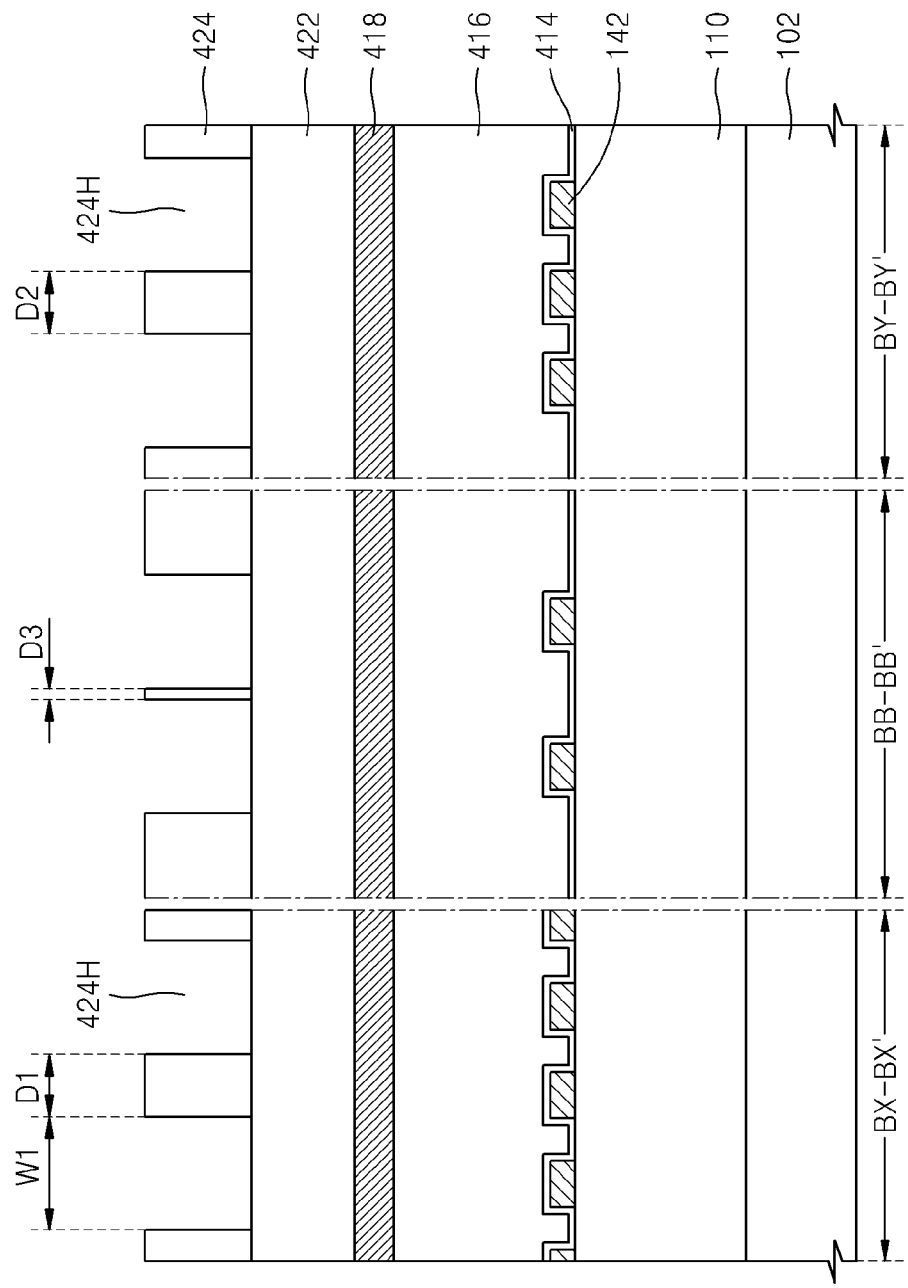

Referring to FIGS. 8A and 8B, in a cell array region 104 of a semiconductor substrate 102, a lower structure 110 is formed including a plurality of word lines 120, a plurality of self-alignment contacts 122, a plurality of contacts 124, a plurality of bit lines 130, and a plurality of buried contacts 140 as illustrated in FIG. 2. The structures of the semiconductor substrate 102 and the lower structure 110 are substantially the same as those illustrated in FIGS. 1 and 2.

A plurality of landing pads 142 are formed of a conductive material on the lower structure 110. The plurality of landing pads 142 are electrically connected to a plurality of buried contacts 140, respectively, of the lower structure 110 illustrated in FIG. 2.

Then, an etch stop layer 414 is formed to cover the plurality of landing pads 142 and the lower structure 110, and a first mold layer 416 and a support layer 418 are sequentially formed on the etch stop layer 414. According to an embodiment of the inventive concept, the etch stop layer 414 is formed of a silicon nitride. According to an embodiment of the inventive concept, the first mold layer 416 is formed of a silicon oxide. The support layer 418 is formed of a material having an etch selectivity with respect to the first mold layer 416. According to an embodiment of the inventive concept, the support layer 418 is formed of a silicon nitride. However, the materials used to form the etch stop layer 414, the first mold layer 416, and the support layer 418 are not limited thereto. Each of the etch stop layer 414, the first mold layer 416, and the support layer 418 may be formed of at least one material selected from the group of various materials. The first mold layer 416 may be formed to a thickness of about 5,000 to 9,000 Å, and the support layer 418 may be formed to a thickness of about 500 to 3,000 Å.

A first hard mask layer 422 is formed on the support layer 418, and a second hard mask pattern 424 is formed on the first hard mask layer 422.

In an embodiment of the inventive concept, to form the second hard mask pattern 424, a second hard mask layer (not shown) is formed on the first hard mask layer 422 and then patterned by a photolithographic process.

Referring to FIGS. 8A and 8B, a plurality of through-holes 424H are formed in the second hard mask pattern 424 and expose the first hard mask pattern 422. The plurality of through-holes 424H are formed to correspond to locations of capacitors that are alternately selected from among capacitors arranged in the row direction (an X-axis direction in FIG. 8A) and capacitors arranged in the column direction (a Y-axis direction in FIG. 8A), which are to be formed during a subsequent process. Referring to FIG. 8A, a plurality of through-holes 424H are arranged in a line in the X-axis direction and in a line in the Y-axis direction, thus forming a matrix.

Each of the plurality of through-holes 424H has a substantially circular planar shape, but is not limited thereto and may have any of various geometrical shapes. The plurality of through-holes 424H may each have a diameter of a first width W1. According to an embodiment of the inventive concept, the plurality of through-holes 424H may have a polygonal planar shape, e.g., a triangular, rectangular, or pentagonal shape, or an oval planar shape.

In the second hard mask pattern 424, the plurality of through-holes 424H are arranged in a line in the X-axis direction to be apart from one another by a first distance D1, and the plurality of through-holes 424H are arranged in a line in the Y-axis direction to be apart from one another by a second distance D2. The first distance D1 and the second distance D2 are set such that a hollow pillar shaped storage node may be formed between two adjacent through-holes disposed apart from each other by the first or second distance D1 or D2 during a subsequent process.

In the second hard mask pattern 424, a plurality of through-holes 424H arranged in a line in a C-axis direction, e.g., a diagonal direction, are disposed apart from one another by a third distance D3. The third distance D3 may be less than the first distance D1 and the second distance D2. In an embodiment of the inventive concept, the first distance D1 and the second distance D2 may be the same. In an embodiment of the inventive concept, the third distance D3 may be about ⅙ to about ⅓ times the first distance D1 or the second distance D2. In an embodiment of the inventive concept, the first width W1 may be about two or about three times the first distance D1 or the second distance D2. In an embodiment of the inventive concept, the first width W1 may be about ten or fifteen times the third distance D3.

The first hard mask layer 422 may include a poly silicon layer or a silicon oxide layer. The second hard mask pattern 424 may be formed of a material having an etch selectivity with respect to the first hard mask layer 422. In an embodiment of the inventive concept, the second hard mask pattern 424 may be formed of a layer selected from among a silicon oxide layer, a silicon nitride layer, and a poly silicon layer. For example, the first hard mask layer 422 may include a poly silicon layer, and the second hard mask pattern 424 may include a silicon oxide layer or a silicon nitride layer.

Figure 9A:
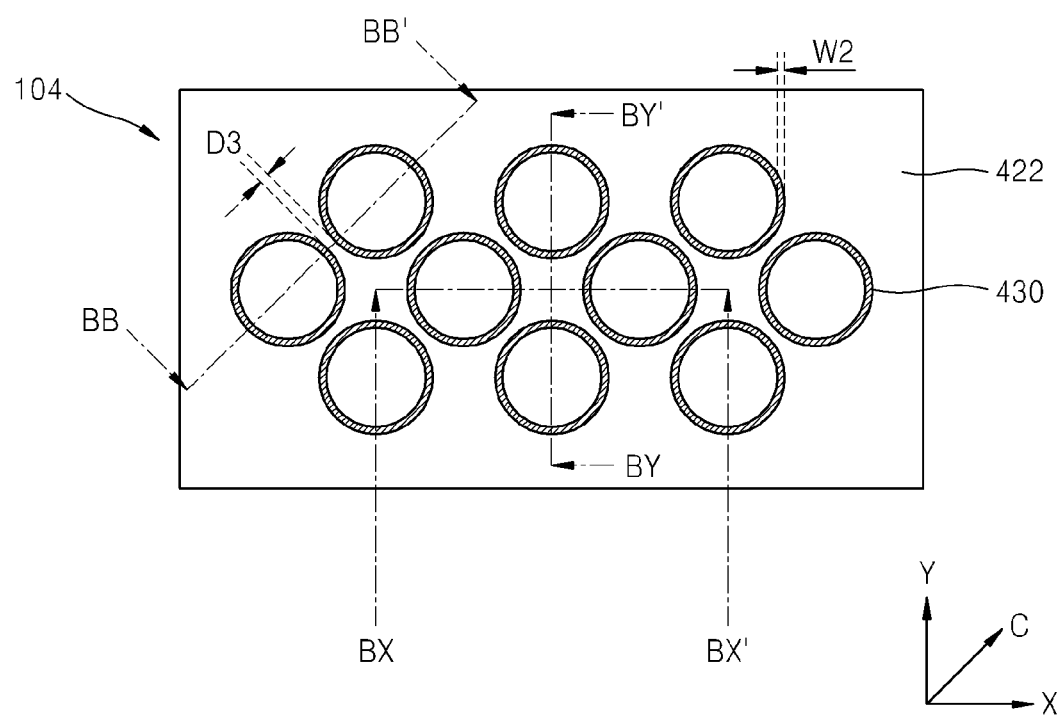
Figure 9B:
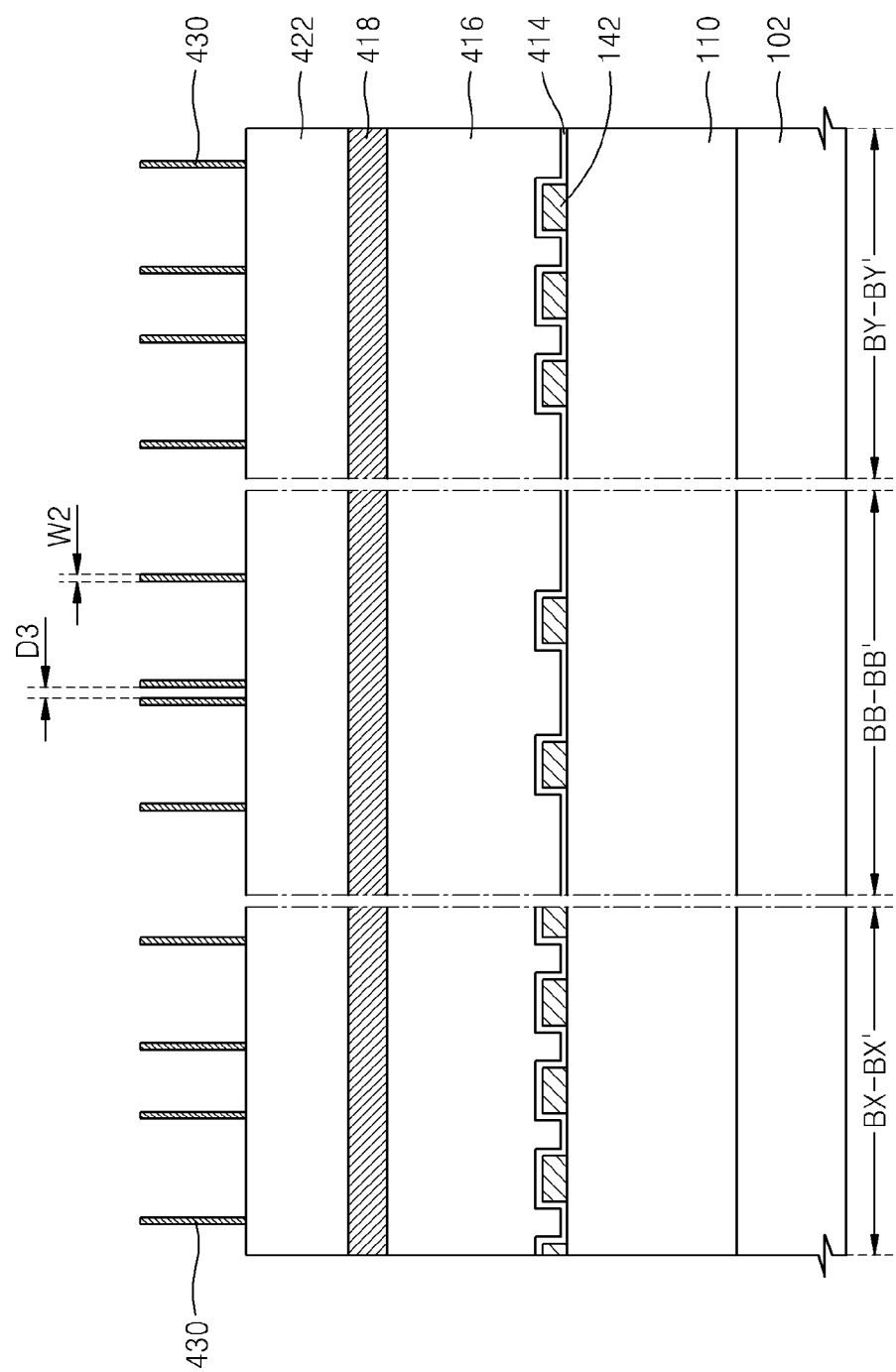

Referring to FIGS. 9A and 9B, a plurality of first spacers 430 are formed to be respectively disposed in the plurality of through-holes 424H in the second hard mask pattern 424 of FIGS. 8A and 8B, and then, the second hard mask pattern 424 is removed.

In an embodiment of the inventive concept, to form the plurality of first spacers 430, a third hard mask layer (not shown) is formed to evenly cover an exposed surface of the second hard mask pattern 424 and a surface of the first hard mask layer 422 exposed via the plurality of through-holes 424H. Then, the third hard mask layer is etch-backed to leave the plurality of first spacers 430 extending on inner walls of the plurality of through-holes 424H. The plurality of first spacers 430 each have a circular planar shape to correspond to the circular outline of the plurality of through-holes 424H.

The plurality of first spacers 430 may be formed of a material having an etch selectivity with respect to the first hard mask layer 422 and the second hard mask pattern 424. In an embodiment of the inventive concept, the plurality of first spacers 430 may be formed of a silicon nitride layer or a silicon oxide layer. For example, when the first hard mask layer 422 includes a poly silicon layer and the second hard mask pattern 424 includes a silicon oxide layer, the plurality of first spacers 430 may be formed of a silicon nitride layer. When the first hard mask layer 422 includes a poly silicon layer and the second hard mask pattern 424 includes a silicon nitride layer, the plurality of first spacers 430 may be formed of a silicon oxide layer.

In an embodiment of the inventive concept, the plurality of first spacers 430 may each have a second width W2 that is less than the third distance D3. For example, the second width W2 may be about 5 to about 20 nm, but the embodiments of the inventive concept are not limited thereto and the second width W2 may vary according to circumstances.

Figure 10A:
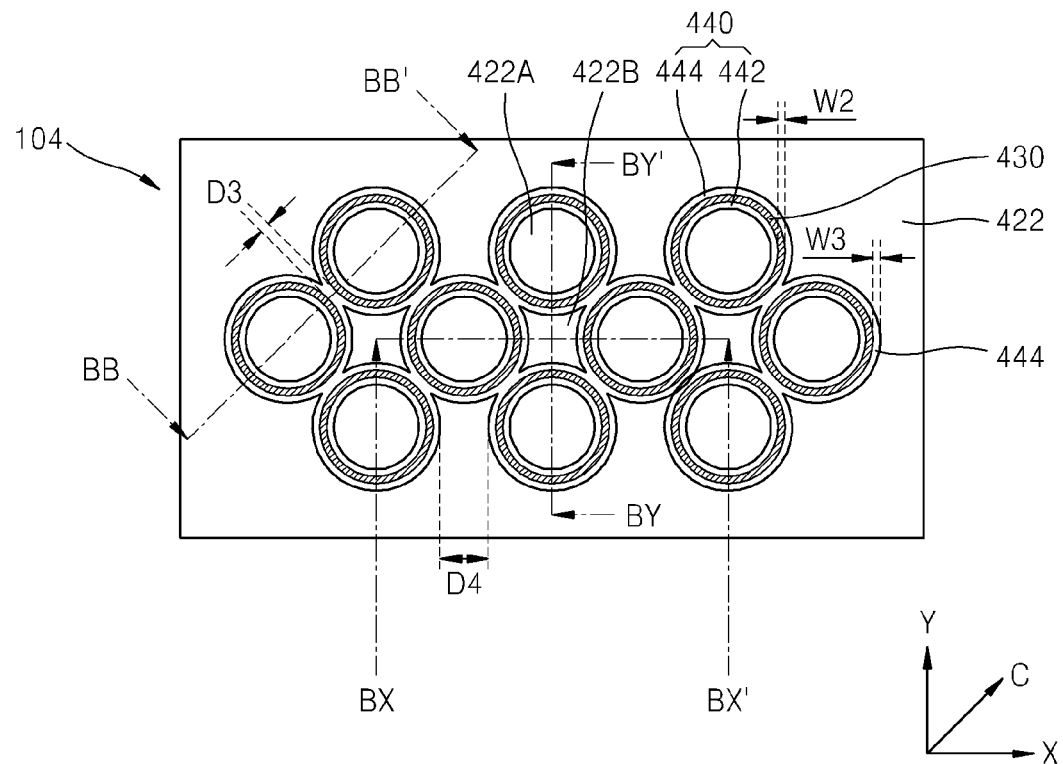
Figure 10B:
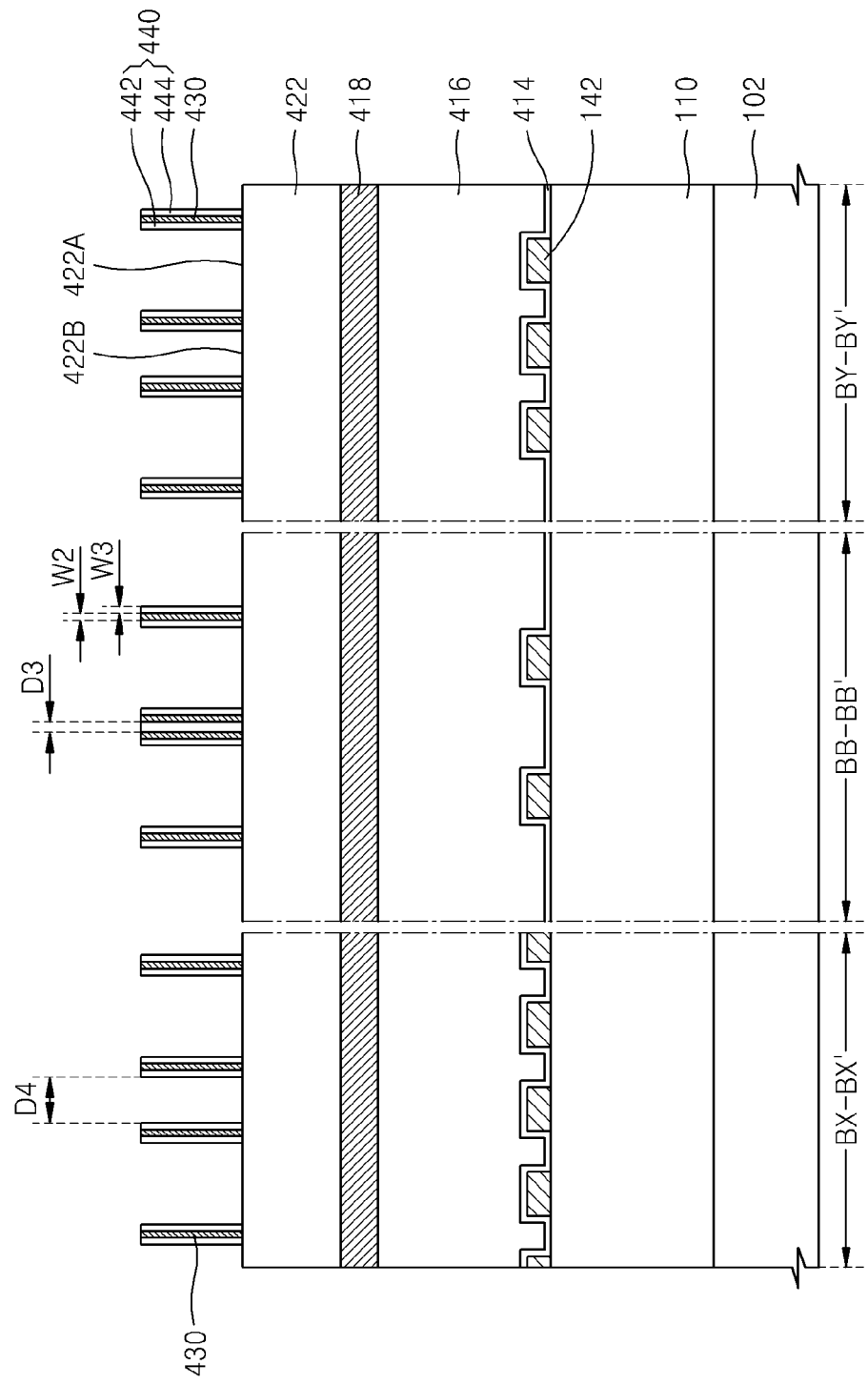

Referring to FIGS. 10A and 10B, a plurality of second spacers 440 are formed to cover inner and outer sidewalls of the plurality of first spacers 430. The plurality of second spacers 440 include a plurality of inner second spacers 442 respectively covering the inner sidewalls of the plurality of first spacers 430, and a plurality of outer second spacers 444 respectively covering the outer sidewalls of the plurality of first spacers 430.

In an embodiment of the inventive concept, to form the plurality of second spacers 440, a fourth hard mask layer (not shown) is formed to cover exposed surfaces of the plurality of first spacers 430 and an exposed surface of the first hard mask layer 422. The fourth hard mask layer is formed to have an appropriate thickness such that at least a part of the space formed between two adjacent first spacers 430 in the C-axis direction and around a line connecting centers on the two adjacent first spacers 430 may be completely filled with the fourth hard mask layer. The fourth hard mask layer may be formed by atomic layer deposition (ALD). The fourth hard mask layer is formed to a thickness that is greater than the third distance D3 in at least the space between two adjacent first spacers 430 in the C-axis direction. Then, the fourth hard mask layer is etch-backed to leave the plurality of second spacers 440 covering the inner and outer sidewalls of the plurality of first spacers 430. The inner second spacers 442 and the outer second spacers 444 of the plurality of second spacers 440 are formed to each have a circular planar shape to correspond to the circular outline of the plurality of first spacers 430. As illustrated in FIG. 10A, the plurality of outer second spacers 444 are disposed apart from one another by a fourth distance D4 in the X-axis direction around lines each connecting centers on adjacent two outer second spacers from among the plurality of outer second spacers 444. The plurality of outer second spacers 444 are connected to one another around the lines each connecting centers on adjacent two outer second spacers from among the plurality of outer second spacers 444. Accordingly, the plurality of outer second spacers 444 arranged in a line in the C-axis direction are integrally connected to one another.

The first hard mask layer 422 is exposed via the plurality of first spacers 430 and the plurality of second spacers 440. The exposed region of the first hard mask layer 422 includes a first exposed region 422A having an outwardly convex planar shape and a second exposed region 422B having an outwardly concave planar shape.

The plurality of second spacers 440 are formed of a material having an etch selectivity with respect to the first hard mask layer 422. In an embodiment of the inventive concept, the plurality of second spacers 440 may be formed of a silicon nitride layer or a silicon oxide. For example, when the first hard mask layer 422 is a poly silicon layer and the second hard mask pattern 424 is a silicon oxide layer or a silicon nitride layer, the plurality of second spacers 440 may be formed of a silicon nitride layer or a silicon oxide layer. The second hard mask pattern 424 and the plurality of second spacers 440 may be formed of the same material or different materials.

In an embodiment of the inventive concept, the plurality of second spacers 440 may have a third width W3 that is greater than half the third distance D3. For example, the third width W3 may be about 3 to about 15 nm, but the embodiments of the inventive concept are not limited thereto and the third width W3 may vary according to circumstances.

Figure 11A:
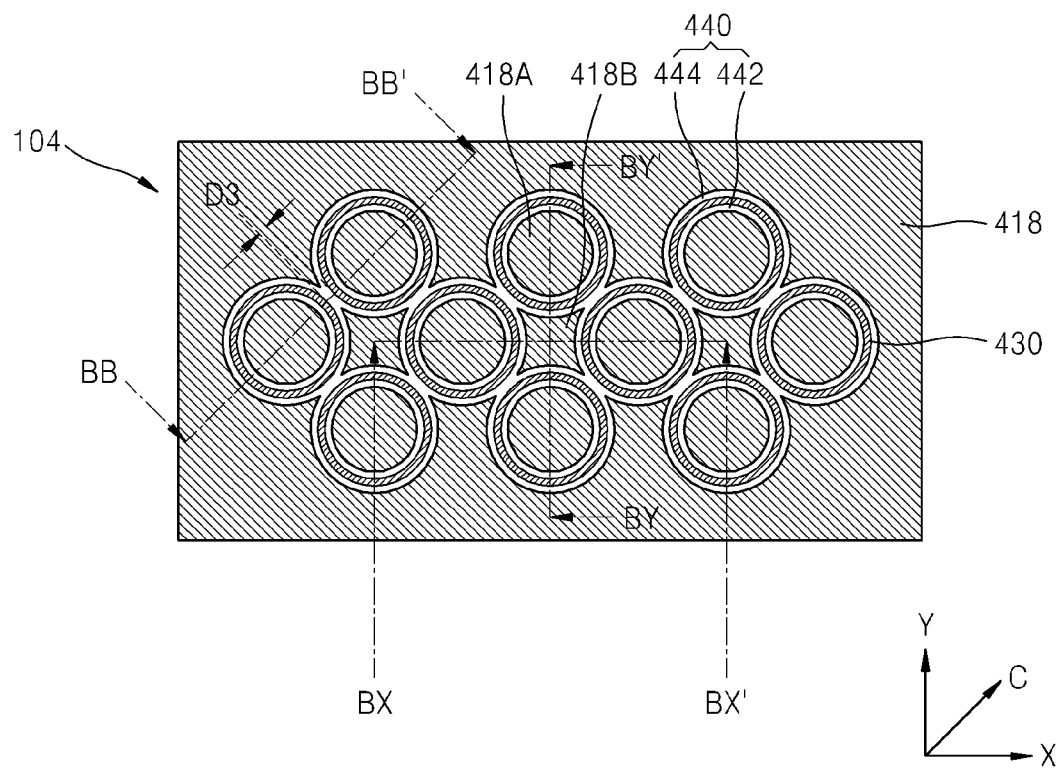
Figure 11B:
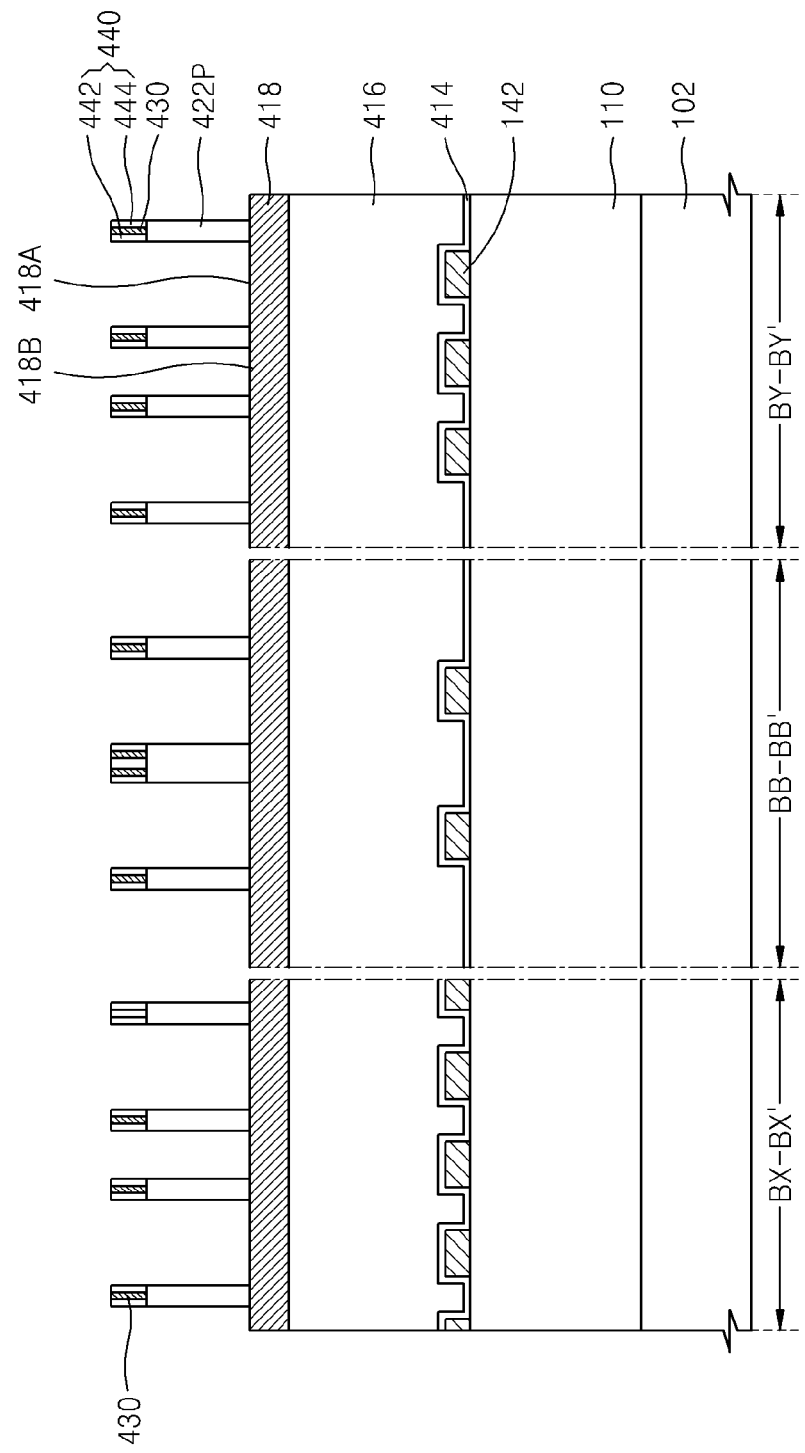

Referring to FIGS. 11A and 11B, the first hard mask layer 422 is anisotropically dry-etched by using the plurality of first spacers 430 and the plurality of second spacers 440 as an etch mask to form a first hard mask pattern 422P that exposes the support layer 418

The first hard mask pattern 422P includes a plurality of circular patterns that are connected to one another in the C-axis direction. In an embodiment of the inventive concept, in the cell array region 104 of the semiconductor substrate 102, the first hard mask pattern 422P may include a pattern in which a plurality of circular patterns are connected to one another.

After the first hard mask pattern 422P is formed, heights of the plurality of first spacers 430 and the plurality of second spacers 440 decrease since parts of the plurality of first spacers 430 and the plurality of second spacers 440 are consumed by an etch atmosphere.

The support layer 418 is exposed via the first hard mask pattern 422P. An exposed region of the support layer 418 includes a first exposed region 148A having an outwardly convex planar shape, and a second exposed region 148B having an outwardly concave planar shape.

Figure 12A:
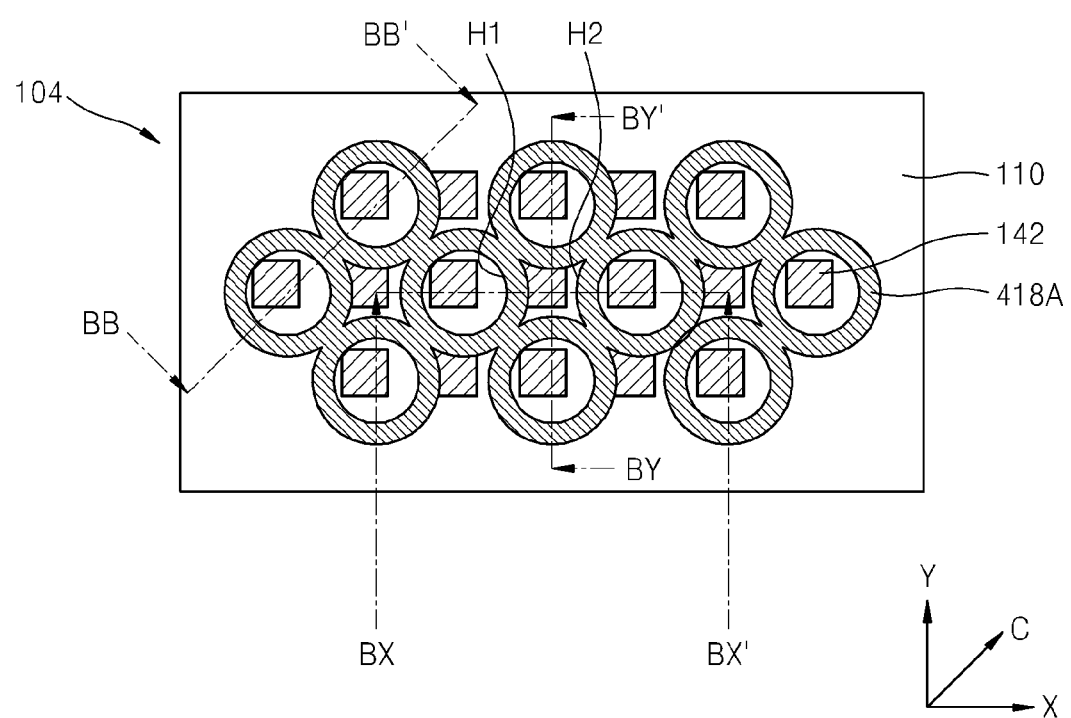
Figure 12B:
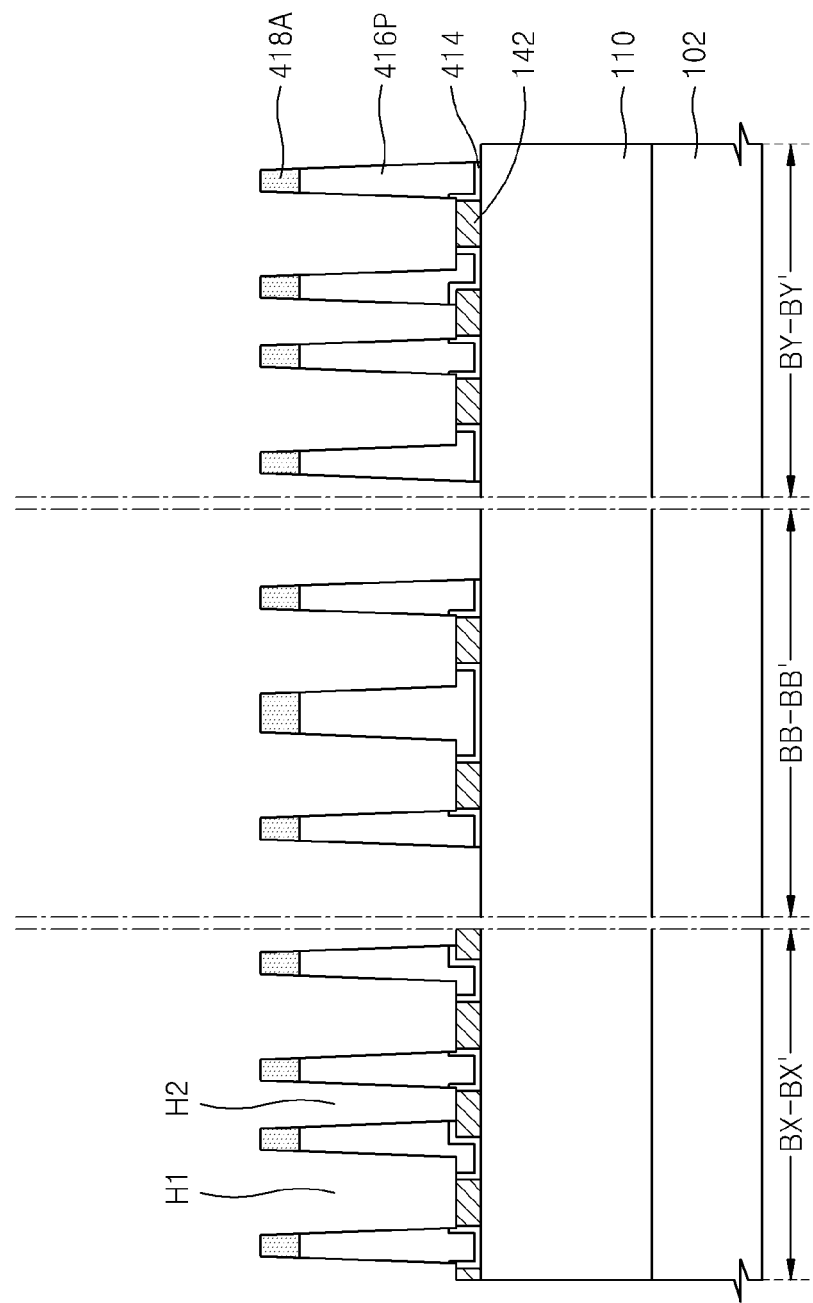

Referring to FIGS. 12A and 12B, a supporter pattern 418A exposing the first mold layer 416 is formed by etching the support layer 418 by using the first hard mask pattern 422P illustrated in FIGS. 11A and 11B as an etch mask. Then, a first mold pattern 416P is formed by anisotropically dry-etching the first mold layer 416 by using the first hard mask pattern 422P and the supporter pattern 418A as an etch mask the etch stop layer 414 and using the etch stop layer 414 as an end point of etching.

The etch stop layer 414 exposed after forming the first mold pattern 416P is etched due to over etching during an etch process of forming the first mold pattern 416P. Thus, the plurality of landing pads 142 are exposed via the first mold pattern 416P. After the first mold pattern 416P is formed, the first hard mask pattern 422P remaining on the supporter pattern 418A is removed to expose an upper surface of the supporter pattern 418A.

A plurality of first holes H1 and a plurality of second holes H2 are defined by the first mold pattern 416P and the supporter pattern 418A. Horizontal cross-sectional shapes of the plurality of first holes H1 are different from horizontal cross-sectional shapes of the plurality of second holes H2. The insides of the plurality of first holes H1 each have a horizontal cross-sectional shape having concave sidewalls. The insides of the plurality of second holes H2 each have a horizontal cross-sectional shape having convex sidewalls.

Figure 13A:
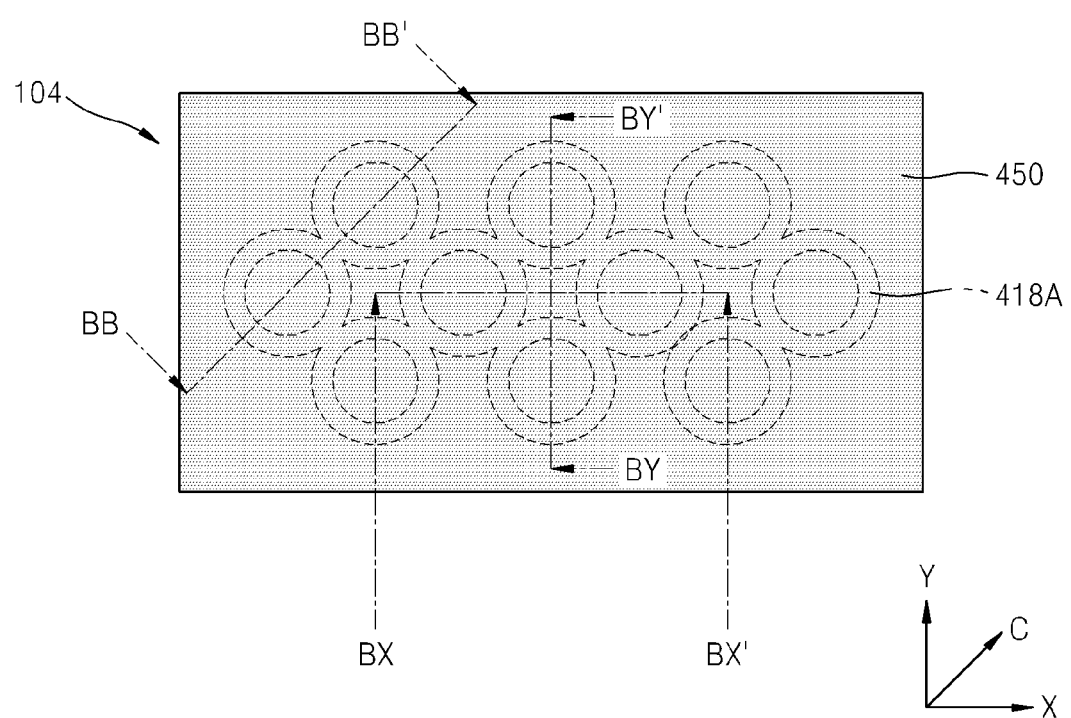
Figure 13B:
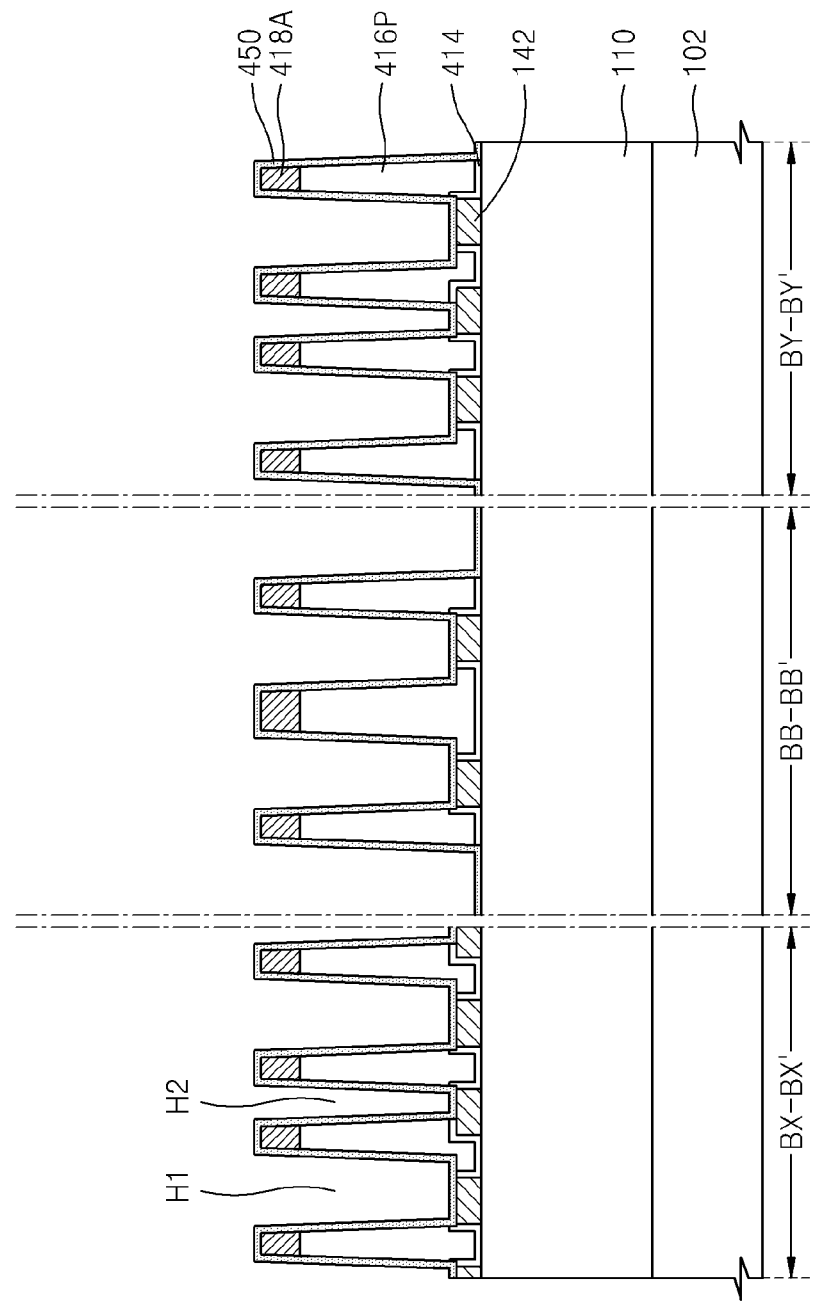

Referring to FIGS. 13A and 13B, a first conductive layer 450 for storage nodes is formed on an exposed surface of the cell array region 104 to evenly cover sidewalls of the plurality of first holes H1 and the plurality of second holes H2.

In an embodiment of the inventive concept, the first conductive layer 450 may include a metal-containing layer. For example, the first conductive layer 450 may be formed of at least one material selected from the group consisting of TiN, Ti, TaN, and Ta. The first conductive layer 450 may be formed by atomic layer deposition (ALD), chemical vapor deposition (CVD), or physical vapor deposition (PVD).

In an embodiment of the inventive concept, the first conductive layer 450 may be formed evenly on the entire cell array region 104. The first conductive layer 450 may be formed to a thickness of about 5 to 10 nm, but the embodiments of the inventive concept are not limited thereto.

Figure 14A:
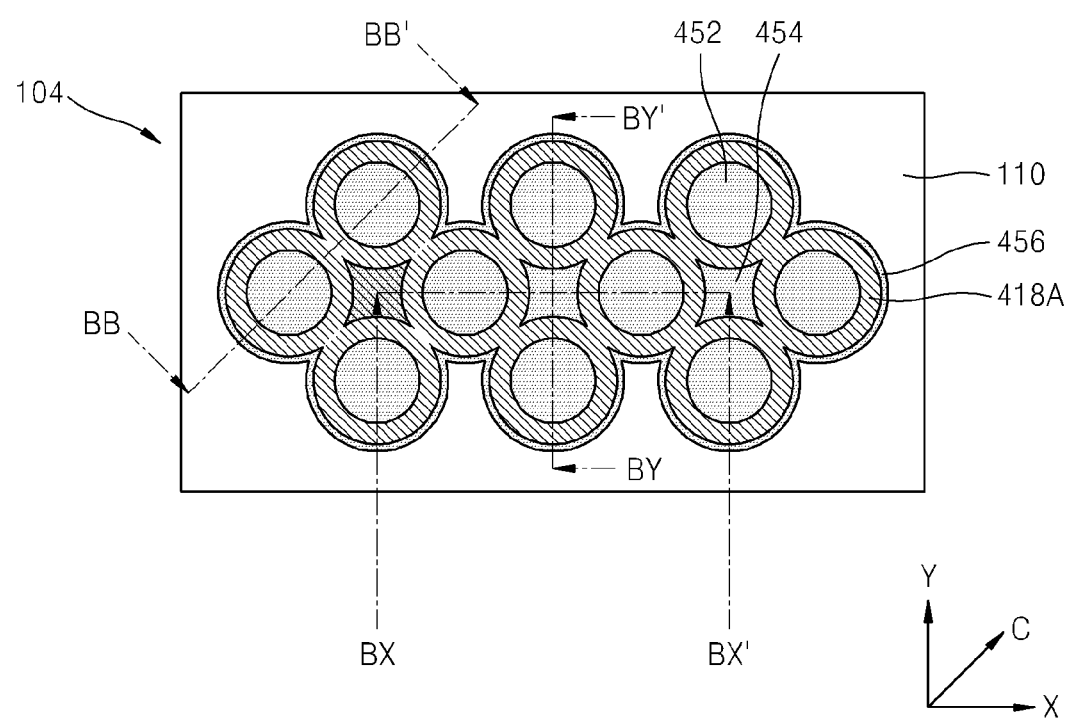
Figure 14B:
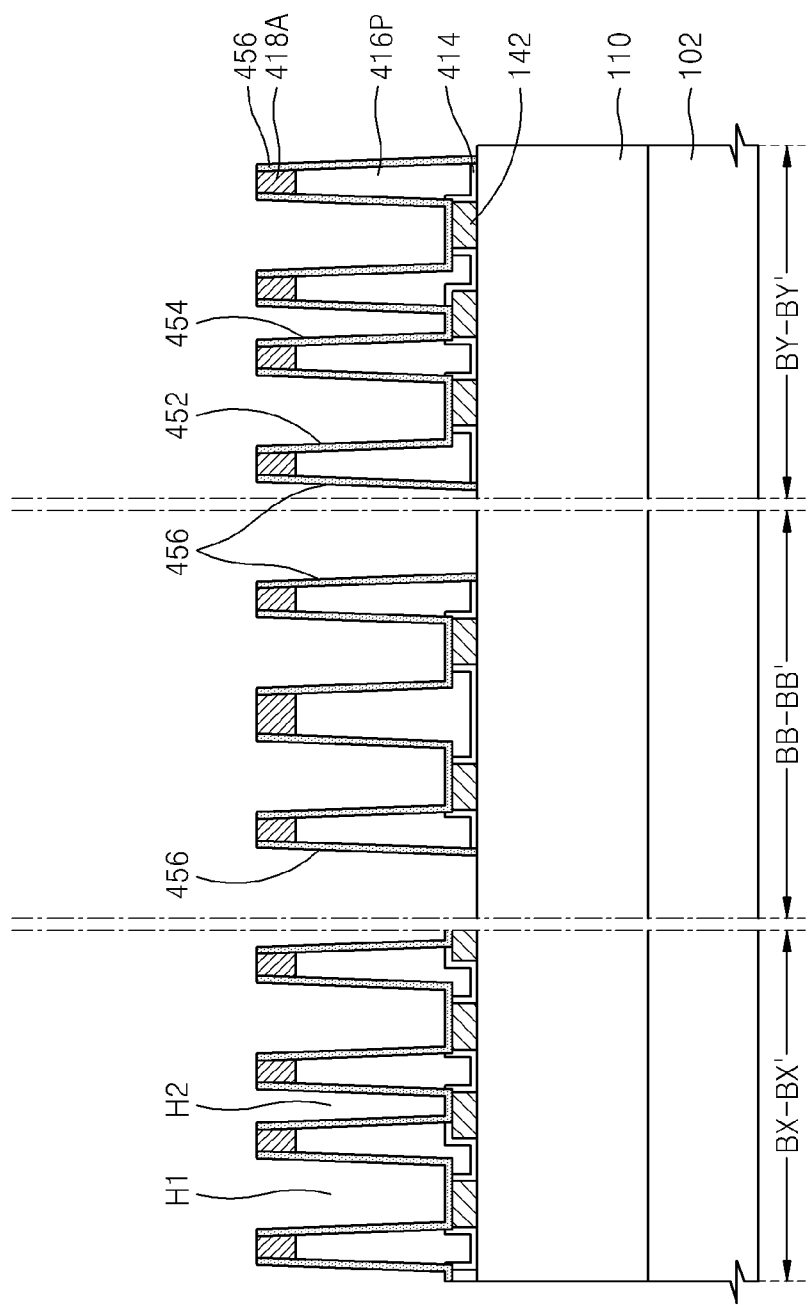

Referring to FIGS. 14A and 14B, the first conductive layer 450 is divided into a plurality of first storage nodes 452 and a plurality of lower second storage nodes 454 by removing a part of the first conductive layer 450 to expose an upper surface of the supporter pattern 418A.

The plurality of first storage nodes 452 are formed along with inner walls the plurality of first holes H1, and each have a cylindrical structure including outwardly convex surfaces.

The plurality of lower second storage nodes 454 are formed along with inner walls of the plurality of second holes H2, and each have a hollow pillar structure including outwardly concave surfaces.

In an embodiment of the inventive concept, the first conductive layer 450 is etch-backed by reactive ion etching (RIE) to remove a part of the first conductive layer 450 until an upper surface of the supporter pattern 418A is exposed.

During the etch back of the first conductive layer 450, a part of the first conductive layer 450 covering the upper surface of the supporter pattern 418A is removed by reactive ions generated from an etch gas. However, since the plurality of first holes H1 and the plurality of second holes H2 formed in the first mold pattern 416P each have a relatively narrow inner width and a relatively large aspect ratio, the reactive ions do not arrive around bottom surfaces of the plurality of first holes H1 and the plurality of second holes H2 while the part of the first conductive layer 450 is removed until the upper surface of the supporter pattern 418A is exposed. Thus, parts of the first conductive layer 450 covering the plurality of landing pads 142 are not removed and remain on the bottom surfaces of the plurality of first holes H1 and the plurality of second holes H2.

Parts of the first conductive layer 450 covering the lower structure 110 on edge portions of the cell array region 104 outside the first mold pattern 416P have a flat surface on a relatively large area unlike a region in which the first mold pattern 416P is formed. Thus, the edge portions of the cell array region 104 outside the first mold pattern 416P may be exposed to the reactive ions generated from the etch gas. Thus, while a part of the first conductive layer 450 is removed to expose the upper surface of the supporter pattern 418A, the parts of the first conductive layer 450 covering the lower structure 110 on the edge portions of the cell array region 104 outside the first mold pattern 416P are removed, thereby exposing the upper surface of the lower structure 110. In contrast, parts of the first conductive layer 450 covering outermost sidewalls of the first mold pattern 416P are not completely removed and remain as a dummy conductive pattern 456, while the a part of the first conductive layer 450 is removed until the upper surface of the supporter pattern 418A is exposed. The dummy conductive pattern 456 remaining on the outermost sidewalls of the first mold pattern 416P is located adjacent to first storage nodes 160 that are respectively present on outermost sides of a plane from among the plurality of first storage nodes 160, and has a band shape wrapping outer sides of all the plurality of first storage nodes 452 and the plurality of lower second storage nodes 454.

In an embodiment of the inventive concept, the dummy conductive pattern 456 is formed on the same plane as a plane on which the plurality of first storage nodes 160 and plurality of lower second storage nodes 172 are formed. In an embodiment of the inventive concept, the dummy conductive pattern 456 may have a continuous band shape. In an embodiment of the inventive concept, the dummy conductive pattern 456 may have an intermittent band shape that includes at least one cutting portion (not shown).

Figure 15A:
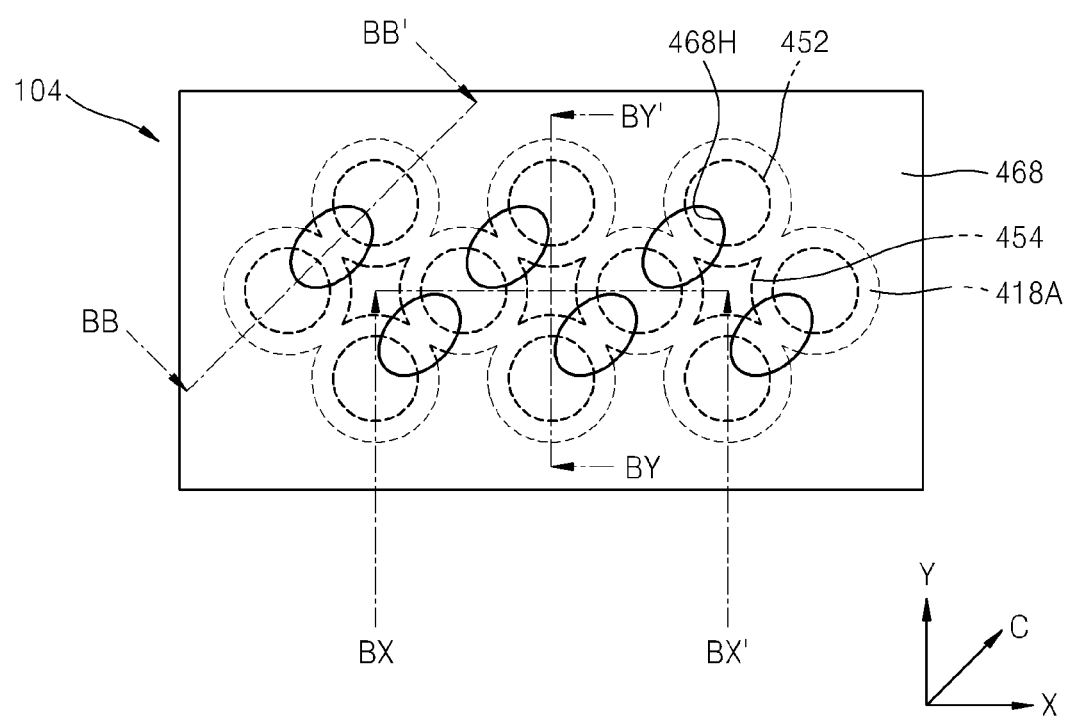
Figure 15B:
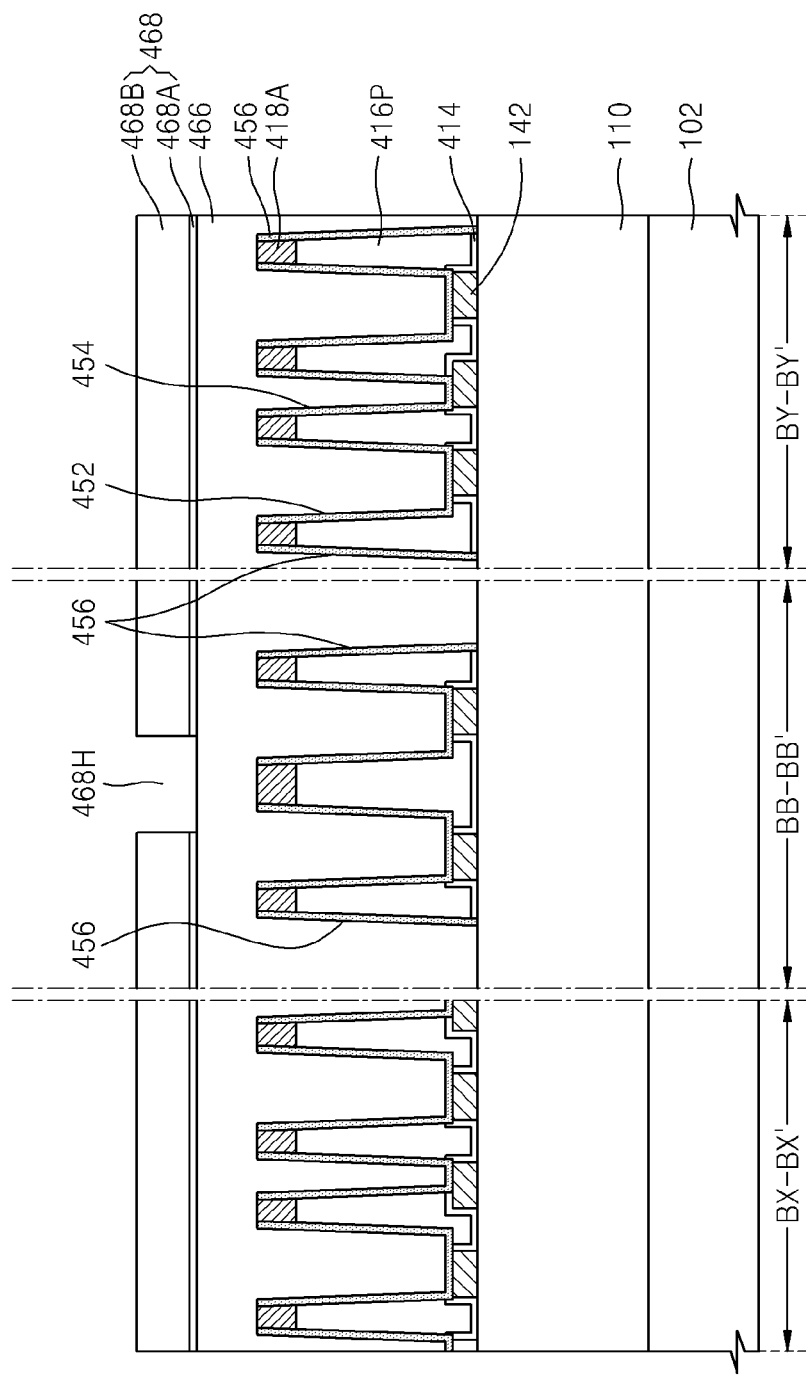

Referring to FIGS. 15A and 15B, a protective layer 466 is formed to have an appropriate thickness on the resultant structure on which the plurality of first storage nodes 452 and the plurality of lower second storage nodes 454 are formed such that the plurality of first storage nodes 452 and the plurality of lower second storage nodes 454 are sufficiently covered by the protective layer 466. Then, a first mask pattern 468 is formed on the protective layer 466 to partially expose the protective layer 466. The first mask pattern 468 includes an anti-reflective pattern 468A and a photoresist pattern 468B.

A plurality of third holes 468H are formed in the anti-reflective pattern 468A and the photoresist pattern 468B to partially expose an upper surface of the protective layer 466. The plurality of third holes 468H are located to correspond to regions of the supporter pattern 418A that are to be removed. Referring to FIG. 15A, the plurality of third holes 468H each have an oval shape, the long axis of which is relatively short and that is located to correspond to a region extending over two adjacent first storage nodes 452 in the C-axis direction. However, the embodiments of the inventive concept are not limited thereto, and the shape and size of each of the plurality of third holes 468H are not limited.

Figure 25A:
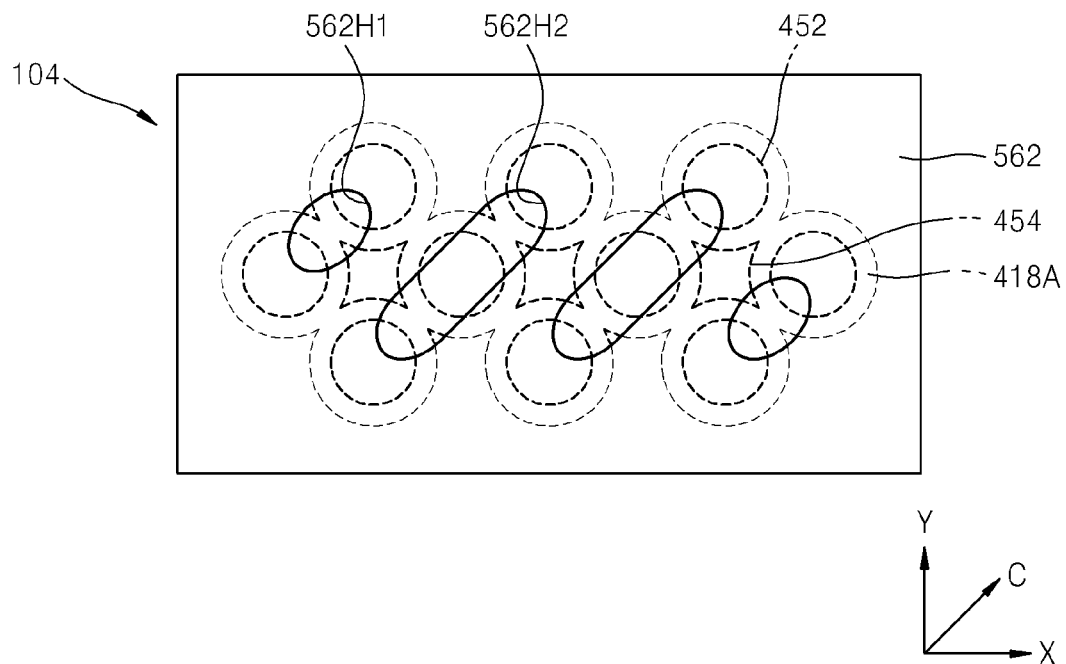
FIGS. 25A to 25C are plan views of a mask pattern used to manufacture a semiconductor device according to various embodiments of the inventive concept.

In an embodiment of the inventive concept, a mask pattern is formed to have a plurality of holes that are formed in an oval shape, the long axis of which is relatively long and that is located to correspond to a region extending over at least three adjacent first storage nodes 452 in the C-axis direction. For example, referring to FIG. 25A, instead of the mask pattern 468, a mask pattern 562 may be formed to have a plurality of holes 562H1 and a plurality of holes 562H2. The plurality of holes 562H1 have a long axis relatively short, like the plurality of third holes 468H, and the plurality of holes 562H2 formed in an oval shape, have a long axis relatively long and are formed to correspond to a region extending over at least three adjacent first storage nodes 452 in the C-axis direction.

Figure 25B:
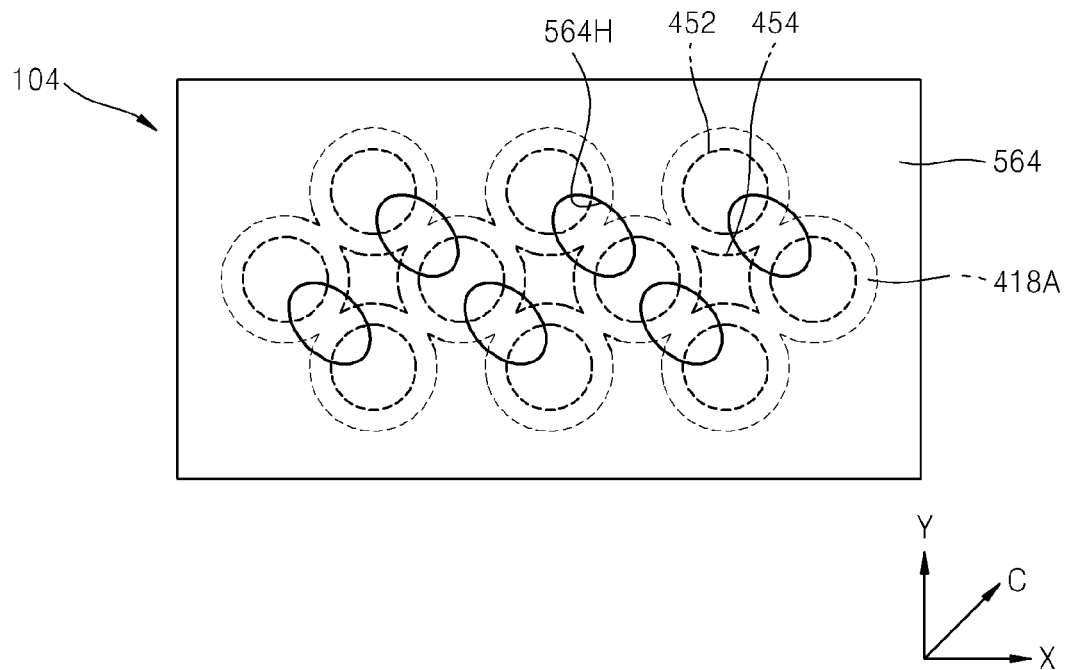

In an embodiment of the inventive concept, instead of the plurality of third holes 468H, a plurality of holes may be formed in an oval shape, the size of which corresponds to a region extending over at least two first storage nodes 452 in a direction that is diagonal to the C-axis direction. For example, referring to FIG. 25B, instead of the first mask pattern 468, a mask pattern 564 with a plurality of holes 564H may be formed.

Figure 25C:
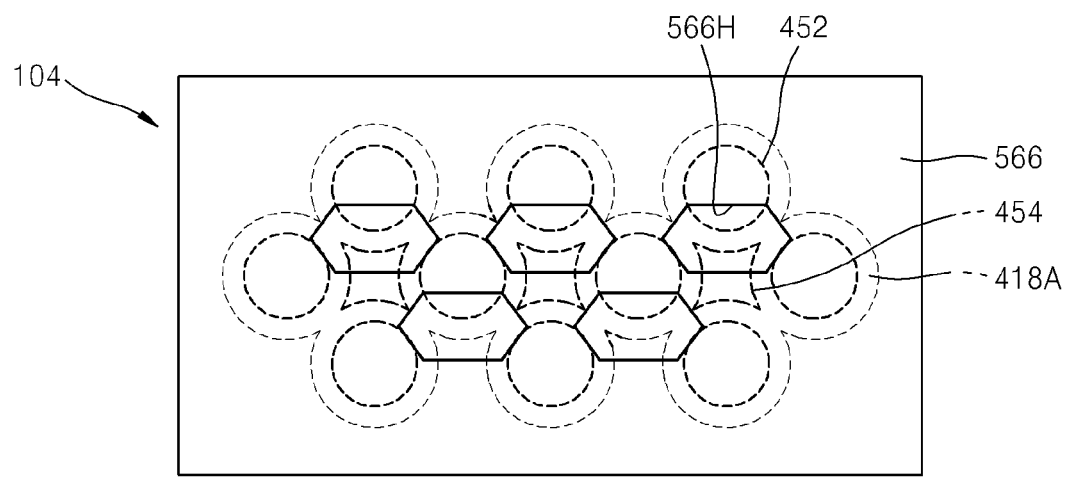

In an embodiment of the inventive concept, instead of the plurality of third holes 468H, a plurality of holes may be formed in any of various geometrical shapes on a location corresponding to a region extending over at least two first storage nodes 452 in the X-axis direction, the Y-axis direction, or a combination of the X-axis direction and the Y-axis direction. For example, referring to FIG. 25C, instead of the first mask pattern 468, a first mask pattern 566 with a plurality of holes 566H may be formed.

In an embodiment of the inventive concept, the protective layer 466 may be formed of an organic compound that contains an aromatic ring, such as phenyl, benzene, naphthalene, or a derivative thereof and that has a relatively high carbon content of about 85 to 99% by weight of the total weight of the organic compound (hereinafter referred to as 'SOH material').

In an embodiment of the inventive concept, the protective layer 466 may be formed by spin coating. To form the protective layer 466, an SOH material is formed by spin coating to a thickness of about 1,500 to about 5,000 Å on the resultant structure on which the plurality of first storage nodes 452 and the plurality of lower second storage nodes 454 are formed, thereby obtaining an organic compound layer. Then, the organic compound layer is primarily baked at about 150 to about 350° C. for about 60 minutes to form a carbon-containing film. Then, the carbon-containing film is secondarily baked at about 300 to about 550° C. for about 30 to about 300 seconds to be hardened. Since the carbon-containing film is secondarily baked to be hardened as described above, even if another film, e.g., a film for forming the anti-reflective pattern 468A, is deposited on the carbon-containing film at a relatively high temperature, e.g., about 400° C., the carbon-containing film is prevented from being degraded during the deposition.

In an embodiment of the inventive concept, the anti-reflective pattern 468A is formed of SiON. The anti-reflective pattern 468A may be formed to a thickness of about 100 to about 500 Å.

Figure 16A:
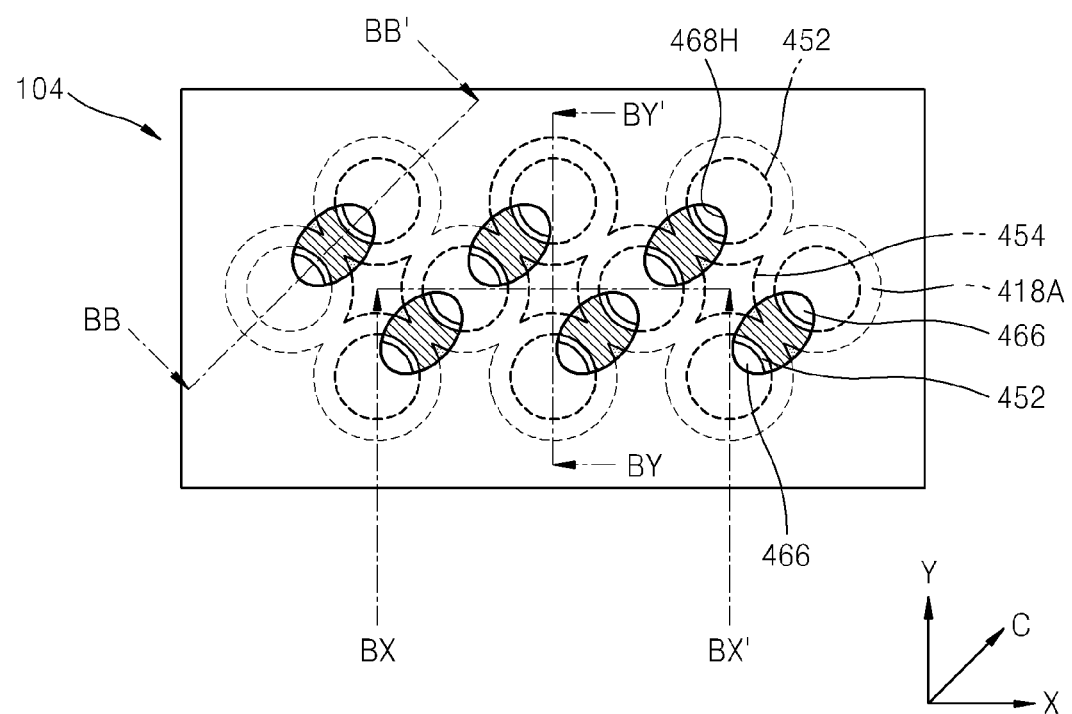
Figure 16B:
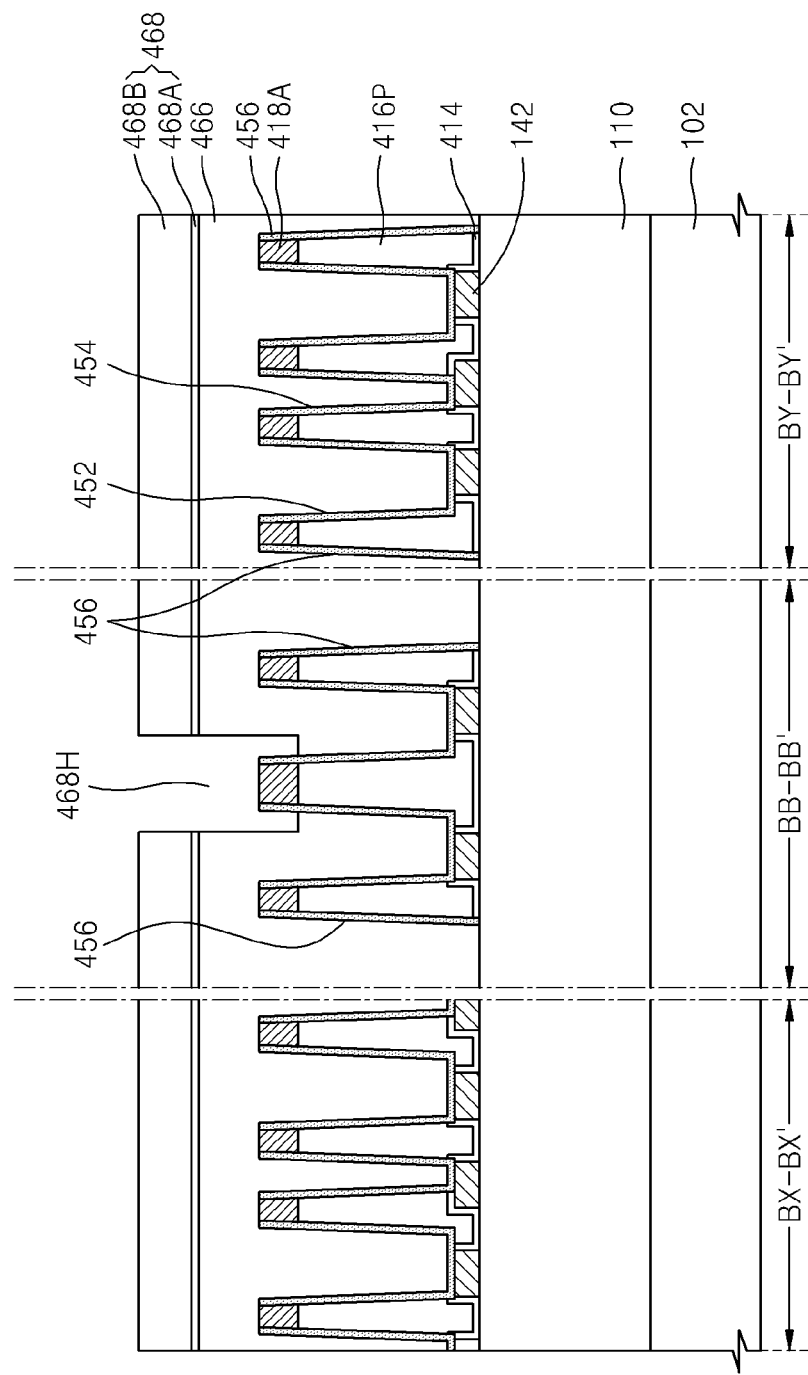

Referring to FIGS. 16A and 16B, the protective layer 466 is etched to a predetermined depth by using the first mask pattern 468 as an etch mask so that portions of the supporter pattern 418A, which are to be removed, are exposed via the plurality of third holes 468H.

Figure 17A:
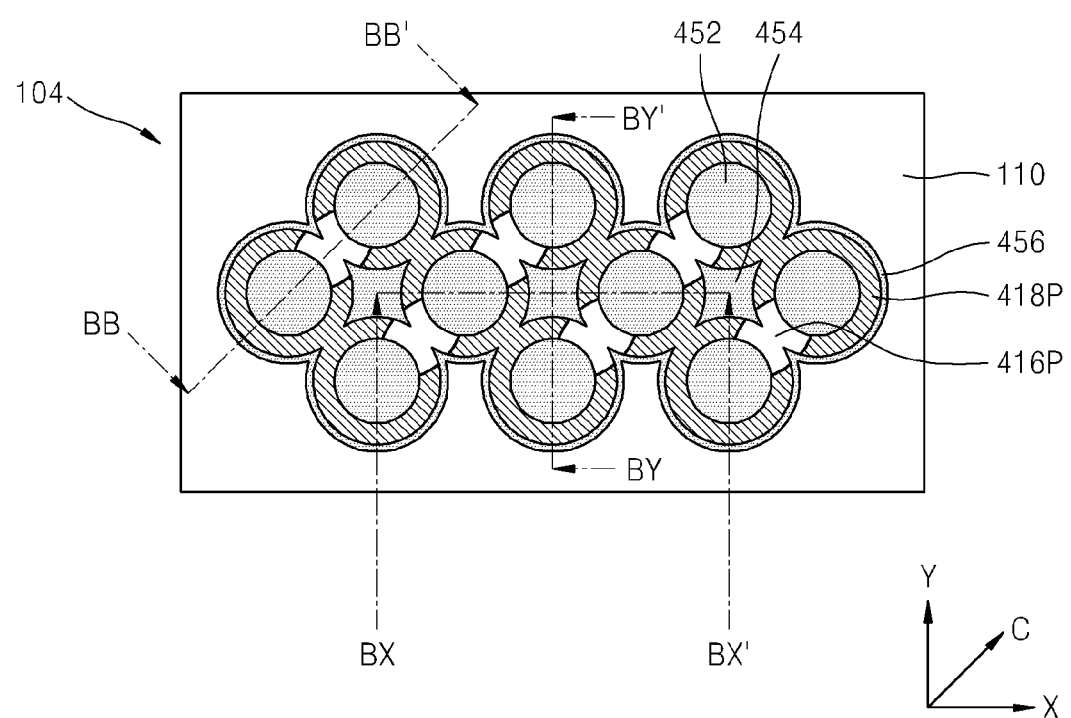
Figure 17B:
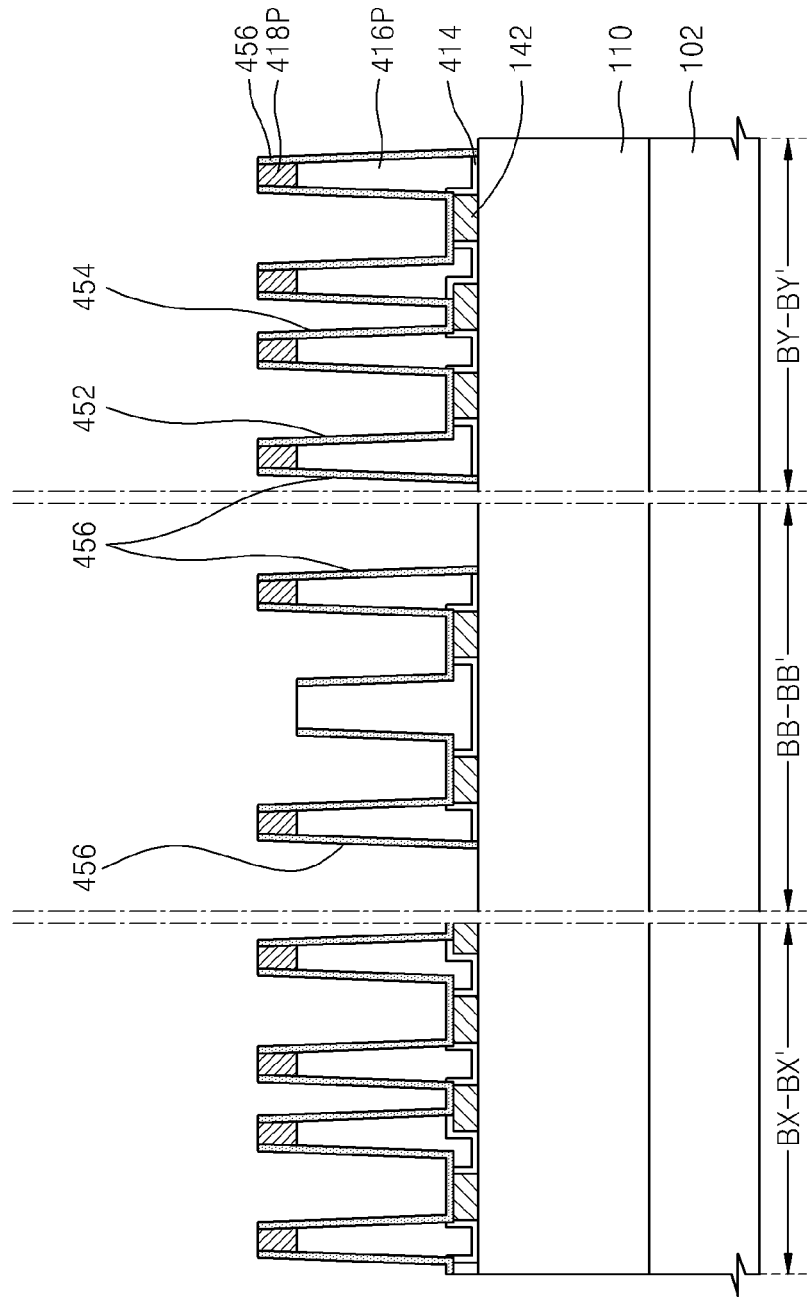

Referring to FIGS. 17A and 17B, the exposed portions of the supporter pattern 418A are removed from the resultant structure illustrated in FIGS. 16A and 16B, thereby forming a supporter 418P that is a remaining portion of the supporter pattern 418A. Then, the remaining first mask pattern 468 and protective layer 466 are removed to expose the plurality of first storage nodes 452 and the plurality of lower second storage nodes 454.

In an embodiment of the inventive concept, the exposed portions of the supporter pattern 418A may be removed by plasma dry etching. While the exposed portions of the supporter pattern 418A are removed by plasma dry etching, portions of the plurality of first storage nodes 452 and the plurality of lower second storage nodes 454, which are adjacent to the exposed portions of the supporter pattern 418A, may also be exposed to plasma and thus be removed together with the exposed portions of the supporter pattern 418A. As a result, some of the plurality of first storage nodes 452 and the plurality of lower second storage nodes 454 may have a stepped upper surface. In an embodiment of the inventive concept, the exposed portions of the supporter pattern 418A may be removed by wet etching using a phosphoric acid solution. In an embodiment of the inventive concept, while the exposed portions of the supporter pattern 418A are removed by wet etching, portions of the plurality of first storage nodes 452 and the plurality of lower second storage nodes 454, which are adjacent to the supporter pattern 418A, may not be removed and remain. According to an embodiment, the plurality of first storage nodes 452 and plurality of lower second storage nodes 454 do not have a stepped upper surface.

In an embodiment of the inventive concept, the remaining first mask pattern 468 and protective layer 466 may be removed by using an ashing process and a stripping process.

Figure 18A:
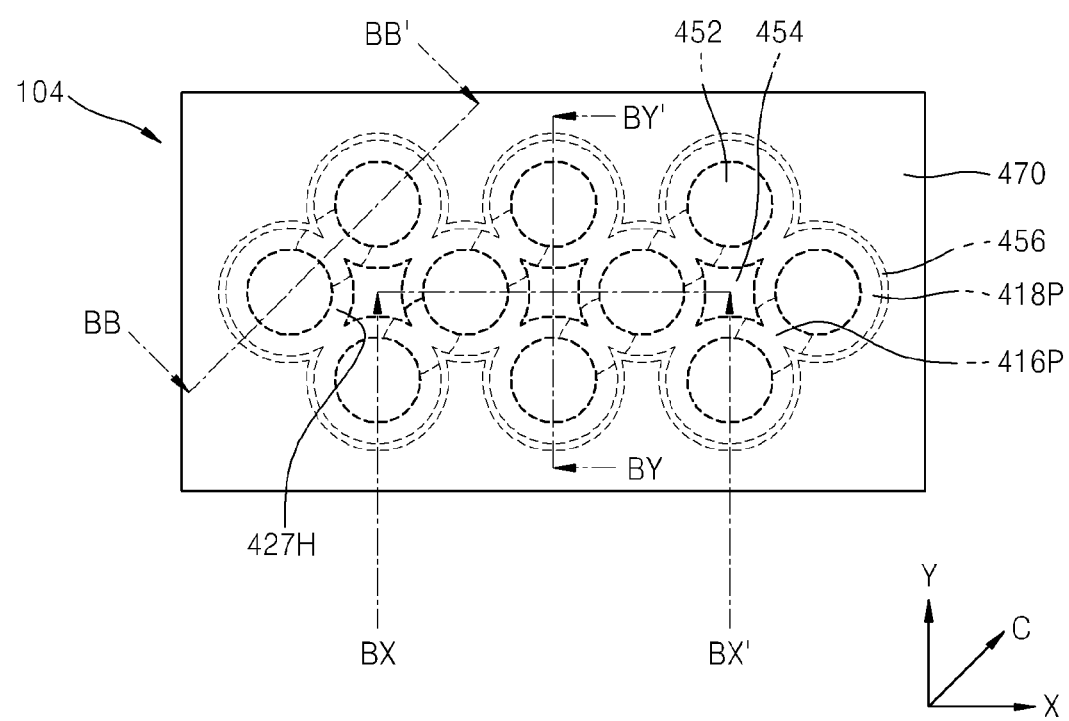
Figure 18B:
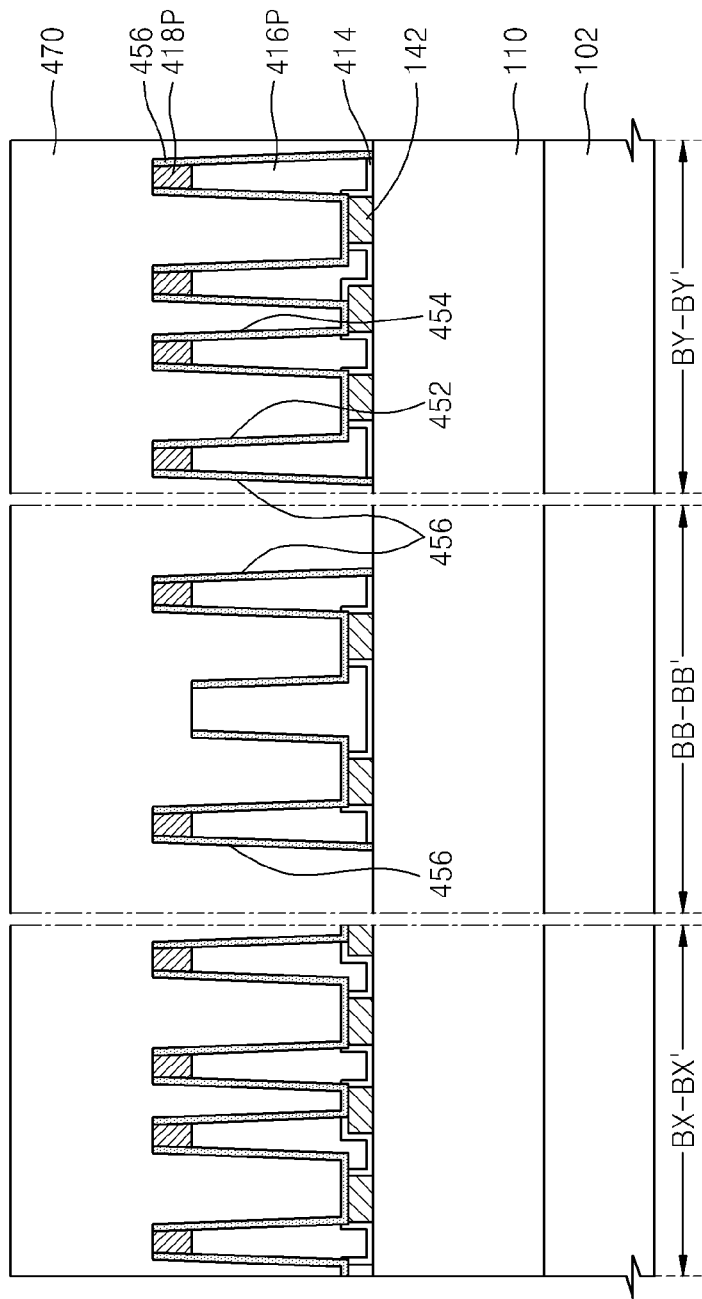

Referring to FIGS. 18A and 18B, a second mold layer 470 is formed by depositing an insulating material on the resultant structure on which the supporter 418P is formed.

The second mold layer 470 is formed to have an appropriate thickness to completely cover the plurality of first storage nodes 452, the plurality of lower second storage nodes 454, and the supporter 418P. For example, the second mold layer 470 may be formed to a thickness of about 4,000 Å to about 9,000 Å. The second mold layer 470 may have a flat upper surface.

In an embodiment of the inventive concept, the second mold layer 470 may be formed of a material used to form the first mold layer 416 (see FIG. 8B). For example, the second mold layer 470 may be formed of a silicon oxide layer.

In an embodiment of the inventive concept, when the second mold layer 470 is formed, the inside of the plurality of first storage nodes 452 and the inside of the plurality of lower second storage nodes 454 may be incompletely filled with an insulating material for forming the second mold layer 470, since the plurality of first storage nodes 452 and the plurality of lower second storage nodes 454 having a relatively high aspect ratio each have a narrow and deep inner structure. Thus, the insulating material for forming the second mold layer 470 and voids (not shown) may be present together in the plurality of first storage nodes 452 and in the plurality of lower second storage nodes 454.

Figure 19A:
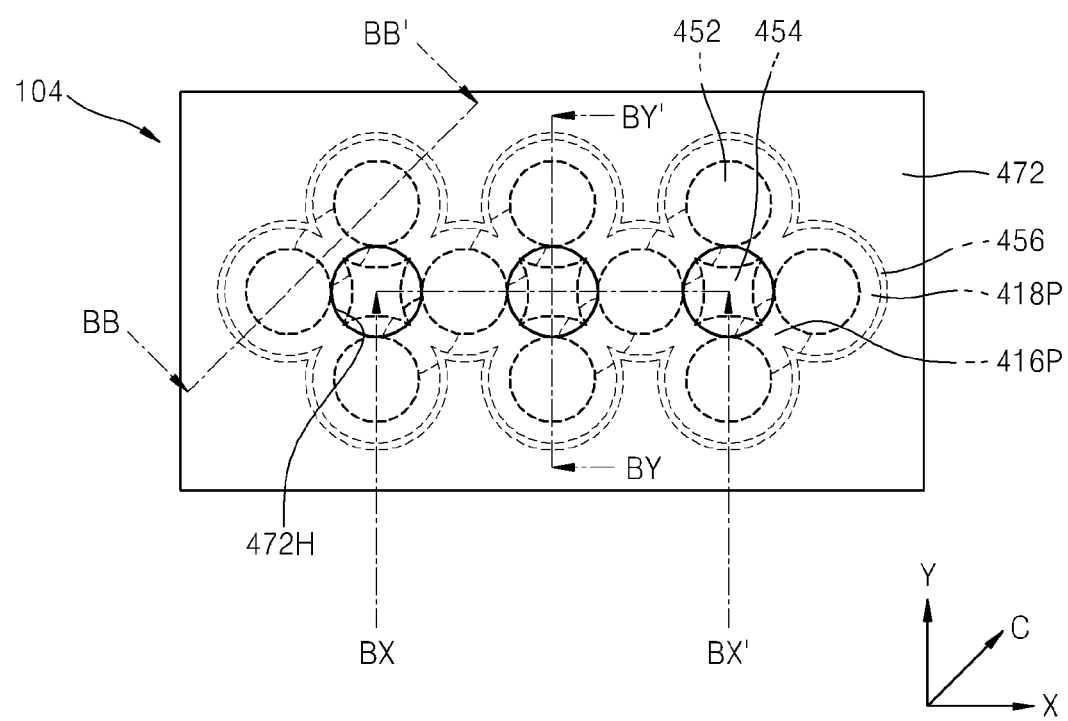
Figure 19B:
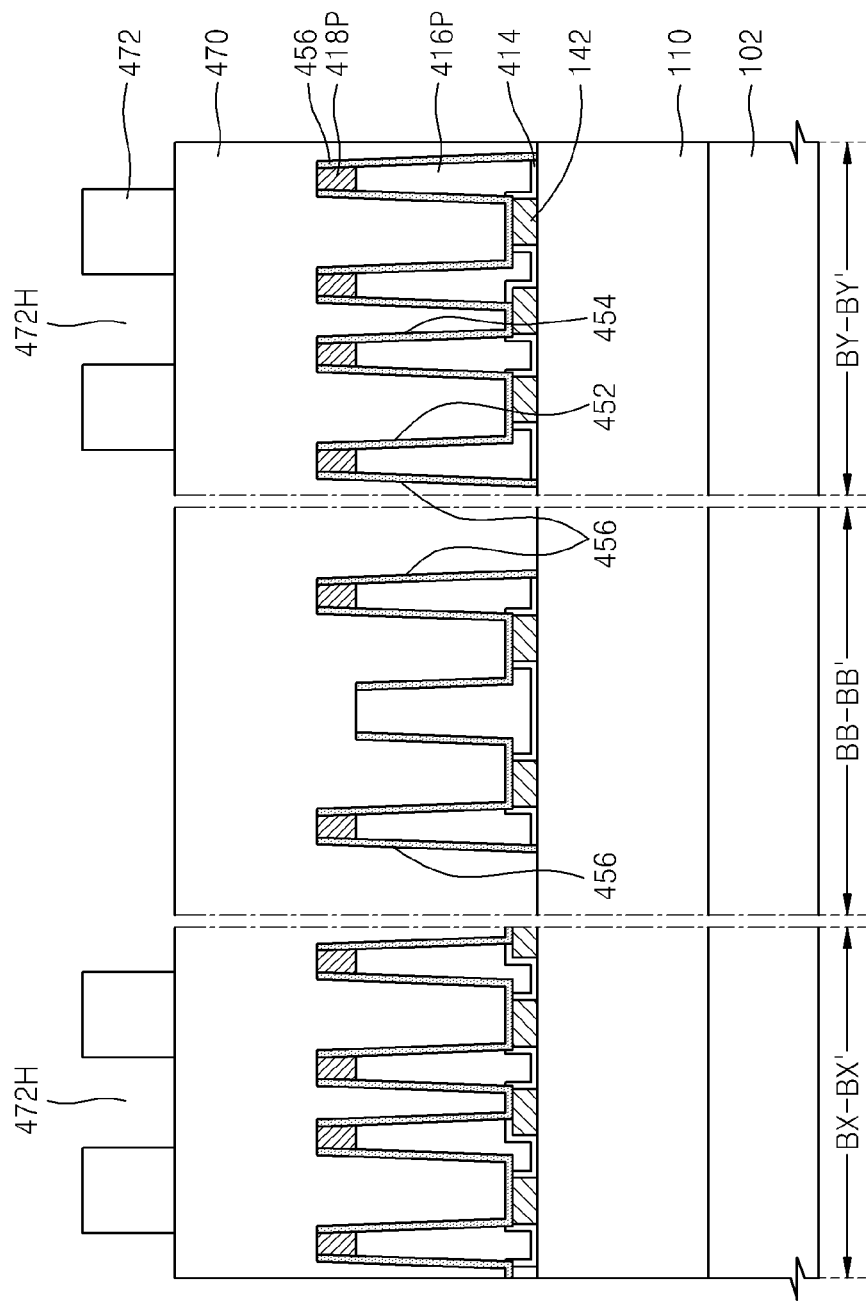

Referring to FIGS. 19A and 19B, a second mask pattern 472 that partially exposes the second mold layer 470 is formed on the second mold layer 470.

In an embodiment of the inventive concept, the second mask pattern 472 is formed of a photoresist film. In the second mask pattern 472, a plurality of fourth holes 472H are formed to partially expose an upper surface of the second mold layer 470. The plurality of fourth holes 472H are arranged at locations to overlap at least parts of the lower second storage node 454 above the plurality of lower second storage nodes 454 and expose portions of the second mold layer 470 covering the lower second storage node 454. FIG. 19A illustrates that each of the plurality of fourth holes 472H has a substantially circular planar shape, but the embodiments of the inventive concept are not limited thereto. According to an embodiment of the inventive concept, a plurality of holes may be formed in any of various shapes in the second mask pattern 472.

Figure 20A:
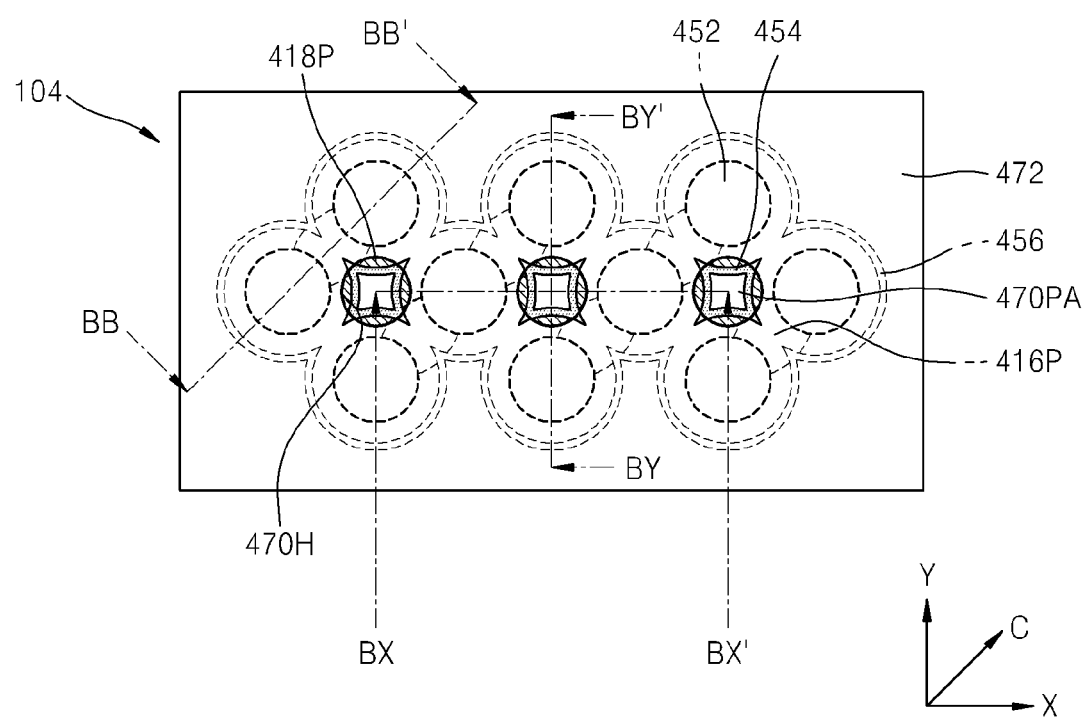
Figure 20B:
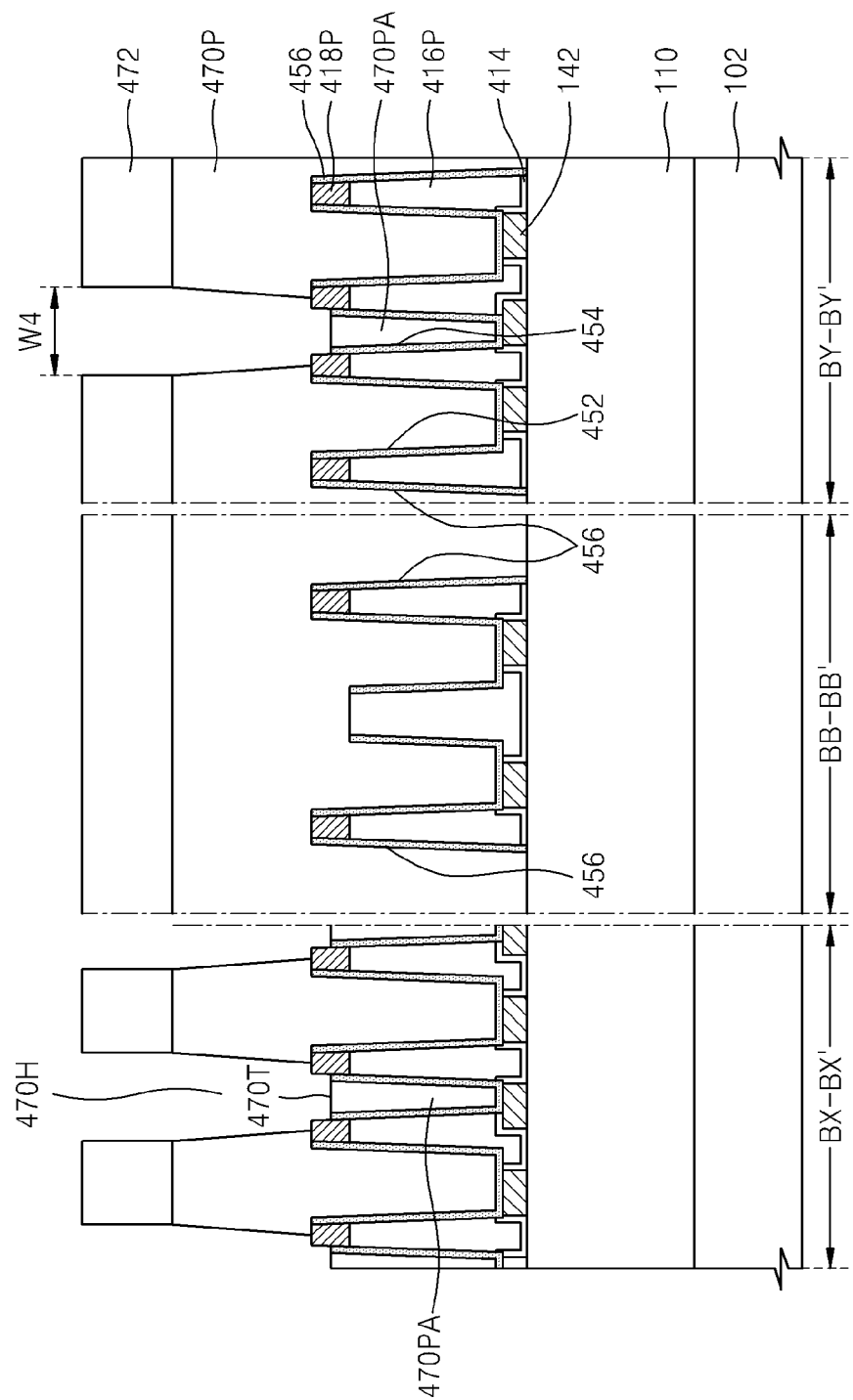

Referring to FIGS. 20A and 20B, the second mold layer 470 is etched using the second mask pattern 472 as an etch mask to form a second mold pattern 470P with a plurality of blind holes 470H that expose the lower second storage nodes 454.

The plurality of blind holes 470H each have an entrance having a fourth width W4 in the X-axis direction. The lower second storage nodes 454 are exposed via bottom surfaces of the plurality of blind holes 470H.

While the second mold layer 470 is etched to form the plurality of blind holes 470H, portions of the lower second storage nodes 454 and the supporter 418P may be consumed.

Portions of the second mold pattern 470P filling the insides of the plurality of lower second storage nodes 454 form a plurality of insulating pillars 470PA. Referring to FIG. 20B, the plurality of insulating pillars 470PA each have a substantially flat upper surface 470T. Thus, the plurality of blind holes 470H each have a flat bottom profile according to the outlines of the upper surfaces 470T. However, the embodiments of the inventive concept are not limited thereto, and a plurality of blind holes may be formed to each have a bottom surface profile in any of various shapes.

In an embodiment of the inventive concept, after the second mold pattern 470P is formed, the insides of the plurality of blind holes 470H and a surface of the semiconductor substrate 102 may be cleaned by a wet cleaning process. In an embodiment, the portions of the second mold pattern 470P exposed via the bottom surfaces of the plurality of blind holes 470H may be partially consumed by a chemical solution used during the wet cleaning process.

Figure 26A:
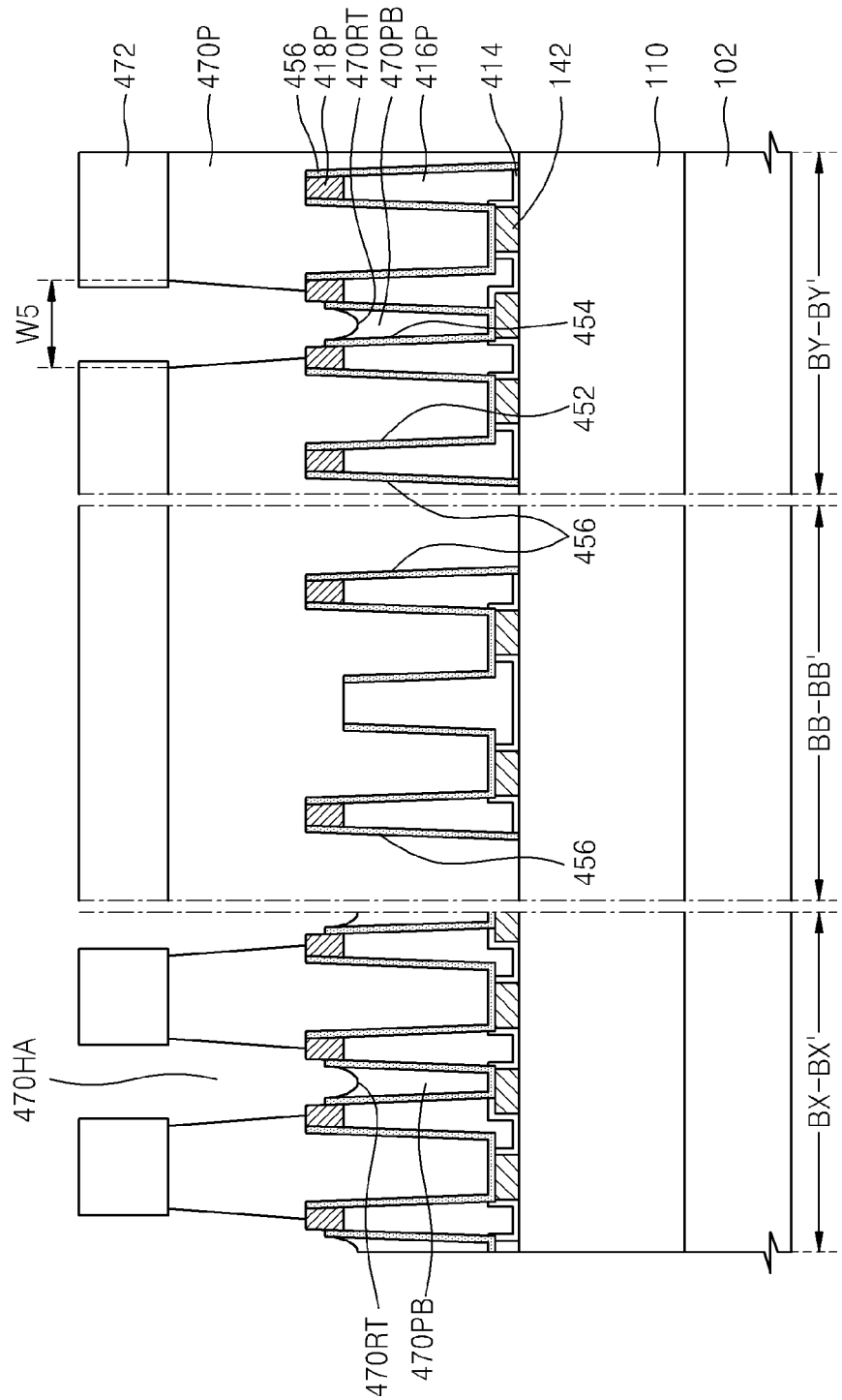
FIG. 26A is a cross-sectional view illustrating a method of forming a plurality of blind holes in a second mold pattern during manufacture of a semiconductor device according to an embodiment of the inventive concept.
Figure 26B:
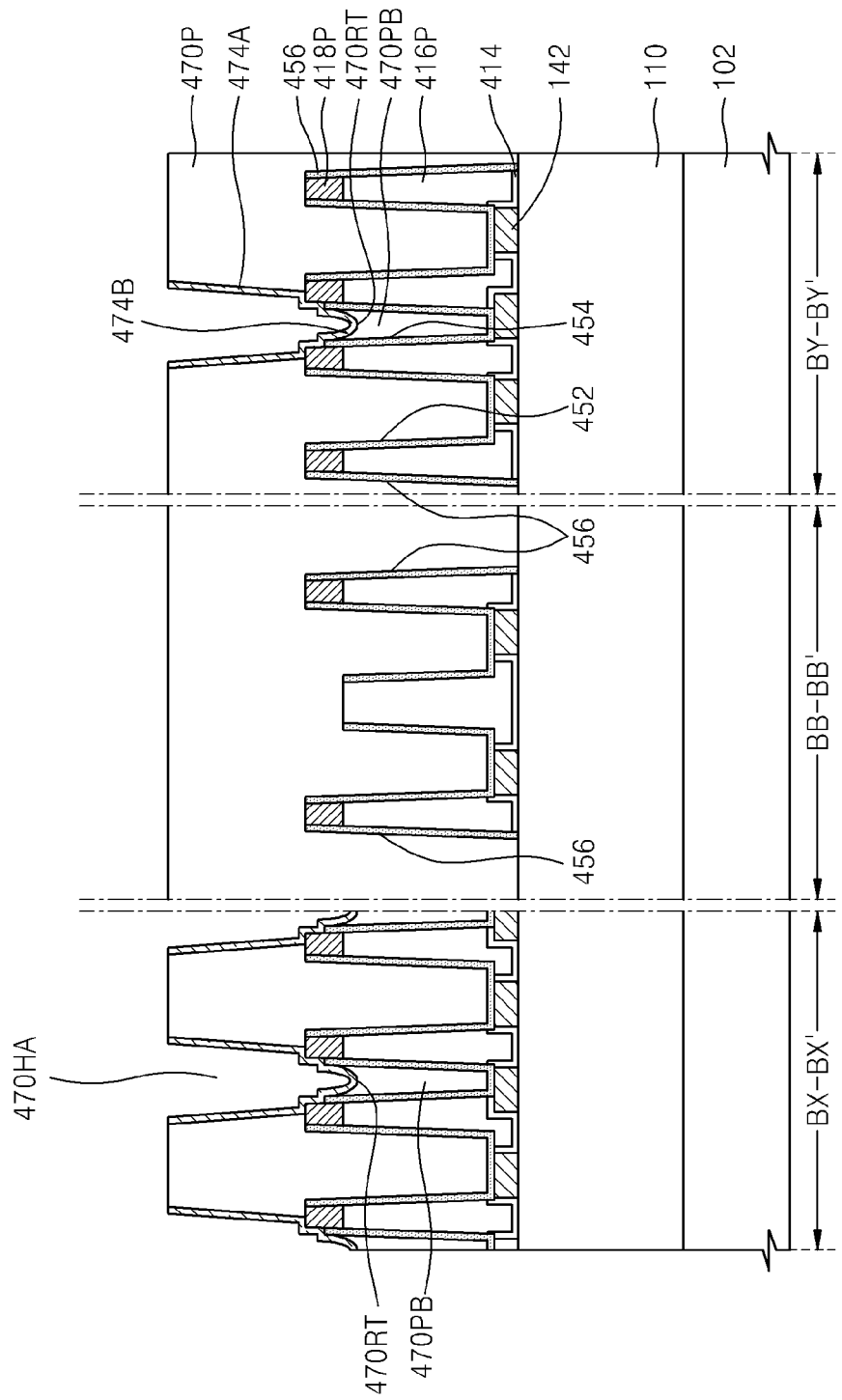
FIG. 26B is a cross-sectional view illustrating a method of forming upper second storage nodes in the plurality of blind holes of FIG. 26A according to an embodiment of the inventive concept.

FIG. 26A is a cross-sectional view illustrating portions of the second mold pattern 470P exposed via bottom surfaces and sidewalls of the plurality of blind holes 470H, which are partially consumed by the chemical solution when the resultant structure illustrated in FIGS. 20A and 20B is wet cleaned according to an embodiment of the inventive concept. Referring to FIG. 26A, the bottom surfaces and sidewalls of the plurality of blind holes 470H are consumed by the chemical solution to form a plurality of blind holes 470HA with expanded inner spaces from the plurality of blind holes 470H. After the plurality of blind holes 470HA are formed, the upper surface profiles of the plurality of insulating pillars 470PA are changed to form a plurality of insulating pillars 470PB each having a concavely recessed upper surface 470RT, when viewed from a top-down view. The plurality of blind holes 470HA each have an entrance having a fifth width W5 that is wider than the fourth width W4 in the X-axis direction. The plurality of blind holes 470HA each have a concavely recessed bottom surface profile according to the outlines of the upper surfaces 470RT.

A case where a subsequent process is performed on the plurality of blind holes 470H each having a flat bottom surface profile illustrated in FIG. 20B will be described below.

Figure 21A:
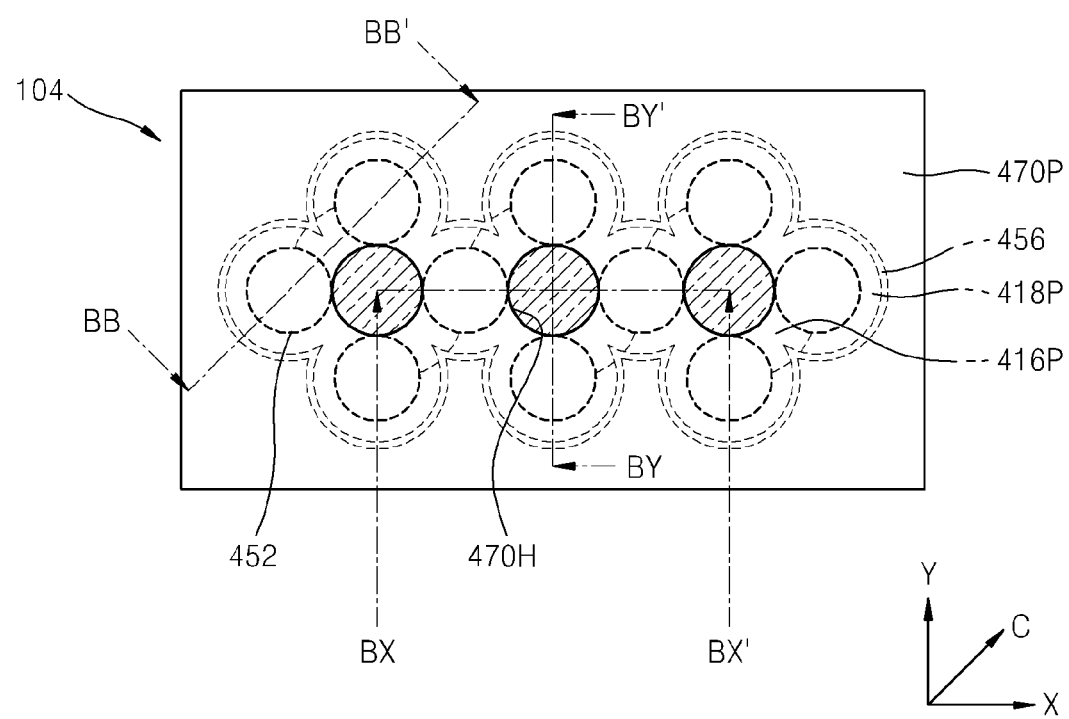
Figure 21B:
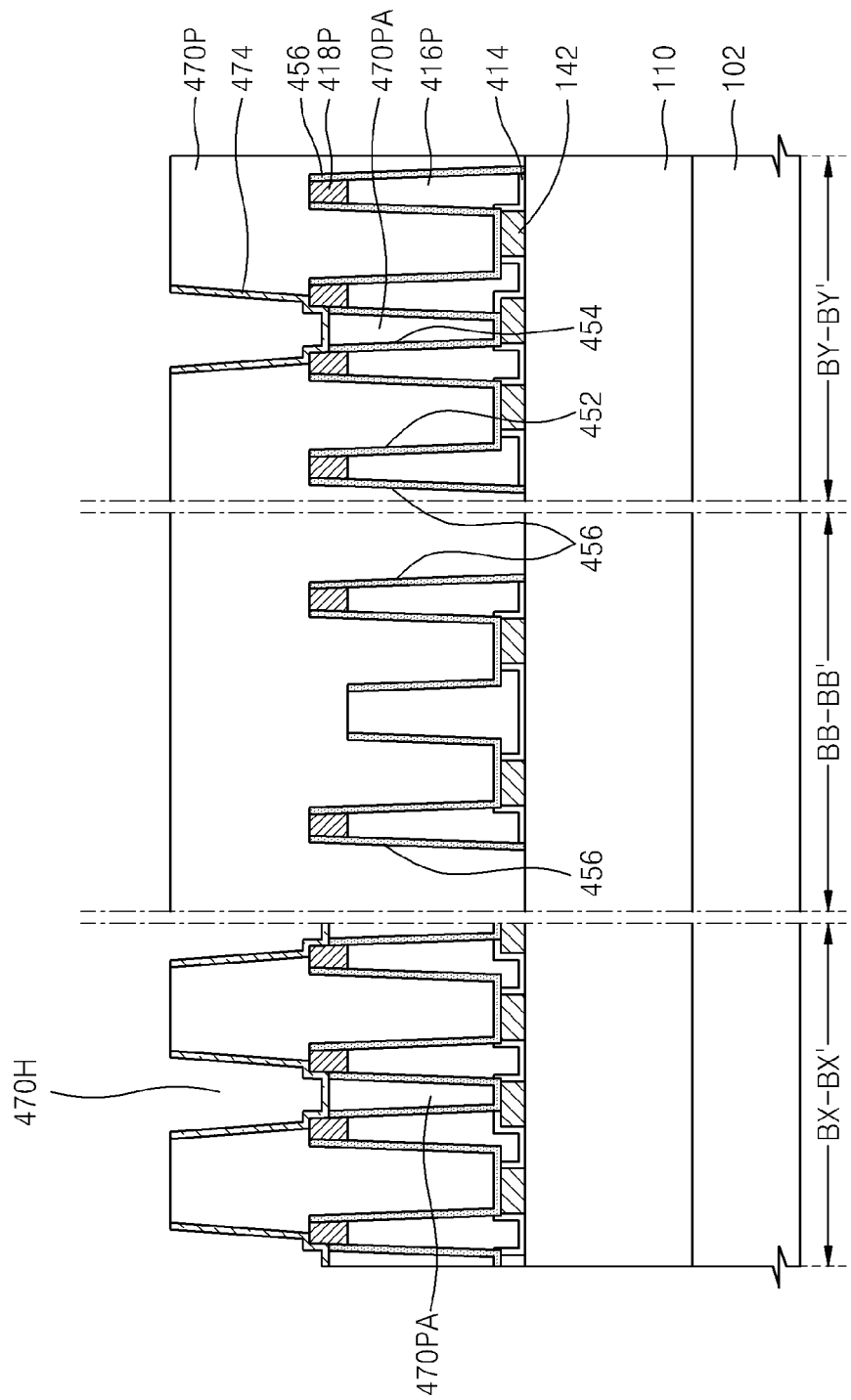

Referring to FIGS. 21A and 21B, the second mask pattern 472 is removed from the resultant structure illustrated in FIGS. 20A and 20B to entirely expose the upper surface of the second mold pattern 470P, and a plurality of upper second storage nodes 474 are formed in the plurality of blind holes 470H.

The plurality of upper second storage nodes 474 contact the plurality of lower second storage nodes 454 via the bottom surfaces of the plurality of blind holes 470H, respectively.

In an embodiment of the inventive concept, inner sidewalls and bottom surfaces of the plurality of blind holes 470H are evenly covered by the plurality of upper second storage nodes 474. In an embodiment of the inventive concept, the plurality of upper second storage nodes 474 may be formed of a metal-containing film. For example, the plurality of upper second storage nodes 474 may be formed of at least, one material selected from the group consisting of TiN, Ti, TaN, and Ta. The plurality of upper second storage nodes 474 may be formed to a thickness of about 5 to about 10 nm, but the embodiments of the inventive concept are not limited thereto.

In an embodiment of the inventive concept, to form the plurality of upper second storage nodes 474, a second conductive layer (not shown) is formed to cover the inner sidewalls and bottom surfaces of the plurality of blind holes 470H and the upper surface of the second mold pattern 470P. The second conductive layer may be formed by ALD, CVD, or PVD. Then, the second conductive layer is etched to remove a portion of the second conductive layer covering the upper surface of the second mold pattern 470P, thereby dividing the second conductive layer into the plurality of upper second storage nodes 474. In an embodiment of the inventive concept, the second conductive layer is etched by RIE to remove the portion of the second conductive layer covering the upper surface of the second mold pattern 470P. Since the plurality of blind holes 470H formed in the second mold pattern 470P each have a relatively narrow inner width and a relatively large aspect ratio, while the second conductive layer is etched until the portion of the second conductive layer covering the upper surface of the second mold pattern 470P is removed, reactive ions generated from an etch gas do not arrive around the bottom surfaces of the plurality of blind holes 470H. Thus, portions of the second conductive layer that respectively contact the plurality of lower second storage nodes 454 via the bottom surfaces of the plurality of blind holes 470H are not removed and thus remain. Accordingly, in the second mold pattern 470P, the plurality of insulating pillars 470PA present in the plurality of lower second storage nodes 454 are entirely wrapped by the plurality of lower second storage nodes 454 and the plurality of upper second storage nodes 474.

The plurality of upper second storage nodes 474 are formed on the inner walls of the plurality of blind holes 470H, and each have a cylindrical structure including outwardly convex sidewalls.

In an embodiment of the inventive concept, when insulating pillars 470PA filling the insides of the lower second storage nodes 454 are formed to have concavely recessed upper surfaces 470RT, when viewed from a top-down view, as described above with reference to FIG. 24A, then upper second storage nodes 474A formed on the recessed upper surfaces 470RT also have concavely recessed bottom surfaces 474B according to the outline of the upper surfaces 470RT as illustrated in FIG. 24B.

Figure 22A:
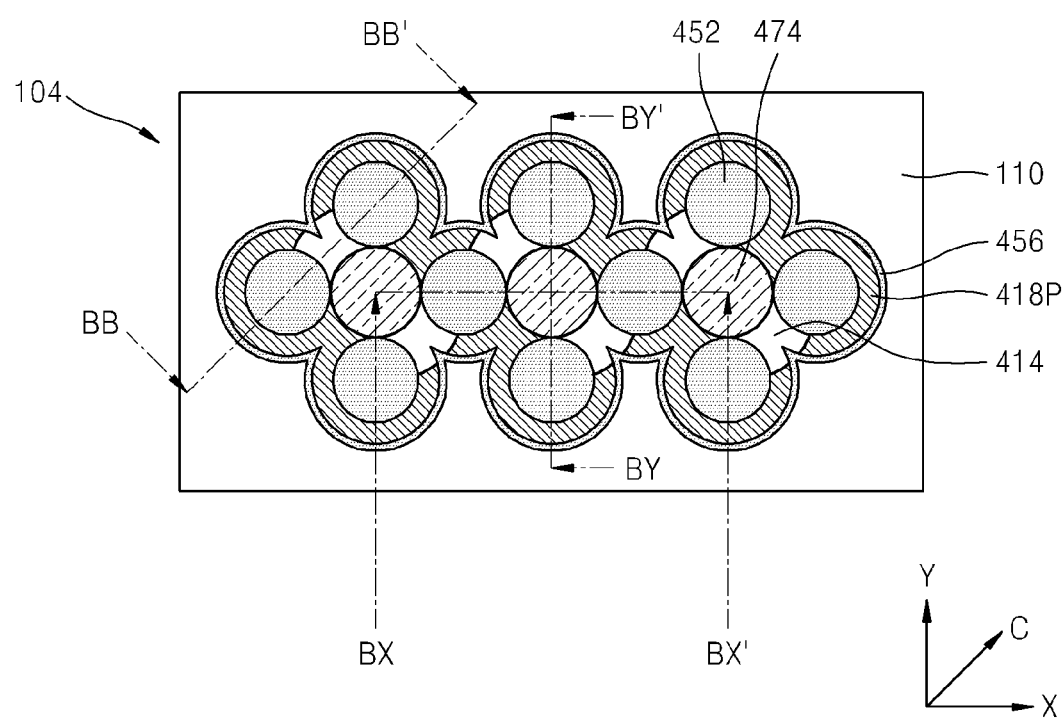
Figure 22B:
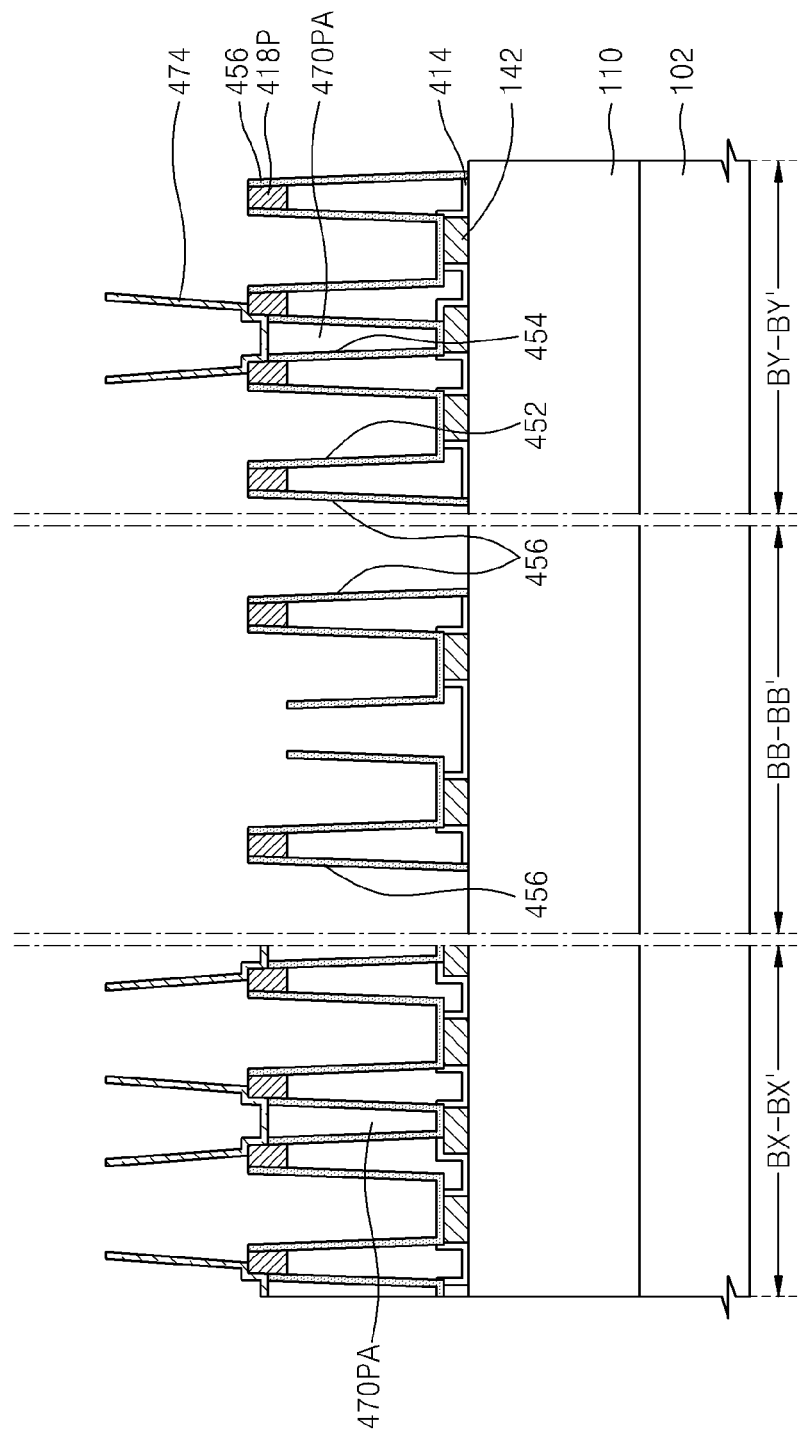

Referring to FIGS. 22A and 22B, the second mold pattern 470P is removed from the resultant structure illustrated in FIGS. 21A and 21B to expose inner and outer sidewalls of the plurality of first storage nodes 452, outer sidewalls of the plurality of lower second storage nodes 454, and inner and outer sidewalls of the plurality of upper second storage nodes 474.

In an embodiment of the inventive concept, the second mold pattern 470P may be removed by wet etching. By removing the second mold pattern 470P, two sidewalls of the dummy conductive pattern 456 are exposed. However, the plurality of insulating pillars 470PA of the second mold pattern 470P, which are entirely wrapped by the plurality of lower second storage nodes 454 and the plurality of upper second storage nodes 474, are not removed, and remain in the plurality of lower second storage nodes 454.

Figure 23A:
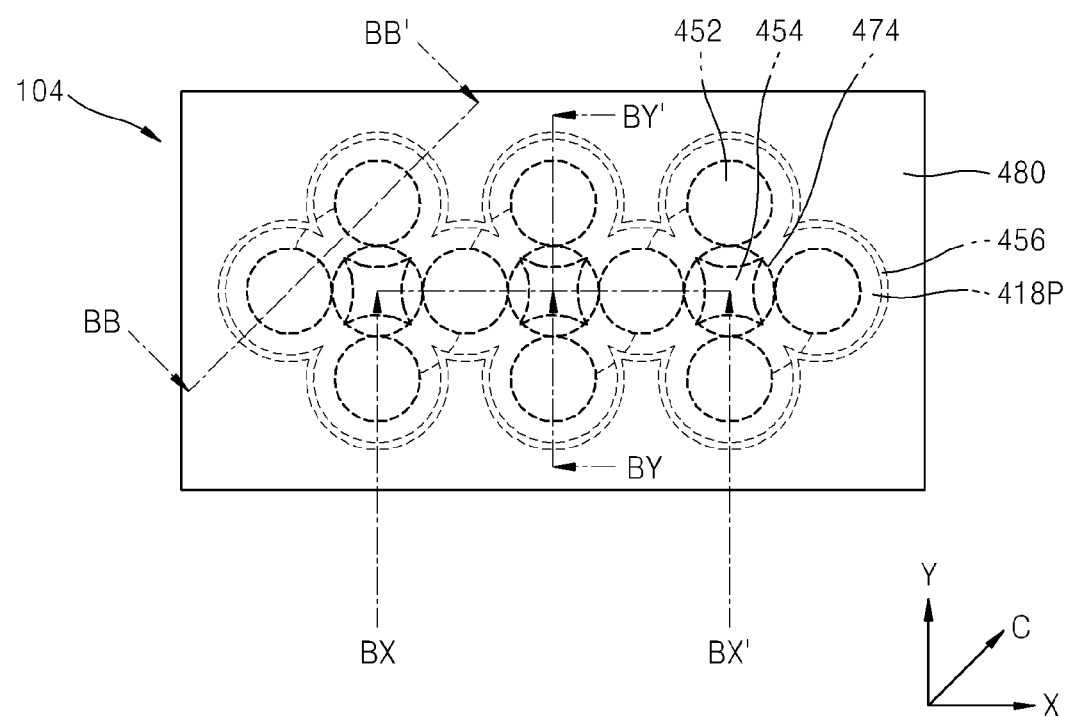
Figure 23B:
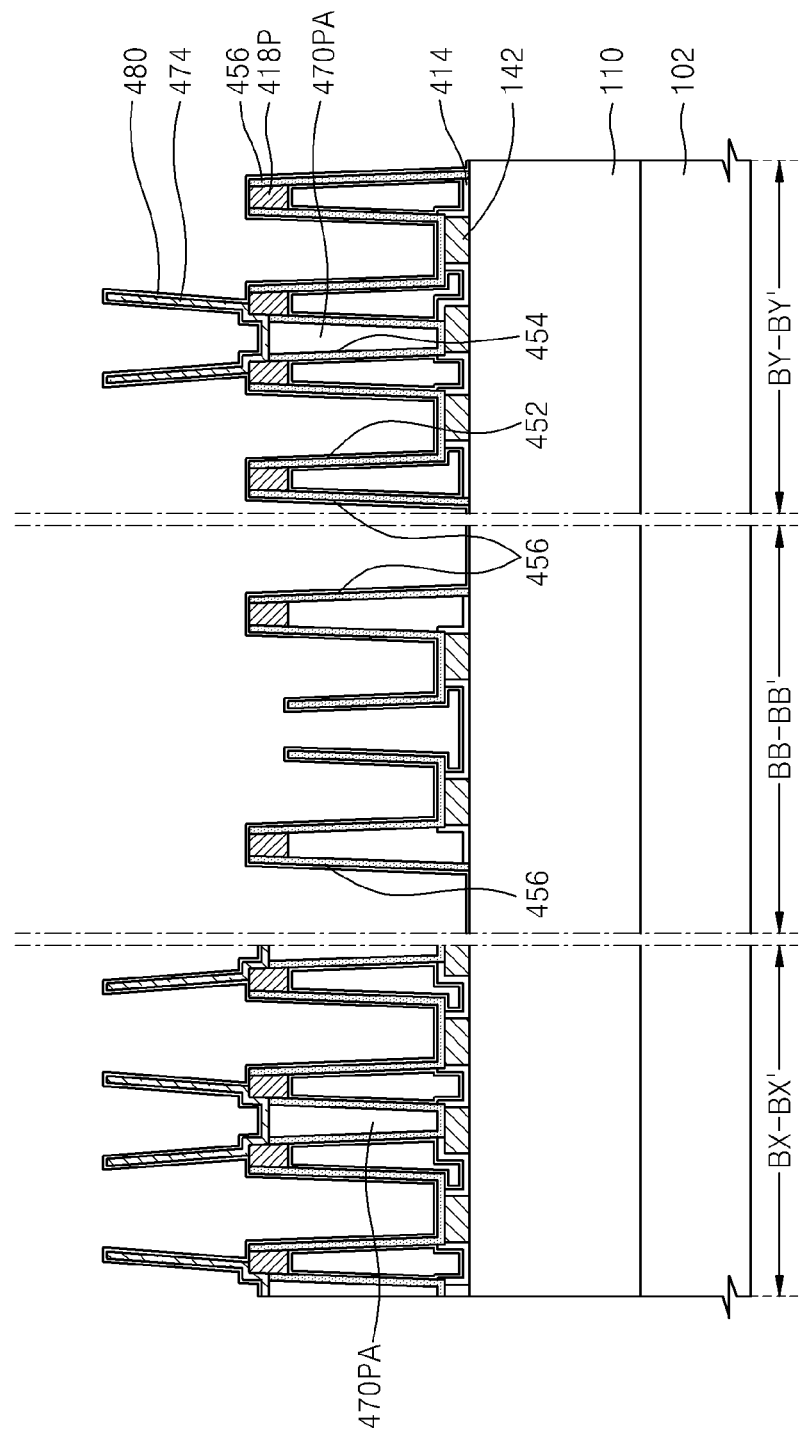

Referring to FIGS. 23A and 23B, a dielectric film 480 is formed to cover the exposed inner and outer sidewalls of the plurality of first storage nodes 452, the exposed outer sidewalls of the plurality of lower second storage nodes 454, and the exposed inner and outer sidewalls of the plurality of upper second storage nodes 474.

In an embodiment of the inventive concept, the dielectric film 480 is formed of a high k-dielectric film having a higher dielectric constant than a silicon oxide. The dielectric film 480 may be formed of at least one of a zirconium oxide film, a zirconium oxy nitride film, an aluminum oxide film, a hafnium oxide film, and a tantalum oxide film. For example, the dielectric film 480 may have a three-layered structure including a zirconium oxide film, an aluminum oxide film, and a zirconium oxide film. The dielectric film 480 may be formed by ALD or CVD. The dielectric film 480 may be formed to a thickness of about 30 Å to about 100 Å.

Figure 24A:
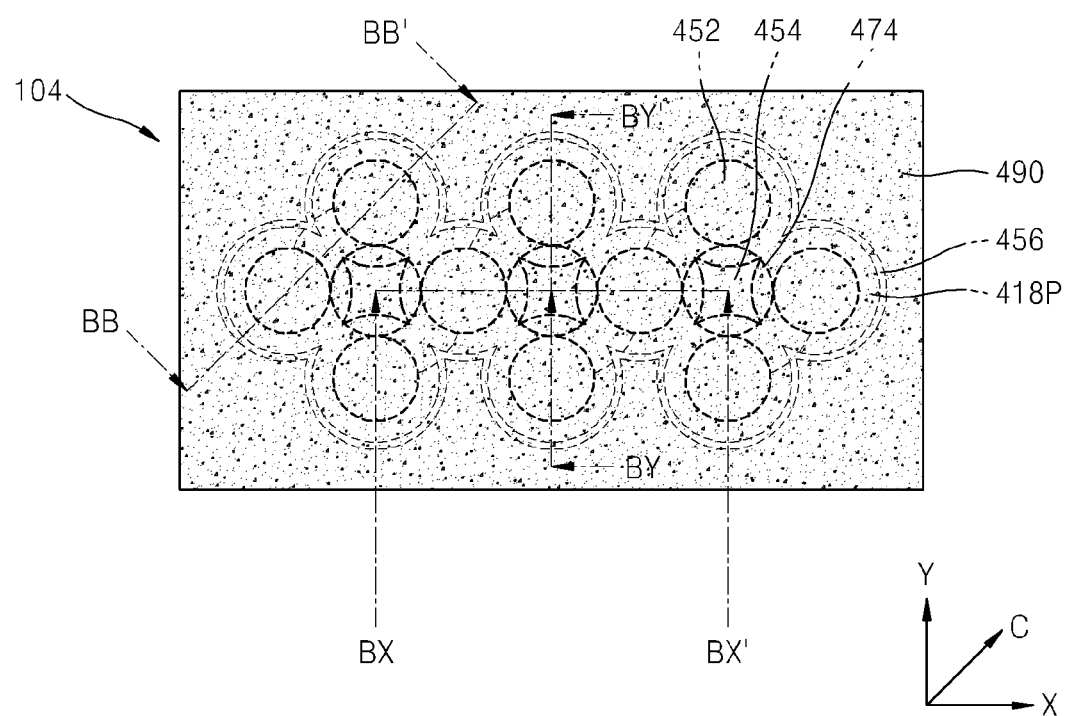
Figure 24B:
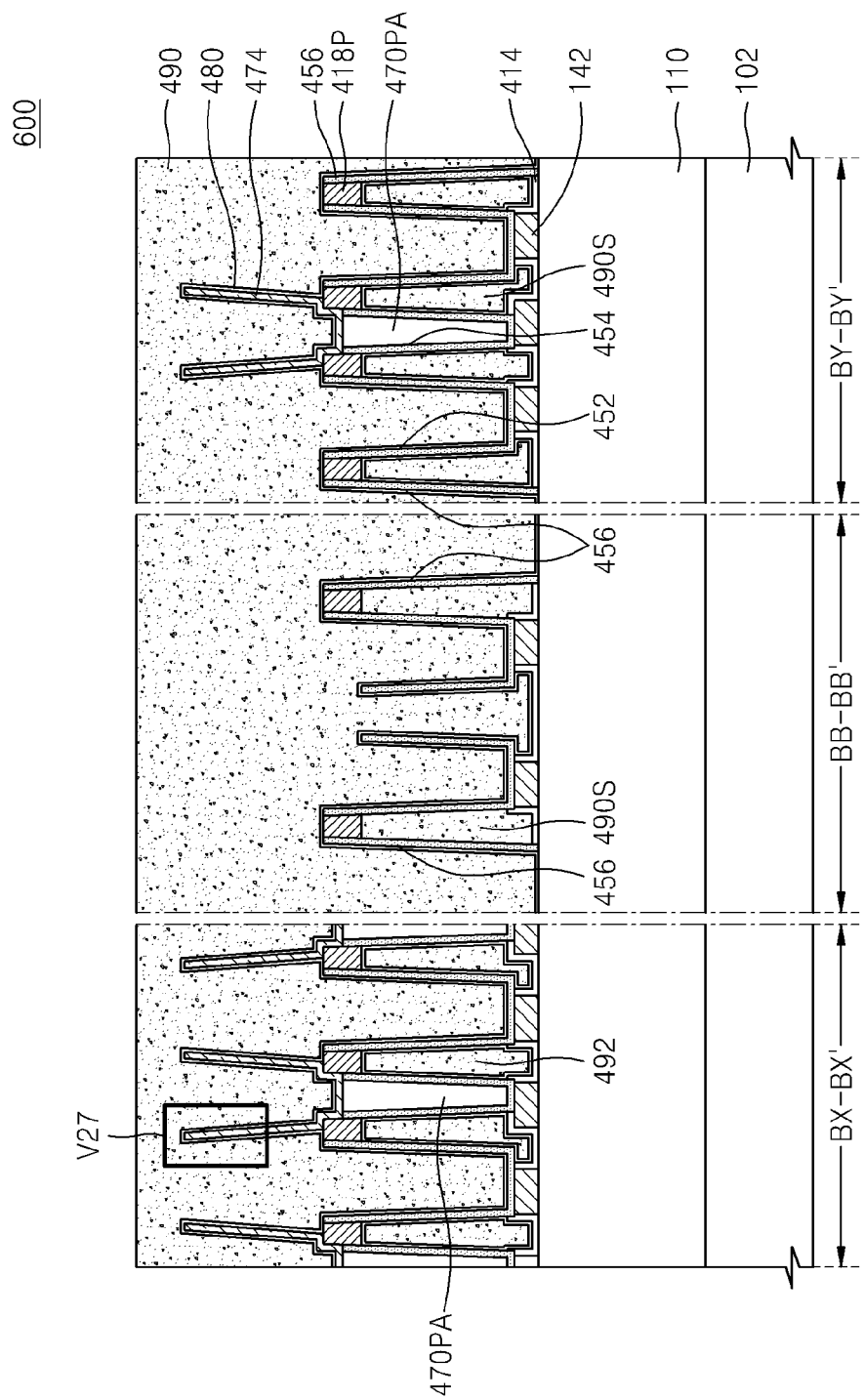

Referring to FIGS. 24A and 24B, a plate electrode 490 is formed on the dielectric film 480.

The plate electrode 490 is formed to face the inner and outer sidewalls of the plurality of first storage nodes 452, the outer sidewalls of the plurality of lower second storage nodes 454, and the inner and outer sidewalls of the plurality of upper second storage nodes 474, in which the dielectric film 480 is disposed between the plate electrode 490 and these inner/outer walls. The plate electrode 490 has a planarized upper surface.

A plurality of spaces 490S each being relatively narrow and having a relatively large aspect ratio are present between the plurality of first storage nodes 452 and the plurality of lower second storage nodes 454 and between the plurality of first storage nodes 452 and the dummy conductive pattern 456. In an embodiment of the inventive concept, when the plate electrode 490 is formed, the plurality of spaces 490S may be partially filled with a conductive material for forming the plate electrode 490. Thus, the conductive material for forming the plate electrode 490 and voids (not shown) may be present together in the plurality of spaces 490S.

At least a part of the plate electrode 490 may include metal, and at least another part of the plate electrode 490 may include an impurity-doped conductive semiconductor layer. In an embodiment of the inventive concept, the plate electrode 490 may have a multi-layered structure in which different conductive layers are sequentially stacked.

Figure 27:
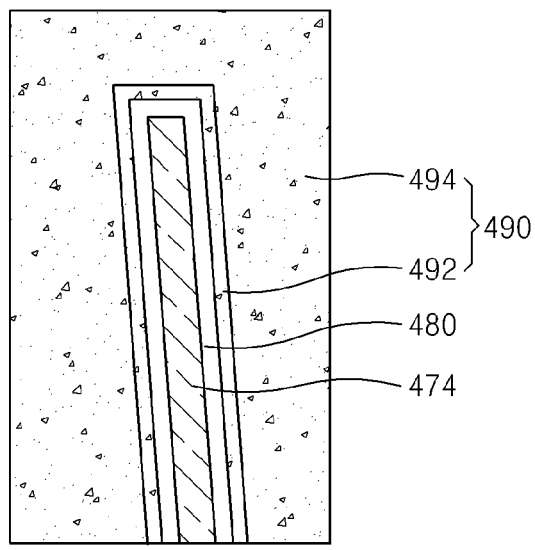
FIG. 27 is a diagram illustrating a rectangular region marked by 'V27' in FIG. 24B according to an embodiment of the inventive concept.

FIG. 27 is a diagram illustrating a rectangular region marked by 'V27' in FIG. 24B according to an embodiment of the inventive concept. Referring to FIG. 27, the plate electrode 490 is formed of metal or a metal nitride, and includes a first plate electrode layer 492 contacting the dielectric film 480 and a second plate electrode layer 494 covering the first plate electrode layer 492. The first plate electrode layer 492 may be formed of at least material of TiN, Ti, TaN, and Ta. The second plate electrode layer 494 may be formed of an impurity-doped SiGe layer.

Figure 28A:
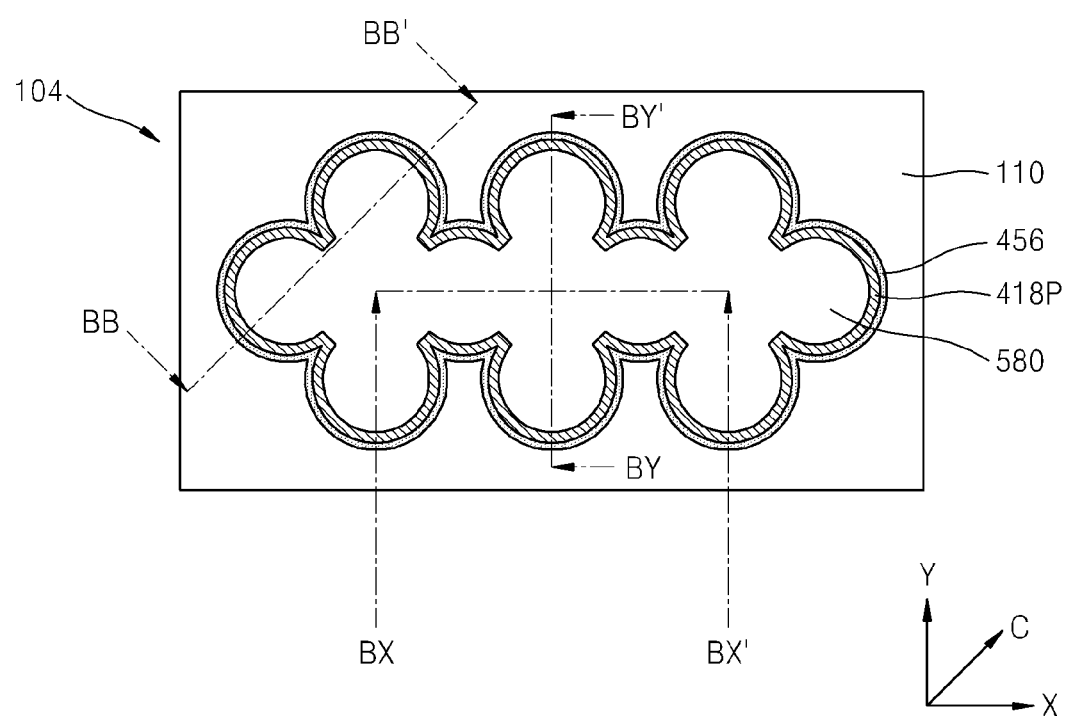
FIGS. 28A to 29B are plan and cross-sectional views sequentially illustrating a method of manufacturing a semiconductor device according to an embodiment of the inventive concept.
Figure 28B:
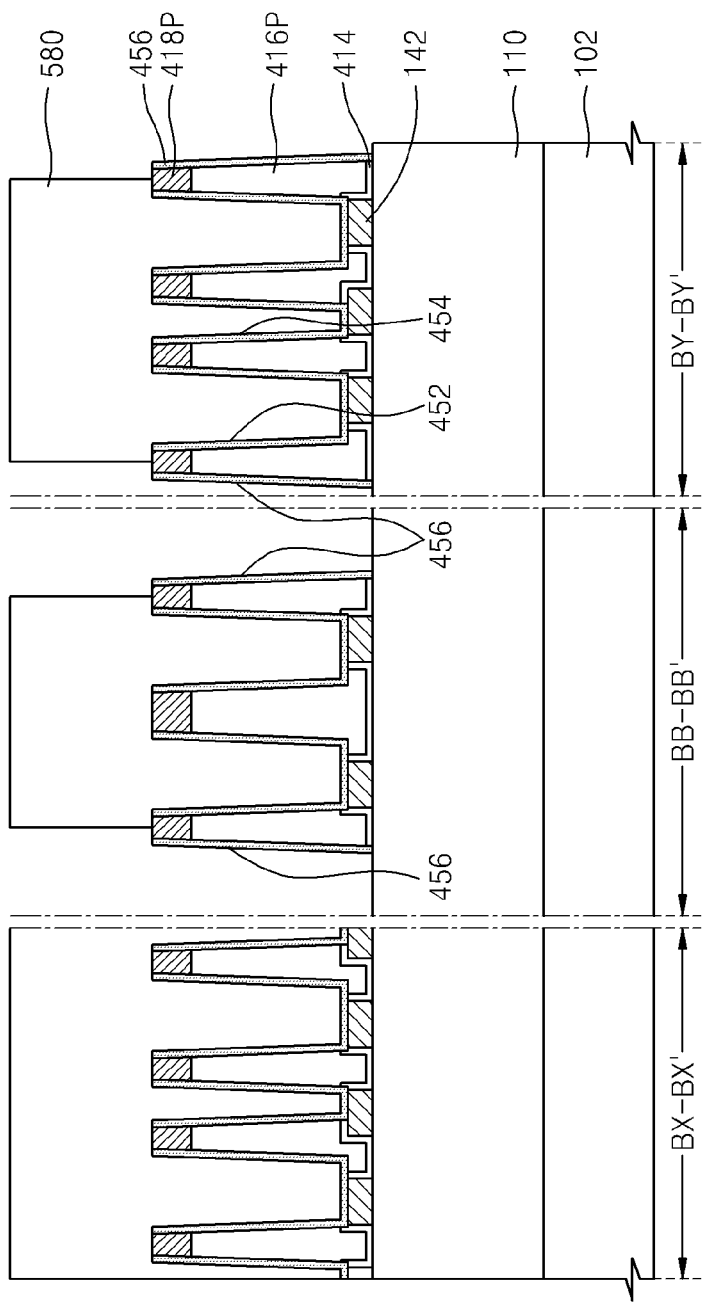
Figure 29A:
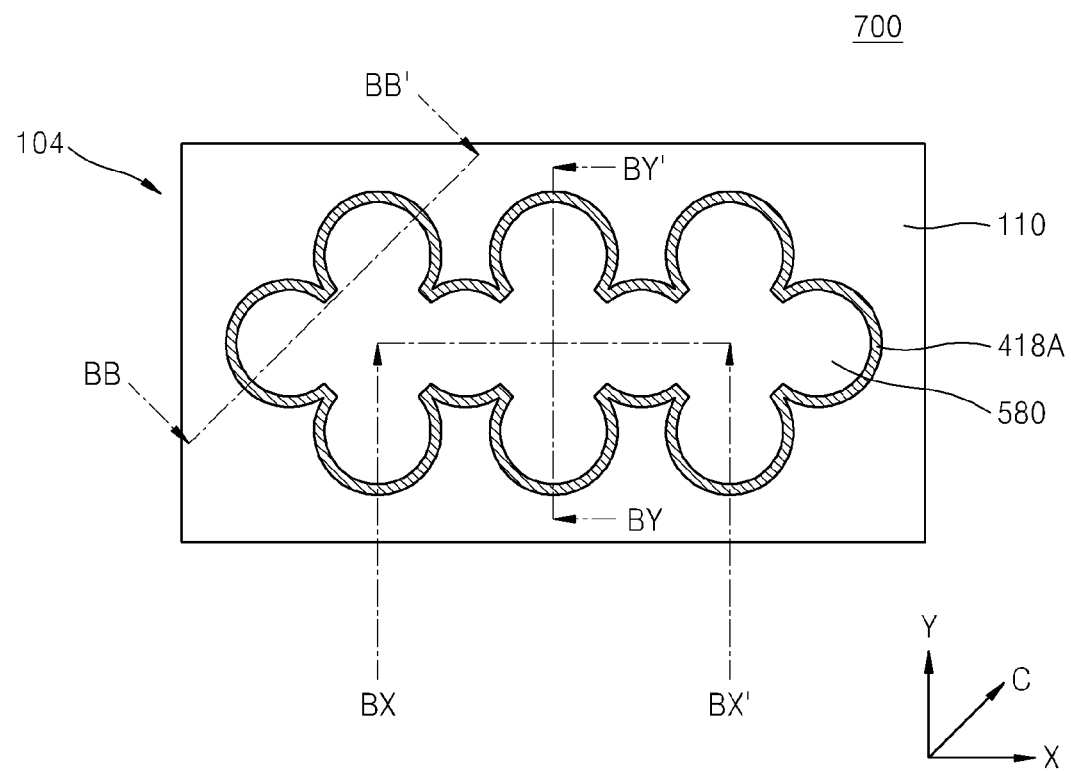
Figure 29B:
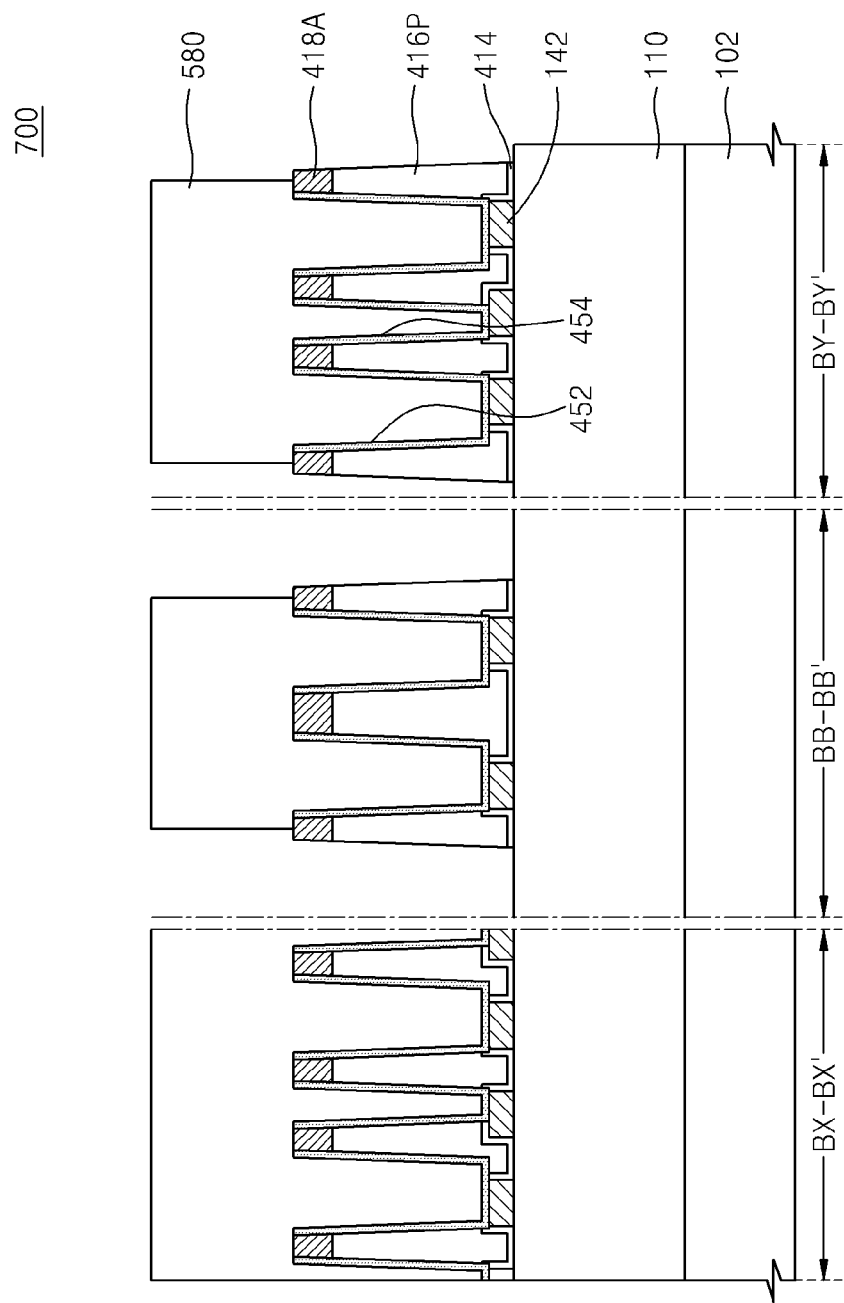

FIGS. 28A to 29B are plan and cross-sectional views sequentially illustrating a method of manufacturing a semiconductor device 700 (see FIGS. 29A and 29B) according to an embodiment of the inventive concept. Specifically, FIGS. 28A and 29A are plan views of some elements of the semiconductor device 700 manufactured according to operations included in the method of manufacturing the semiconductor device 700. FIGS. 28B and 29B are cross-sectional views taken along lines BX-BX', BB-BB' and BY-BY' of FIGS. 28A and 29A, respectively.

Referring to FIGS. 28A and 28B, a mask pattern 580 is formed to partially cover a structure on which a plurality of first storage nodes 452, a plurality of lower second storage nodes 454, and a dummy conductive pattern 456 are formed by performing the operations described above with reference to FIGS. 8A to 14B. The mask pattern 580 entirely covers the plurality of first storage nodes 452 and the plurality of lower second storage nodes 454 and entirely exposes the dummy conductive pattern 456 in a cell array region 104. In an embodiment of the inventive concept, the mask pattern 580 is formed of a photoresist pattern.

Referring to FIGS. 29A and 29B, the exposed dummy conductive pattern 456 is selectively removed by using the mask pattern 580 as an etch mask.

In an embodiment of the inventive concept, the dummy conductive pattern 456 may be selectively removed by RIE.

Then, the mask pattern 580 is removed, and the operations described above with reference to FIGS. 15A to 24B are performed on the resultant structure, thereby obtaining the semiconductor device 700 having a layout as illustrated in FIG. 5.

Figure 30A:
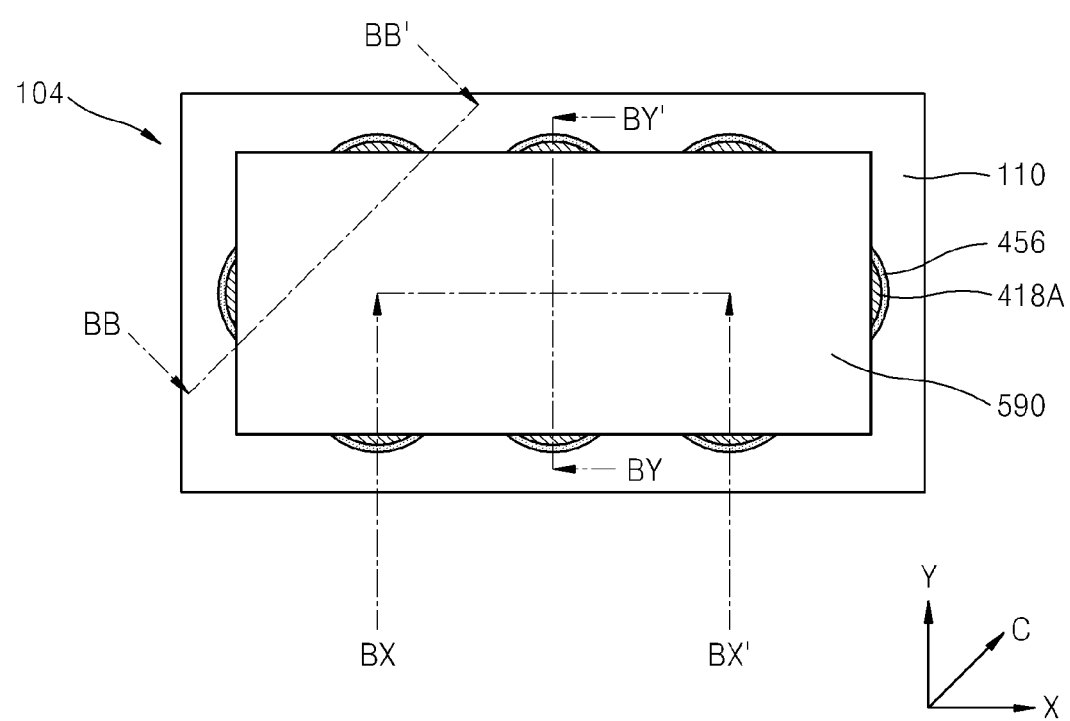
FIGS. 30A to 31B are plan and cross-sectional views sequentially illustrating a method of manufacturing a semiconductor device according to an embodiment of the inventive concept.
Figure 30B:
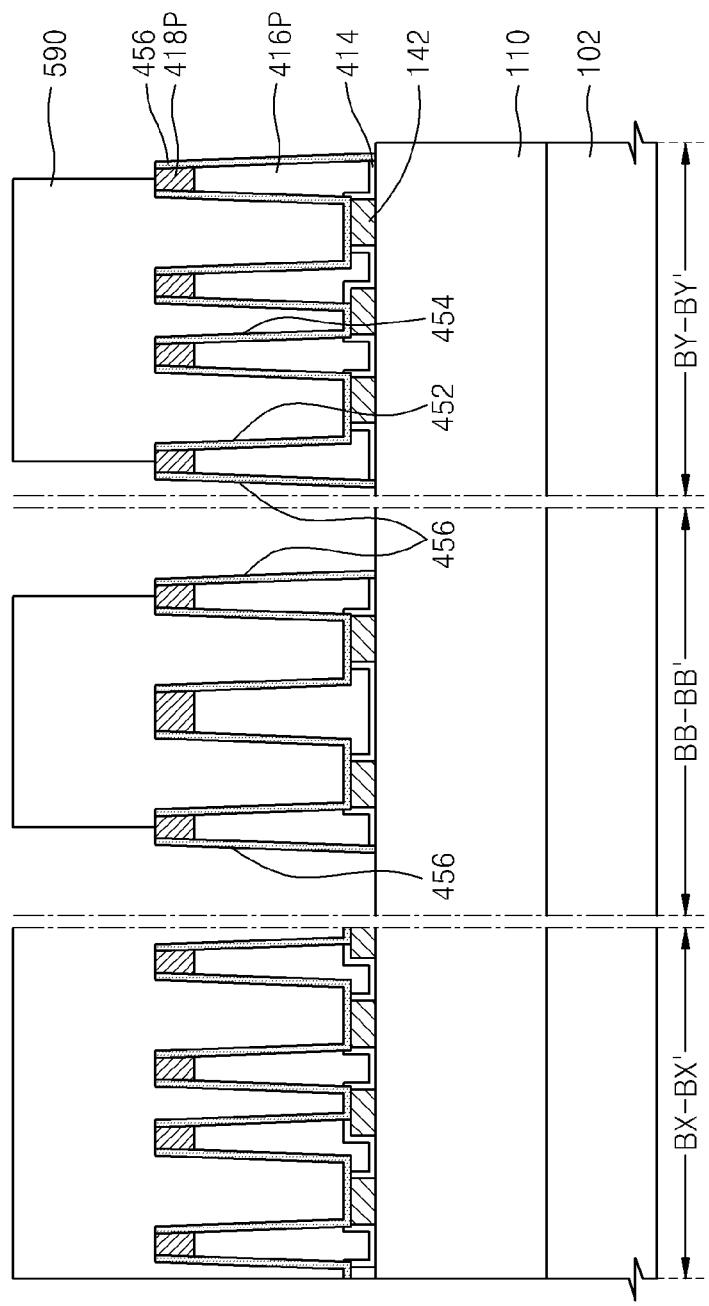
Figure 31A:
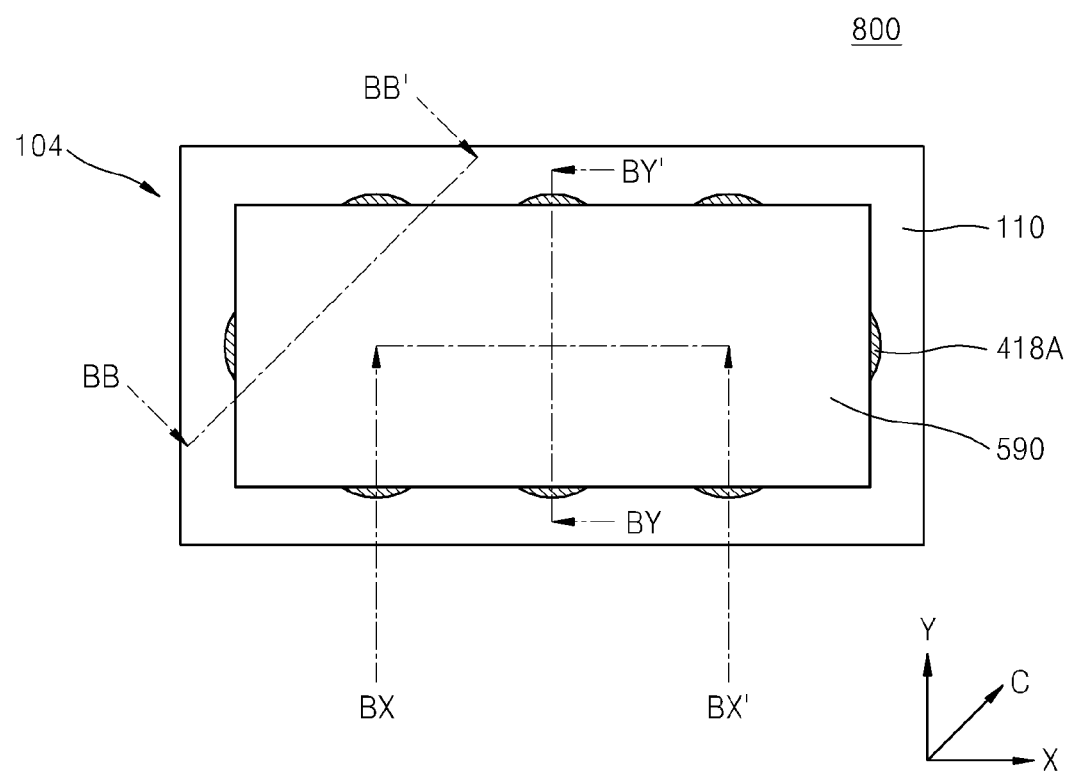
Figure 31B:
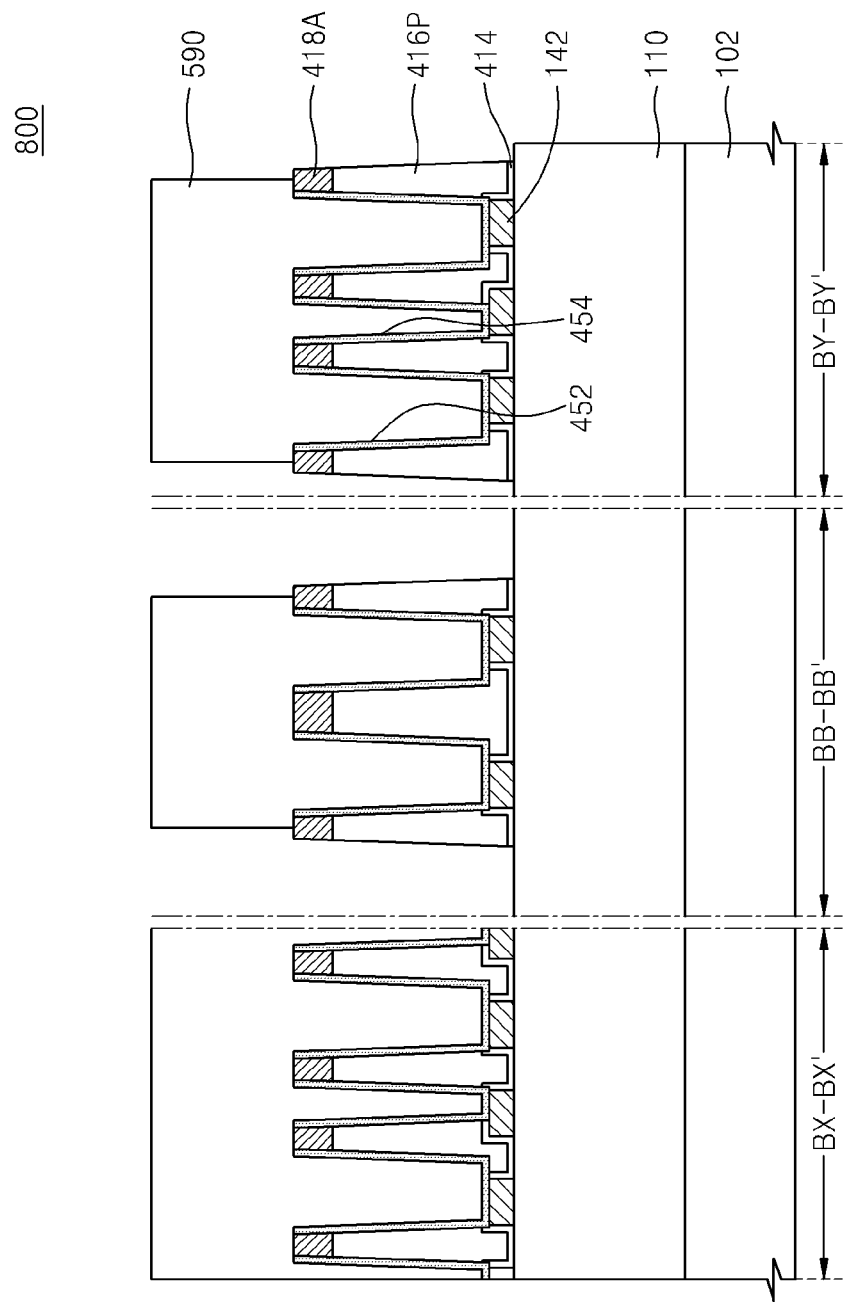

FIGS. 30A to 31B are plan and cross-sectional views sequentially illustrating a method of manufacturing a semiconductor device 800 (see FIGS. 31A and 31B) according to an embodiment of the inventive concept. Specifically, FIGS. 30A and 31A are plan views of some elements of the semiconductor device 800 manufactured according to operations included in the method of manufacturing the semiconductor device 800. FIGS. 30B and 31B are cross-sectional views taken along lines BX-BX', BB-BB', and BY-BY' of FIGS. 30A and 31A, respectively.

Referring to FIGS. 30A and 30B, a mask pattern 590 is formed to partially cover a structure on which a plurality of first storage nodes 452, a plurality of lower second storage nodes 454, and a dummy conductive pattern 456 are formed by performing the operations described above with reference to FIGS. 8A to 14B. The mask pattern 580 is formed in a rectangular shape to entirely cover the plurality of first storage nodes 452 and the plurality of lower second storage nodes 454 and partially cover the dummy conductive pattern 456 in a cell array region 104. In an embodiment of the inventive concept, the mask pattern 590 is formed of a photoresist pattern.

Referring to FIGS. 31A and 31B, an exposed region of the dummy conductive pattern 456 is selectively removed by using the mask pattern 590 as an etch mask.

In an embodiment of the inventive concept, the exposed region of the dummy conductive pattern 456 may be selectively removed by RIE.

Then, the mask pattern 590 is removed, and the operations described above with reference to FIGS. 15A to 24B are performed on the resultant structure, thereby obtaining the semiconductor device 600 having a layout as illustrated in FIG. 6.

In a method of manufacturing a semiconductor device according to one or more embodiments of the inventive concept, a plurality of capacitors are formed such that each of a plurality of first capacitors and each of a plurality of second capacitors are alternately arranged in a row direction and a column direction to form a matrix. A plurality of first storage nodes of the plurality of first capacitors and a plurality of second storage nodes of the plurality of second capacitors are formed on the same plane. The plurality of first storage nodes are formed in a limited cell array region to have a cylindrical shape having a relatively large horizontal cross-sectional area. The plurality of lower second storage nodes each having a relatively small horizontal cross-sectional area are formed in the remaining part of cell array region in which the plurality of first storage nodes are formed. In embodiments of the inventive concept, to maximize space usage in a cell array region, a plurality of first storage nodes are formed to have convex sidewalls. The plurality of first storage nodes are formed by forming spacers according to a self-alignment process. Thus, the plurality of lower second storage nodes are formed to have concave sidewalls according to the outlines of the convex sidewalls of the plurality of first storage nodes, together with the plurality of first storage nodes. Thus, it is possible to form a plurality of capacitors with a sufficient cell electrostatic capacitance in a simple manner by maximizing use of an effective area of the cell array region.

Furthermore, when the plurality of upper second storage nodes of the plurality of second capacitors are formed, the plurality of upper second storage nodes are arranged to respectively correspond to locations of the plurality of lower second storage nodes. Thus, it is possible to form a structure having a sufficient cell capacitance while sufficient spaces are secured between the plurality of upper second storage nodes without having to increase the degree of difficulty of a manufacturing process.

While the embodiments of the inventive concept have been described, it will be understood that various changes in form and details may be made therein without departing from the spirit and scope of the following claims.

What is claimed is:

1. A semiconductor device comprising:
   a substrate;
   at least one first capacitor including a first storage node formed on the substrate and having a cylindrical shape;
   at least one second capacitor including a second storage node formed on the substrate, the second storage node having a lower second storage node having a hollow pillar shape including a hollow portion and an upper second storage node having a cylindrical shape and extending upward from the lower second storage node, and
   an insulating pillar filling a part of the hollow portion, wherein the upper second storage node has a concavely recessed bottom, wherein the lower second storage node is disposed on a first plane disposed apart from the substrate by a first distance, and wherein the upper second storage node is disposed on a second plane disposed apart from the substrate by a second distance that is greater than the first distance.

2. The semiconductor device of claim 1, wherein the first storage node has a first vertical length, and at least a part of the lower second storage node has a second vertical length that is less than the first vertical length.

3. The semiconductor device of claim 1, wherein the first storage node has a first vertical length, and the upper second storage node has a third vertical length that is less than the first vertical length.

4. The semiconductor device of claim 1, wherein the first storage node has a horizontal cross-sectional area with a first size, and the lower second storage node has a second horizontal cross-sectional area that is smaller than the first size.

5. The semiconductor device of claim 1, wherein the first storage node comprises a convex sidewall, and the lower second storage node comprises a concave sidewall.

6. The semiconductor device of claim 1, wherein the at least one first capacitor comprises a plurality of first capacitors that are arranged on a first plane in a line in at least one of a row direction or a column direction to form a matrix, and the at least one second capacitor comprises a plurality of second capacitors that are arranged on the first plane in a line in at least one of the row direction or the column direction to form a matrix.

7. The semiconductor device of claim 6, wherein at least one of the plurality of first capacitors and at least one of the plurality of second capacitors are alternatively arranged in a line in at least one of the row direction or the column direction.

8. The semiconductor device of claim 1, wherein at least one of the first storage node or the lower second storage node has a stepped upper surface.

9. The semiconductor device of claim 1, further comprising a supporter contacting and supporting a sidewall of at least one of the first storage node, the lower second storage node, or the upper second storage node.

10. A semiconductor device comprising:
a substrate including a cell array region; and
a plurality of capacitors including a plurality of first capacitors and a plurality of second capacitors such that at least one of the plurality of first capacitors and at least one of the plurality of second capacitors are alternately arranged in at least one of a row direction or a column direction to form a matrix in the cell array region of the substrate,
wherein the plurality of first capacitors comprise a plurality of first storage nodes arranged in a matrix on a first plane disposed apart from the substrate by a first distance, and the plurality of second capacitors comprise a plurality of lower second storage nodes, wherein at least one of the lower second storage nodes is disposed between two adjacent first storage nodes of the plurality of first storage nodes on the first plane and at least one of the lower second storage nodes has a hollow pillar shape including a hollow portion, and a plurality of upper second storage nodes respectively contacting the plurality of lower second storage nodes and arranged in a matrix on a second plane disposed apart from the substrate by a second distance that is greater than the first distance.

11. The semiconductor device of claim 10, wherein at least one of the plurality of first storage nodes comprises convex sidewalls, and at least one of the plurality of lower second storage nodes comprises concave sidewalls.

12. The semiconductor device of claim 10, wherein some of the plurality of first capacitors are located closest to edge portions of the cell array region, and the plurality of second capacitors are located adjacent to an inside portion of the cell array region, wherein the inside portion is spaced apart from the edge portions.

13. The semiconductor device of claim 10, further comprising a dummy conductive pattern wrapping the plurality of first storage nodes and the plurality of lower second storage nodes in the cell array region.

14. The semiconductor device of claim 13, wherein the dummy conductive pattern has a continuous band shape.

15. A semiconductor device comprising:
a substrate;
a first capacitor including a storage node formed on the substance; and
a second capacitor formed on the substrate adjacent to the first capacitor, wherein the second capacitor includes a lower storage node and an upper storage node on the lower storage node,
wherein the lower storage node of the second capacitor is disposed at substantially the same level as the storage node of the first capacitor, wherein the lowest storage node of the second capacitor is smaller in cross-sectional area than the storage node of the first capacitor, wherein the upper storage node directly contacts the lower storage node, and wherein the upper storage node has a concavely recessed bottom,
wherein the lower storage node is disposed on a first plane disposed apart from the substrate by a first distance, and
wherein the upper storage node is disposed on a second plane disposed apart from the substrate by a second distance that is greater than the first distance.

16. The semiconductor device of claim 15, wherein the storage node of the first capacitor is shaped as a cylinder.

17. The semiconductor device of claim 15, wherein the lower storage node of the second capacitor is shaped as a hollow pillar.

18. The semiconductor device of claim 15, wherein a cross-sectional area of the storage node of the first capacitor or the upper storage node of the second capacitor increases upward.

19. The semiconductor device of claim 17, wherein the hollow pillar has a hollow portion.

* * * * *